(12) United States Patent
Anz et al.

(10) Patent No.: US 11,810,757 B1
(45) Date of Patent: Nov. 7, 2023

(54) ATOMIC LAYER ETCHING BY ELECTRON WAVEFRONT

(71) Applicant: VELVETCH LLC, Pasadena, CA (US)

(72) Inventors: Samir John Anz, La Crescenta, CA (US); David Irwin Margolese, Pomona, CA (US); William Andrew Goddard, Pasadena, CA (US); Stewart Francis Sando, St. Petersburg, FL (US)

(73) Assignee: VELVETCH LLC, Pasadena, CA (US)

( * ) Notice: Subject to any disclaimer, the term of this patent is extended or adjusted under 35 U.S.C. 154(b) by 0 days.

(21) Appl. No.: 18/149,893

(22) Filed: Jan. 4, 2023

(51) Int. Cl.
*H01J 37/32* (2006.01)
*H01L 21/3065* (2006.01)

(52) U.S. Cl.
CPC .. *H01J 37/32045* (2013.01); *H01J 37/32027* (2013.01); *H01L 21/3065* (2013.01); *H01J 2237/3341* (2013.01)

(58) Field of Classification Search
None
See application file for complete search history.

(56) References Cited

U.S. PATENT DOCUMENTS

| | | |
|---|---|---|
| 4,464,223 A | 8/1984 | Gorin |
| 4,756,794 A | 7/1988 | Yoder |
| 5,039,376 A | 8/1991 | Zukotynski et al. |
| 5,221,416 A | 6/1993 | Kishi et al. |
| 5,882,538 A | 3/1999 | Martin et al. |
| 5,917,285 A | 6/1999 | Gillis et al. |
| 6,027,663 A | 2/2000 | Martin et al. |
| 6,033,587 A * | 3/2000 | Martin ............... H01J 37/3233 156/345.43 |
| 6,048,435 A | 4/2000 | DeOrnellas et al. |
| 6,258,287 B1 | 7/2001 | Martin et al. |

(Continued)

FOREIGN PATENT DOCUMENTS

| | | |
|---|---|---|
| JP | 4838736 B2 | 12/2011 |
| TW | 486720 B | 5/2002 |

(Continued)

OTHER PUBLICATIONS

Anz S. et al., "Etching with Electrons" Compound Semiconductor, vol. 26 Issue 5, Jul. 2020, pp. 1-6.

(Continued)

*Primary Examiner* — Stephanie P Duclair
(74) *Attorney, Agent, or Firm* — Steinfl + Bruno LLP

(57) ABSTRACT

Atomic layer etching of a substrate using a wafer scale wave of precisely controlled electrons is presented. A volume of gaseous plasma including diluent and reactive species and electrons of a uniform steady state composition is generated in a positive column of a DC plasma proximate the substrate. A corrosion layer is formed on the substrate by adsorption of the reactive species to atoms at the surface of the substrate. The substrate is positively biased to draw electrons from the volume to the surface of the substrate and impart an energy to the electrons so to stimulate electron transitions in the corrosion layer species, resulting in ejection of the corrosion layer species via electron stimulation desorption (ESD). The substrate is negatively biased to repel the electrons from the surface of the substrate back to the volume, followed by a zero bias to restore the steady state composition of the volume.

29 Claims, 39 Drawing Sheets

(56) References Cited

U.S. PATENT DOCUMENTS

| | | | |
|---|---|---|---|
| 6,335,536 | B1 | 1/2002 | Goeckner et al. |
| 6,646,386 | B1 | 11/2003 | Sirkis et al. |
| 6,720,268 | B1 | 4/2004 | Laermer et al. |
| 6,852,195 | B2 | 2/2005 | Martin et al. |
| 6,884,717 | B1 | 4/2005 | Desalvo et al. |
| 7,431,796 | B2 | 10/2008 | Martin et al. |
| 7,777,197 | B2 | 8/2010 | Al-Bayati et al. |
| 9,245,752 | B2 | 1/2016 | Yeom et al. |
| 9,620,382 | B2 | 4/2017 | Oehrlein et al. |
| 10,368,427 | B2 | 7/2019 | Morrisroe |
| 10,504,742 | B2 | 12/2019 | Zaitsu et al. |
| 11,239,094 | B2 | 2/2022 | Kanarik |
| 11,664,195 | B1 | 5/2023 | Goddard et al. |
| 11,676,797 | B2 | 6/2023 | Goddard et al. |
| 11,688,588 | B1 | 6/2023 | Sando et al. |
| 11,715,623 | B2 | 8/2023 | Goddard et al. |
| 2001/0019745 | A1 | 9/2001 | Beele et al. |
| 2002/0008017 | A1 | 1/2002 | Fu |
| 2003/0178300 | A1 | 9/2003 | Signer et al. |
| 2004/0163763 | A1 | 8/2004 | Martin et al. |
| 2009/0057135 | A1 | 3/2009 | Fujii et al. |
| 2009/0302024 | A1 | 12/2009 | Aiba |
| 2010/0025369 | A1 | 2/2010 | Negishi et al. |
| 2011/0139748 | A1* | 6/2011 | Donnelly .......... H01J 37/32045 216/37 |
| 2013/0255717 | A1 | 10/2013 | Rose et al. |
| 2013/0276978 | A1 | 10/2013 | Bluck et al. |
| 2014/0076716 | A1 | 3/2014 | Gorokhovsky et al. |
| 2016/0293432 | A1 | 10/2016 | Ranjan et al. |
| 2017/0062190 | A1 | 3/2017 | Lee et al. |
| 2018/0190526 | A1 | 7/2018 | Hao et al. |
| 2018/0226225 | A1 | 8/2018 | Koh et al. |
| 2019/0267211 | A1 | 8/2019 | Pan et al. |
| 2021/0302846 | A1 | 9/2021 | Tsuda et al. |
| 2021/0313949 | A1 | 10/2021 | Jin et al. |
| 2023/0140979 | A1 | 5/2023 | Goddard et al. |
| 2023/0143453 | A1 | 5/2023 | Goddard et al. |
| 2023/0144264 | A1 | 5/2023 | Goddard et al. |
| 2023/0260765 | A1 | 8/2023 | Sando et al. |

FOREIGN PATENT DOCUMENTS

| | | |
|---|---|---|
| TW | 201400206 A | 1/2014 |
| WO | 00/33362 A1 | 6/2000 |
| WO | 2010/008598 A1 | 1/2010 |
| WO | 2023/086731 A1 | 5/2023 |
| WO | 2023/154613 A1 | 8/2023 |

OTHER PUBLICATIONS

Anz, Samir J. et al., "Damage-Free Atomic-Scale Etching and Surface Enhancements by Electron-Enhanced Reactions: Results and Simulations", Chapter 26 of "Computational Materials, Chemistry, and Biochemistry: From Bold Initiatives to the Late Mile," Shankar, S. et al., Editors, *Springer Series in Materials Science*, vol. 284, Jan. 2021, 30 pages.

Barden M. "Plasma Process for Surface Treatment of Implants" *Medical Design Briefs*, Jun. 2020, pp. 1, 12-14.

Elliot J. "Treating Titanium and Polymer with Plasma Processing" *U.S. Tech*, vol. 35 No. 12, Dec. 2020, 2 pages.

Gillis H.P. et al., "Damage-free Pattern Transfer by Low Energy Electron Enhanced Etching (LE4): Mechanisms and Applications" *ECS Transactions*, 2008, vol. 13 No. 8, pp. 35-46.

Gillis H.P. et al., "Highly Anisotropic, Ultra-Smooth Patterning of GaN/SiC by Low Energy Electron Enhanced Etching in DC Plasma" Journal of Electronic Materials, vol. 26 No. 3, 1997, pp. 301-305.

Gillis H.P. et al., "Low energy electron-enhanced etching of GaAs (100) in a chlorine/hydrogen dc plasma" *Appl. Phys. Lett.*, 68(16), Apr. 1996, pp. 2255-2257.

Gillis H.P. et al., "Low energy electron-enhanced etching of Si(100) in hydrogen/helium direct-current plasma" *Appl. Phys. Lett.*, 66(19), May 1995, pp. 2475-2477.

Gillis H.P. et al., "Low-energy electron beam enhanced etching of Si(100)-(2x1) by molecular hydrogen" *J. Vac. Sci. Technol. B*, Aug. 1992, vol. 10 No. 6, pp. 2729-2733.

Gillis H.P. et al., "Precision, Damage-Free Etching by Electron-Enhanced Reactions: Results and Simulations" ECS Transactions, 50(46), Dec. 2013, pp. 33-43.

Huard C. M. et al., "Atomic layer etching of 3D structures in silicon: Self-limiting and nonideal reactions" *J. Vac. Sci. Technol.*, vol. 35 No. 3, Jun. 2017 15 pages.

Kim J. et al., "Low-Energy Electron-Enhanced Etching of HgCdTe" *Journal of Electronic Materials*, vol. 32 No. 7, Jan. 2003, pp. 677-685.

Lee S.H. et al., "Morphological evolution of III-V semiconductors and SiO2 during low energy electron enhanced dry etching" *Journal of Vacuum Science & Technology A*, Jul. 2004, vol. 22 No. 4, pp. 1600-1605.

Morling R. "New plasma process delivers superior surface treatment of titanium and polymer implants" Design Solutions, Mar. 2020, 2 pages.

Nojiri K. "Atomic layer etching of GaN and AlGaN using plasma-enhanced approach" *ResearchGate*, Mar. 2018, 3 pages.

Non-Final Office Action for U.S. Appl. No. 17/668,301, filed Feb. 9, 2022 on behalf of Velvetch LLC, dated Nov. 3, 2022, (20 pages).

Non-Final Office Action for U.S. Appl. No. 17/942,808, filed Sep. 12, 2022 on behalf of Velvetch LLC; dated Dec. 14, 2022;16 pages.

Non-Final Office Action for U.S. Appl. No. 17/946,434, filed Sep. 16, 2022, on behalf of Velvetch LLC, dated Dec. 21, 2022, 16 pages.

Non-Final Office Action issued for U.S. Appl. No. 17/524,330, filed Nov. 11, 2021, on behalf of Velvetch LLC, dated Jul. 13, 2022. 11 Pages.

Notice of Allowance for U.S. Appl. No. 17/524,330, filed Nov. 11, 2021 on behalf of Velvetch LLC, dated Jan. 11, 2023, (12 pages).

Notice of Allowance for U.S. Appl. No. 17/524,330, filed Nov. 11, 2021 on behalf of Velvetch LLC, dated Oct. 31, 2022, (9 pages).

Notice of Allowance issued for U.S. Appl. No. 17/524,330, filed Nov. 11, 2021 on behalf of Velvetch LLC, dated Aug. 24, 2022. 8 Pages.

Restriction Requirement for U.S. Appl. No. 17/668,301, filed Feb. 9, 2022 on behalf of Velvetch LLC, dated Jul. 15, 2022 7 pages.

Restriction Requirement issued for U.S. Appl. No. 17/524,330, filed Nov. 11, 2021 on behalf of Velvetch LLC, dated May 18, 2022. 6 Pages.

Second Restriction Requirement for U.S. Appl. No. 17/668,301, Feb. 9, 2022, on behalf of Velvetch LLC, dated Aug. 26, 2022. 6 Pages.

Veprek S. et al., "Electron-Impact-Induced Anisotropic Etching of Silicon by Hydrogen" Plasma Chemistry and Plasma Processing, vol. 2 No. 3, Jun. 1982, pp. 233-246.

Wang X. et al., "Scaling of atomic layer etching of SiO2 in fluorocarbon plasmas: Transient etching and surface roughness" *J. Vac. Sci. Technol.*, vol. 39 No. 3, Jun. 2021, 18 pages.

Webb A.P. et al., "Reactivity of Solid Silicon with Hydrogen under conditions of a low pressure plasma" Chemical Physics Letters, vol. 62 No. 1, Mar. 1979, pp. 173-177.

Winningham T. A. et al., "Formation of ordered nanocluster arrays by self-assembly on nanopatterned Si(100) surfaces" *Surface Science*, vol. 406, 1998, pp. 221-228.

International Search Report and Written Opinion for International Application No. PCT/US2022/076800 filed Oct. 24, 2022 on behalf of Velvetch LLC, dated Jan. 30, 2023. (10 pages).

International Search and Written Opinion for International application No. PCT/US2023/060988 filed Jan. 20, 2023 on behalf of Velvetch LLC, dated Apr. 25, 2023. (9 pages).

Notice of Allowance U.S. Appl. No. 17/668,301, filed Feb. 9, 2022 on behalf of Velvetch LLC, dated Feb. 13, 2023. (15 pages).

Notice of Allowance U.S. Appl. No. 17/942,808, filed Sep. 12, 2022 on behalf of Velvetch LLC; dated Mar. 16, 2023; 9 pages.

Notice of Allowance for U.S. Appl. No. 17/946,434, filed Sep. 16, 2022, on behalf of Velvetch LLC, dated Mar. 16, 2023, 10 pages.

Corrected Notice of Allowability for U.S. Appl. No. 17/668,301, filed Feb. 9, 2022 on behalf of Velvetch LLC, dated May 17, 2023. (3 pages).

(56) References Cited

OTHER PUBLICATIONS

Non-Final Office Action for U.S. Appl. No. 18/301,126, filed Apr. 14, 2023 filed on behalf of Velvetch LLC, dated Aug. 17, 2023 (16 pages).

\* cited by examiner

ATOMIC LAYER ETCHING BY ELECTRON WAVEFRONT

CROSS REFERENCE TO RELATED APPLICATIONS

The present application is related to U.S. application Ser. No. 17/524,330, entitled "DC Plasma Control for Electron Enhanced Material Processing" filed on Nov. 11, 2021, the disclosure of which is incorporated herein by reference in its entirety. The present application is further related to U.S. application Ser. No. 17/668,301, entitled "Electron Bias Control Signals for Electron Enhanced Material Processing" filed on Feb. 9, 2022, the disclosure of which is incorporated herein by reference in its entirety.

TECHNICAL FIELD

The present disclosure generally relates to systems and methods for material processing, including atomic layer etching, in a DC plasma at room temperatures (or other temperatures when desired). The present disclosure generally relates to systems and methods for controlling free electrons in a DC plasma reaction chamber used for material processing, in particular, generation of waveforms for biasing signals to control the kinetic energy of free electrons such as to produce wafer scale waves of precisely controlled electrons in a DC plasma at room temperatures (or other temperatures when desired).

BACKGROUND

Fabrication of, for example, integrated circuits, may include processing of corresponding substrates within a (direct-current) DC plasma reaction chamber wherein electrons and/or ions are accelerated towards the surface of the substrate to initiate a reaction that physically transforms the surface of the substrate. In some cases, and mainly due to the relatively smaller mass of electrons compared to ions, substrate processing via electrons may be preferred so as to reduce any damage to the surface of the substrate beyond the targeted physical alterations expected by the processing step per se.

In some cases, plasma processing may include arrangement of the substrate in a region of the DC plasma reaction chamber such that an exact value of a surface floating potential of the substrate is not known. Accordingly, any externally applied bias signal to the substrate may impart an energy to free electrons in a region of the plasma close to the surface of the substrate that may not correlate to the electron energy thresholds/levels of (atoms) materials present at the surface of the substrate.

The above referenced U.S. application Ser. No. 17/524,330, the disclosure of which is incorporated herein by reference in its entirety, describes methods and systems for precise and selective control of the value of the surface floating potential of the substrate, and therefore enable precise and selective control of energy levels of atoms at the surface of the substrate. The above referenced U.S. application Ser. No. 17/668,301, the disclosure of which is incorporated herein by reference in its entirety, takes advantage of such precise and selective control of the energy levels of atoms at the surface of the substrate to produce corresponding timing and amplitude of waveforms for signals used for biasing of the free electrons in the DC plasma chamber so to generate wafer scale waves of electrons that specifically target the energy levels of the atoms at the surface of the substrate.

Teachings according to the present disclosure take advantage of such ability to generate wafer scale waves of electrons (e.g., electron wavefront) that specifically target the energy levels of the atoms at the surface of the substrate to etch away an atomic layer of the substrate.

SUMMARY

Systems and methods for material processing, in particular, atomic layer etching (ALE), using wafer scale waves of precisely controlled electrons in a DC plasma at room temperatures (or other temperatures if desired) are presented. In the present disclosure such material processing is referred to as electron enhanced material processing (EEMP) which allows precise control of the kinetic energy of free electrons in the DC plasma to exactly (and selectively) target energy levels of the electrons of atoms at the surface of a substrate being processed. Such atoms may include atoms of an adsorbed layer overlying a top surface atom layer of the substrate. Under local conditions created via methods and systems of the present teachings, low energy of the free electrons arriving at a surface of the substrate as an electron wavefront can promote the desorption of the adsorbed layer along with the surface atom layer of the substrate that is immediately below it.

According to a first embodiment of the present disclosure, a method for atomic layer etching of a substrate is presented, the method comprising: generating a volume of gaseous plasma including diluent species, reactive species, and electrons of a uniform steady state composition in a positive column of a DC plasma proximate a substrate, thereby developing a floating potential at a surface of the substrate; adjusting the floating potential to a reference potential; forming a corrosion layer on the substrate, the corrosion layer comprising corrosion layer species formed by adsorption of the reactive species to atoms of an atomic layer at the surface of the substrate; applying a positive biasing potential to the substrate that is positive with respect to the floating potential; based on the applying, drawing electrons from the volume of gaseous plasma to the surface of the substrate and imparting an energy level to drawn electrons for stimulating electron transitions in the corrosion layer species; and based on the stimulating, desorbing the corrosion layer species, thereby etching away the atomic layer.

According to a second embodiment of the present disclosure, a method for atomic layer etching of a substrate via an electron wavefront is presented, the method comprising: generating a volume of gaseous plasma including diluent species, reactive species, and electrons of a uniform steady state composition in a positive column of a DC plasma proximate a substrate, thereby developing a floating potential at a surface of the substrate; adjusting the floating potential to a reference potential; and applying to the substrate, via a periodic biasing signal referenced to the reference potential, a sequence of a positive biasing potential followed by a negative biasing potential and further followed by a zero biasing potential that is equal to the reference potential, thereby causing arrival of an electron wavefront with uniform energy and density across the surface of the substrate at arrival times predetermined by the periodic biasing signal; wherein at each of the arrival times, the electron wavefront stimulates electron transitions in a corrosion layer formed on the surface of the substrate, thereby etching away one atomic layer of the substrate.

Further aspects of the disclosure are shown in the specification, drawings and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Figure 1A:
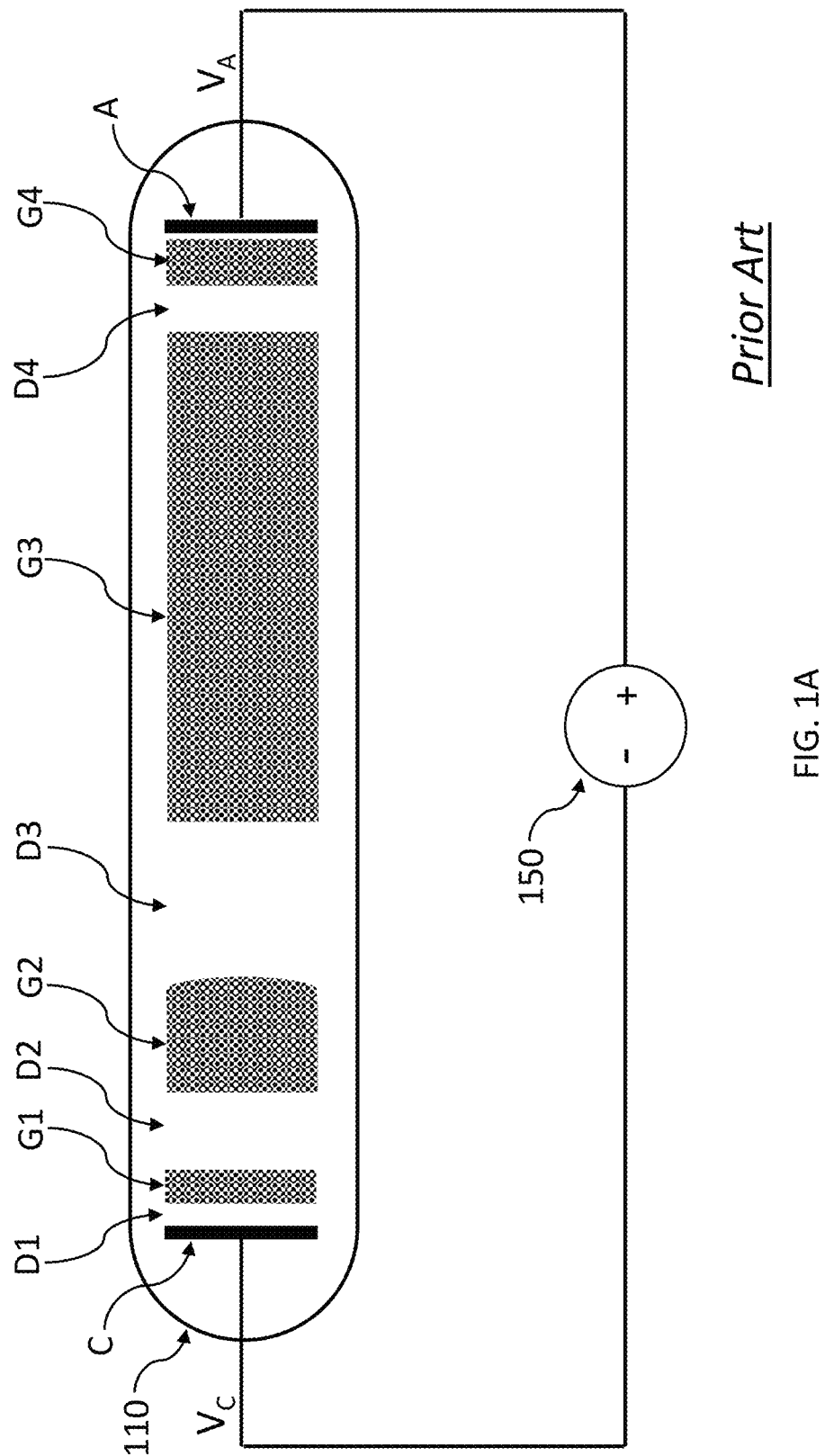
FIG. 1A shows a simplified schematic view of a DC plasma reaction chamber that can be used in a DC plasma processing system.

FIG. 1A shows a simplified schematic view of a prior art (direct-current) DC plasma reaction chamber (110) that can be used in a DC plasma processing system. Biasing of the DC plasma reaction chamber (110) may be provided by a DC voltage source (150) coupled between an anode, A, and a cathode, C, of the DC plasma reaction chamber (110). During operation, a glow discharge (plasma) may be formed in the chamber (110) based on interaction of a gas and electrons of a current that flows between the anode, A, and the cathode, C. This in turn produces free ions and electrons in the chamber (110). The principle of operation of such DC plasma reaction chamber (110) is well known to a person skilled in the art and therefore related details are omitted in the present disclosure.

As shown in FIG. 1A, the glow discharge formed in the chamber (110) may include glow regions (G1, G2, G3, G4) that emit significant light, and dark regions (D1, D2, D3, D4) that may not emit light. Such regions may represent different operating characteristics of the DC plasma reaction chamber (110), including, for example, temperature and electric potential.

Figure 1B:
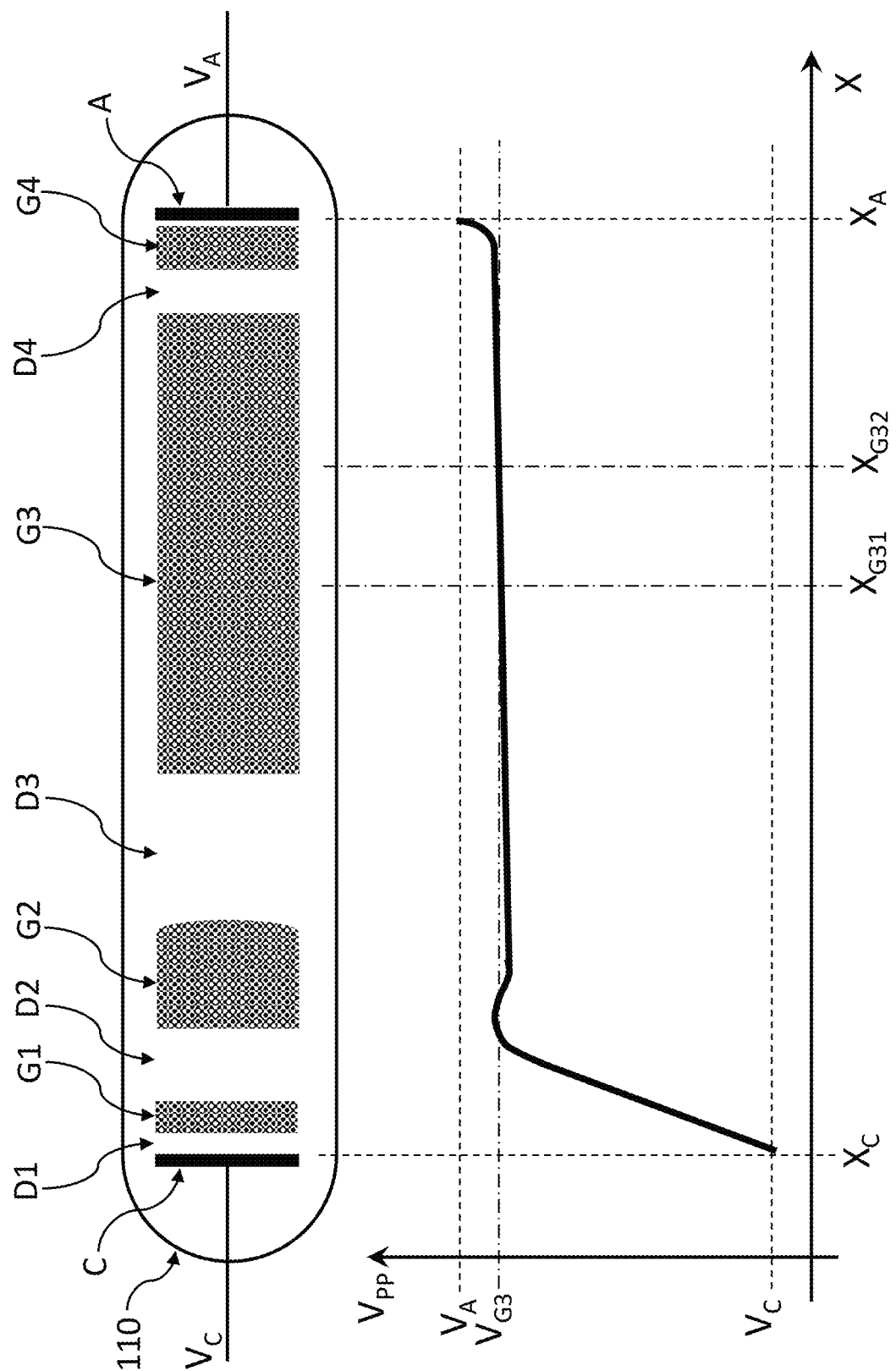
FIG. 1B shows a graph representative of a variation in (electric) potential of the plasma during operation of the DC plasma reaction chamber of FIG. 1A.

FIG. 1B shows a graph representative of a variation in the (electric) potential, $V_{PP}$, of the plasma along an axial direction (direction of longitudinal extension), X, of the chamber (110) during operation. As shown in FIG. 1B, the plasma potential, $V_{PP}$, varies from a value, $V_C$, that represents the potential applied to the cathode, C, by the DC voltage source (150 of FIG. 1A), to a value, $V_A$, that represents the potential applied to the anode, A, by the DC voltage source (150 of FIG. 1A). It should be noted that as shown for example in FIG. 1D later described, generally the value, $V_A$, is at zero volts (e.g., reference ground) and the value, $V_C$, is negative (e.g., in a range of about 0 (zero) to −500 volts).

With continued reference to FIG. 1B, abrupt variation of the potential, $V_{PP}$, in the regions (e.g., D1, G1, D2) close to the cathode, C, and in the regions (e.g., G4) close to the anode, A, may correspond to regions of higher operating temperatures of the chamber (110). On the other side, the region G3, also known as the positive column, is a region of quasi uniform/constant potential, $V_{PP}$, and of lower operating temperature. For example, considering a segment $[X_{G31}, X_{G32}]$ along the axial direction, X, of the chamber (110) that as shown in FIG. 1B is contained within the positive column region, G3, a variation of the plasma potential, $V_{PP}$, across such segment $[X_{G31}, X_{G32}]$ is minimal, or in other words, the potential, $V_{PP}$, across the segment $[X_{G31}, X_{G32}]$ may be considered as constant. Accordingly, as shown in FIG. 1B, the plasma potential, $V_{PP}$, across the segment $[X_{G31}, X_{G32}]$ may be considered as equal to a value $V_{G3}$. The lower operating temperature and the constant potential value of the plasma in the positive column region, G3, allow use of such region for processing of substrates as shown in FIG. 1C and FIG. 1D.

Figure 1C:
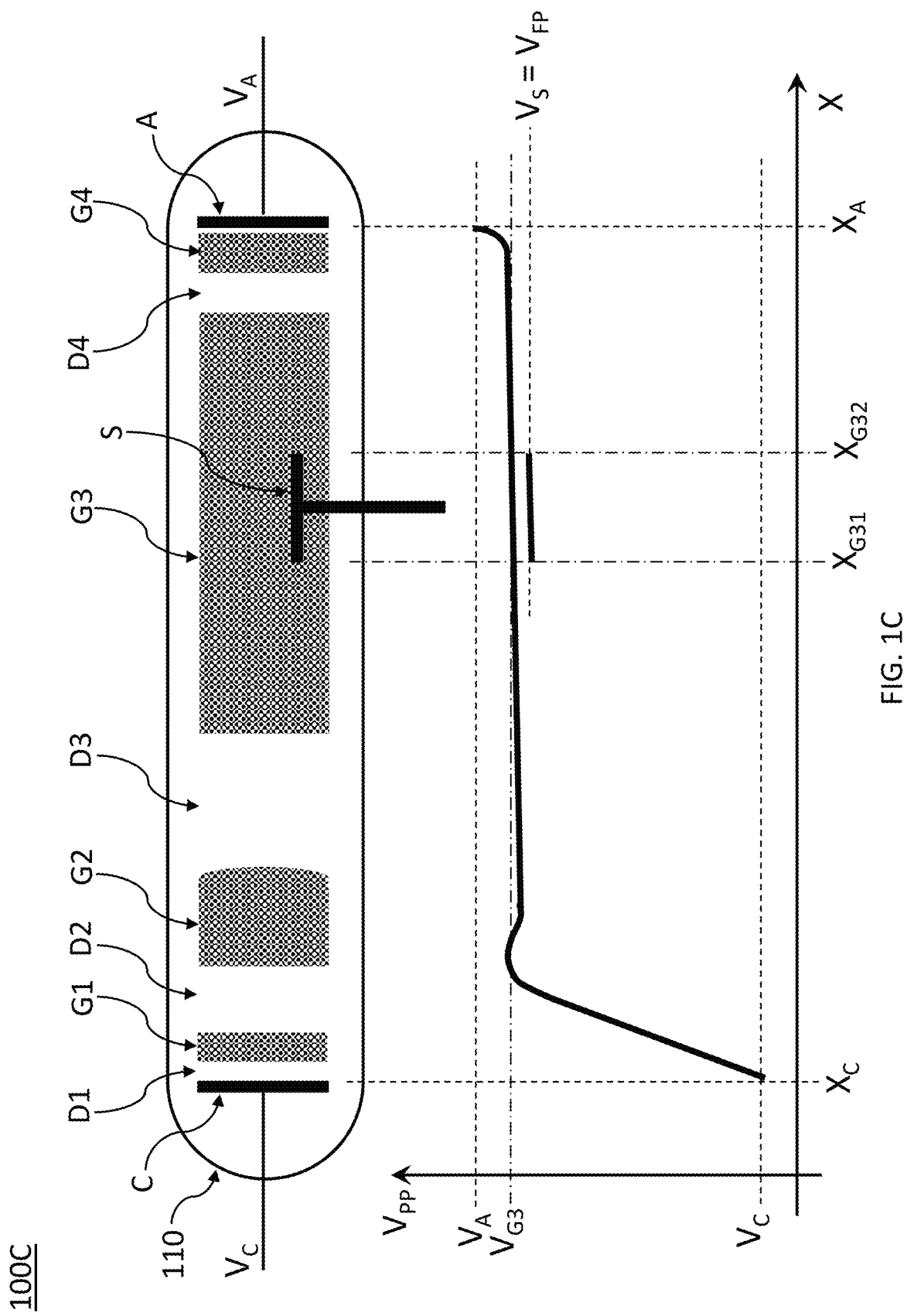
FIG. 1C shows a simplified schematic view of a DC plasma processing system comprising a (substrate) stage arranged in a region of the DC plasma reaction chamber of FIG. 1A.

FIG. 1C shows a simplified schematic view of a DC plasma processing system (100C) comprising a (substrate) stage, S, arranged in the positive column region, G3, of the DC plasma reaction chamber (110). The stage, S, may be designed to support a flat substrate, and therefore may include a top flat/planar surface. The stage, S, shown in FIG. 1C is electrically isolated (not connected to any external electric potential) and therefore, and as known to a person skilled in the art, in the presence of the plasma potential, $V_{PP}$, a potential, $V_S$, develops at the surface of the stage, S, that is referred to as the surface floating potential, $V_{FP}$. The relationship of the (surface) floating potential, $V_{FP}$, to the plasma potential, $V_{PP}$, is shown FIG. 1C. In particular, as shown in FIG. 1C, the plasma potential, $V_{PP}$, at a region $[X_{G31}, X_{G32}]$ of the chamber (110) where the stage, S, is arranged is equal to $V_{G3}$, and the floating potential, $V_{FP}$, is lower than (negative with respect to) the plasma potential $V_{G3}$.

The floating potential, $V_{FP}$, shown in the graph of FIG. 1C can be attributed to the "plasma sheath" that develops in the presence of the stage, S. As known to a person skilled in the art, at the wall or any barrier within the plasma, a negative potential develops with respect to the bulk of the plasma. Consequently, an equilibrium potential drop develops between the bulk of the plasma and the wall or barrier. Such potential drop is confined to a small region of space next to the wall or barrier due to the charge imbalance that develops between the plasma and the wall or barrier. This layer of charge imbalance has a finite thickness, characterized by the Debye Length, and is called the "plasma sheath" or "sheath". The thickness of such a layer is several Debye lengths thick, a value whose size depends on various characteristics of the plasma. If the dimensions of the bulk plasma (e.g., chamber 110) are much greater than the Debye length, for example, then the Debye length depends on the plasma temperature and electron density. In the particular case of the DC plasma operating conditions supported by the teachings according to the present disclosure (e.g., EEMP system near room temperature to moderately above room temperature), the Debye length is in the order of several millimeters (e.g., less than 10 millimeters), and the difference between the potentials $V_{G3}$ and $V_{FP}$ is in the order of several volts (e.g., less than 10 volts). It should be noted that the plasma sheath may develop in the presence of any wall or barrier, whether conductive or not. Accordingly, once a substrate (whether conductive or insulating) is placed atop the stage, S, the same floating potential, $V_{FP}$, as described above with reference to FIG. 1C may develop at the surface of the substrate.

Figure 1D:
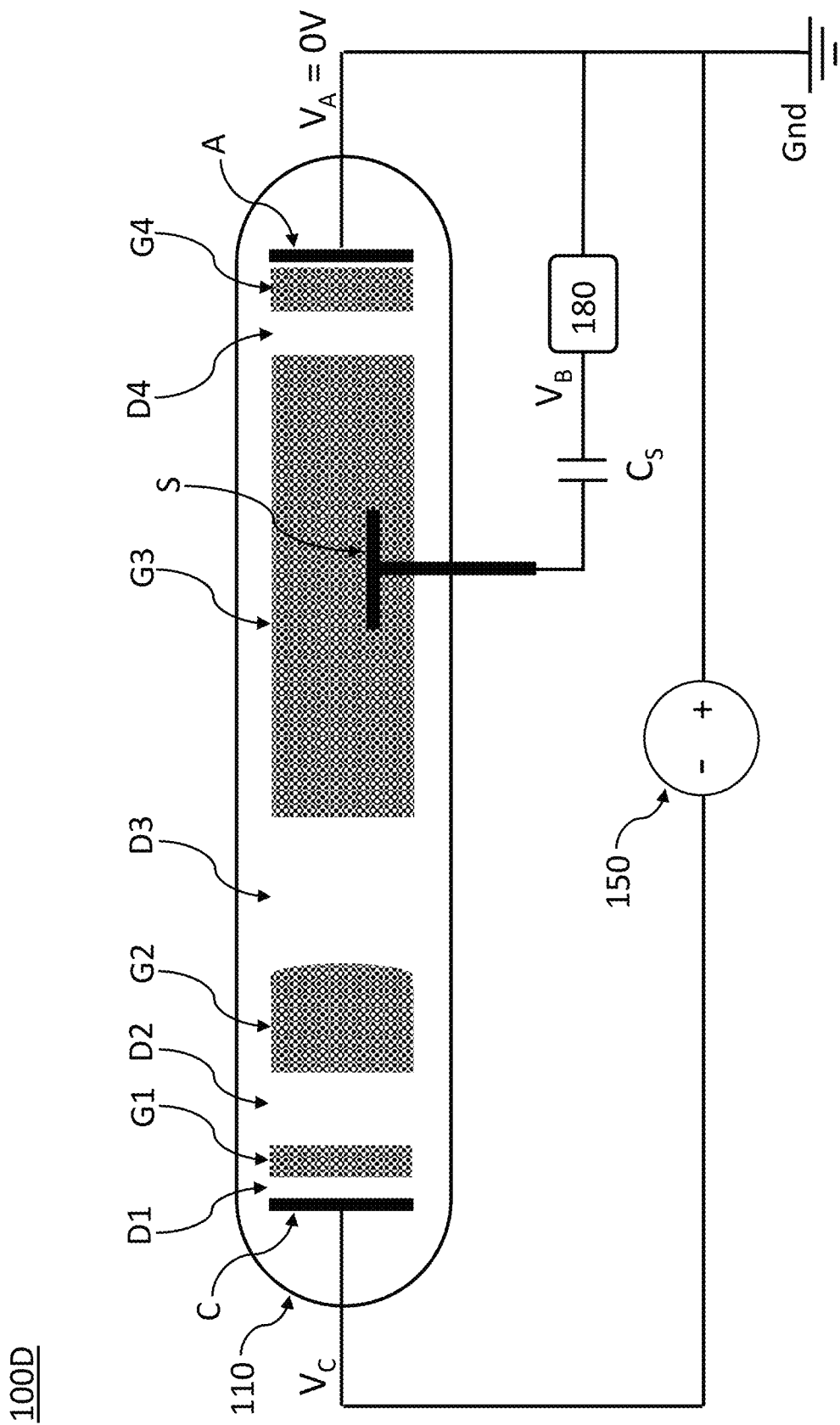
FIG. 1D shows an exemplary biasing of the stage of the DC plasma processing system of FIG. 1C via an external biasing signal generator.

FIG. 1D shows an exemplary biasing of the stage, S, of the DC plasma processing system of FIG. 1C via an external biasing signal generator (180) that is capacitively coupled to the stage, S, by a capacitor $C_S$. In the exemplary configuration (100D) shown in FIG. 1D, the potential, $V_A$, applied to the anode, A, is at zero volts (e.g., coupled to the reference ground, Gnd). Furthermore, as shown in FIG. 1D, a biasing signal, $V_B$, applied to the stage, S, by the external biasing signal generator (180) may be referenced to the reference ground potential, Gnd. Although in some prior art implementations the biasing signal, $V_B$, may be DC coupled to the stage, S, teachings according to the present disclosure strictly prohibit such DC coupling to the stage so as to avoid a discharge path for a DC current through any intermediate points in the chamber (110), as such discharge path may substantially change operating conditions within the chamber (110).

Figure 1E:
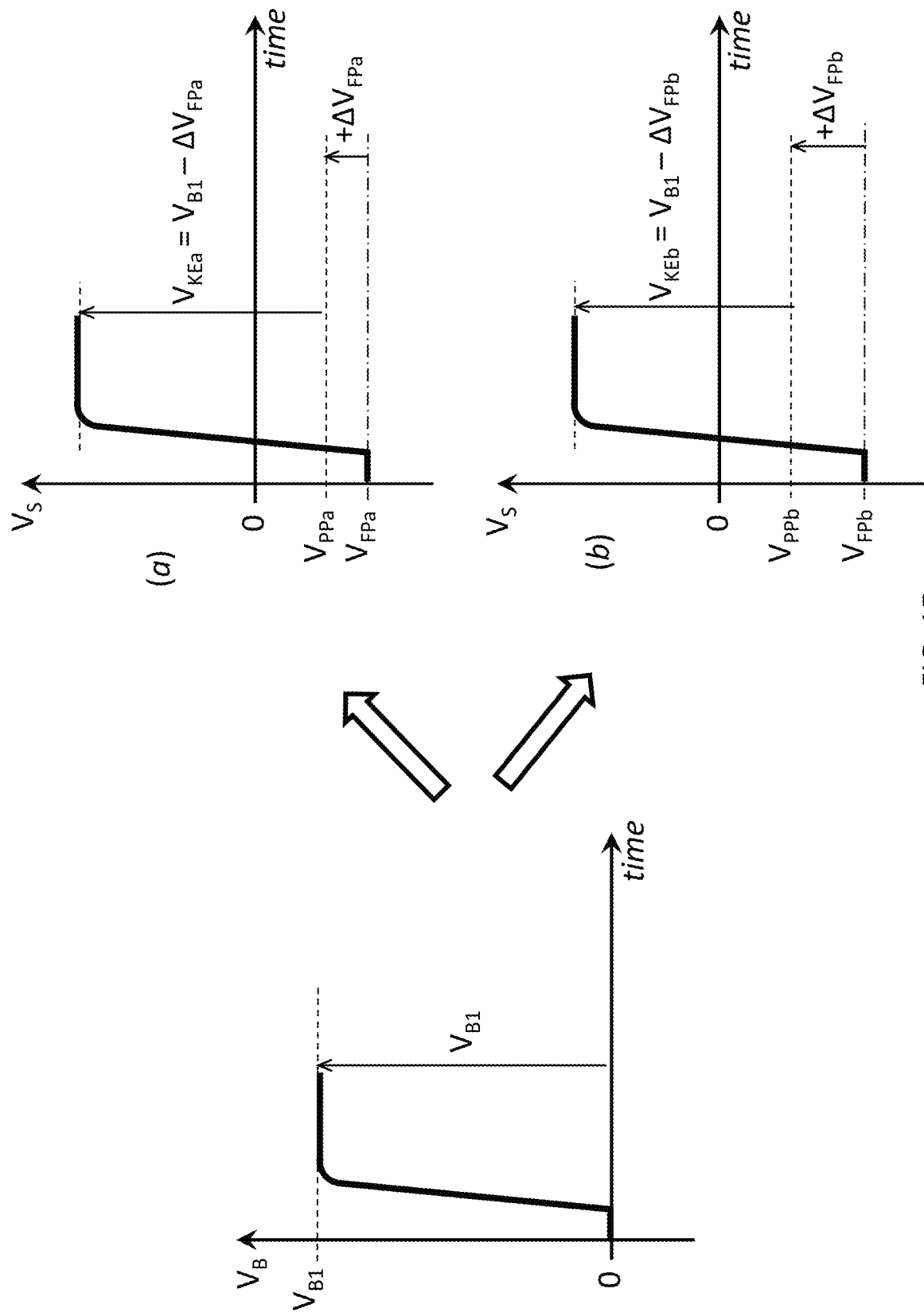
FIG. 1E shows an exemplary biasing signal generated by the external biasing signal generator of FIG. 1D and a corresponding potential generated at the surface of the stage.

In the DC plasma processing system shown in FIG. 1D, the biasing signal, $V_B$, may be used to control a potential (e.g., surface potential $V_S$) seen by free electrons and/or ions in the vicinity of the stage, S, or of the substrate when present. Accordingly, energy of the free electrons and/or ions may be controlled to the material specific levels required for (optimum) processing of the substrate. For example, as shown in the left-side graph of FIG. 1E, the biasing signal, $V_B$, generated by the external biasing signal generator (e.g., 180 of FIG. 1D) may start from zero and reach in a short period of time (represented by a leading edge slope) a voltage amplitude, $V_{B1}$. When the voltage amplitude, $V_{B1}$, is applied (e.g., AC coupled) to the stage, S, during a processing step (a) as shown in the top right-side graph of FIG. 1E, the voltage amplitude, $V_{B1}$, gets added (or subtracted if negative) to the surface floating potential, $V_{FPa}$, to generate a surface potential, $V_S$, at the vicinity of the stage, S. However, because the free electrons and/or ions are at the plasma potential, $V_{PPa}$, only a portion of the surface potential, $V_S$, that is above the plasma potential, $V_{PPa}$, is seen by the free electrons and/or ions. For example, as shown in the top right-side graph of FIG. 1E, the (kinetic) energy of the free electrons and/or ions may be based on a potential difference $V_{KEa}=(V_{B1}-\Delta V_{FPa})$, with $\Delta V_{FPa}=(V_{PPa}-V_{FPa})$ On the other hand, considering a processing step (b) represented by the bottom right-side graph of FIG. 1E, which may have operating conditions that are different from the operating conditions of the processing step (a), including for example, a different plasma potential, $V_{PPb}$, or a different floating potential, $V_{FPb}$, that may cause a different differential $\Delta V_{FPb} = (V_{PPb} - V_{FPb})$, then for the same applied voltage amplitude, $V_{B1}$, a different (kinetic) energy of the free electrons and/or ions is obtained. Teachings according to the present disclosure either eliminate variations in the operating conditions within the chamber (e.g., 110 of FIG. 1D), and/or compensate for such variations such as to allow, for example, precise control of the energy of the free electrons (and/or ions). It should be noted that variation in the operating conditions may be expected in view of different types of processing (e.g., (a) and (b) of FIG. 1E) performed within the chamber (110), including for example, etching of a substrate with different reactive gasses, cleaning of a substrate or any other process that may alter and/or remove composition/material from the surface of the substrate. It should be noted that, as known by a person skilled in the art, the different operating conditions for performing the different types of processing may further include corresponding variations and/or adjustments to any one of the DC plasma current, temperature, gas mixture or flow rate within the chamber (110).

When a substrate is placed atop the surface of the stage, S, the kinetic energy of the free electrons and/or ions acquired through the application of the bias signal, $V_B$, described above may accelerate the free electrons and/or ions towards the surface of the substrate and collide with the substrate to release the kinetic energy onto atoms at the surface of the substrate. Those atoms however are at an energy level that is based on the potential within which they reside, or in other words, based on the floating potential, $V_{FP}$. Various energy levels of one such atom for the processing type (a) described above with reference to FIG. 1E are shown in FIG. 1F, including the energy level, $E_n$, of a nucleus of an atom at the surface of the substrate, the energy level, $E_B$, of an electron bound to the nucleus of an atom at the surface of the substrate, and the energy level, $E_e$, of an electron at the orbit of an electron bound to a nucleus at the surface of the substrate.

Figure 1F:
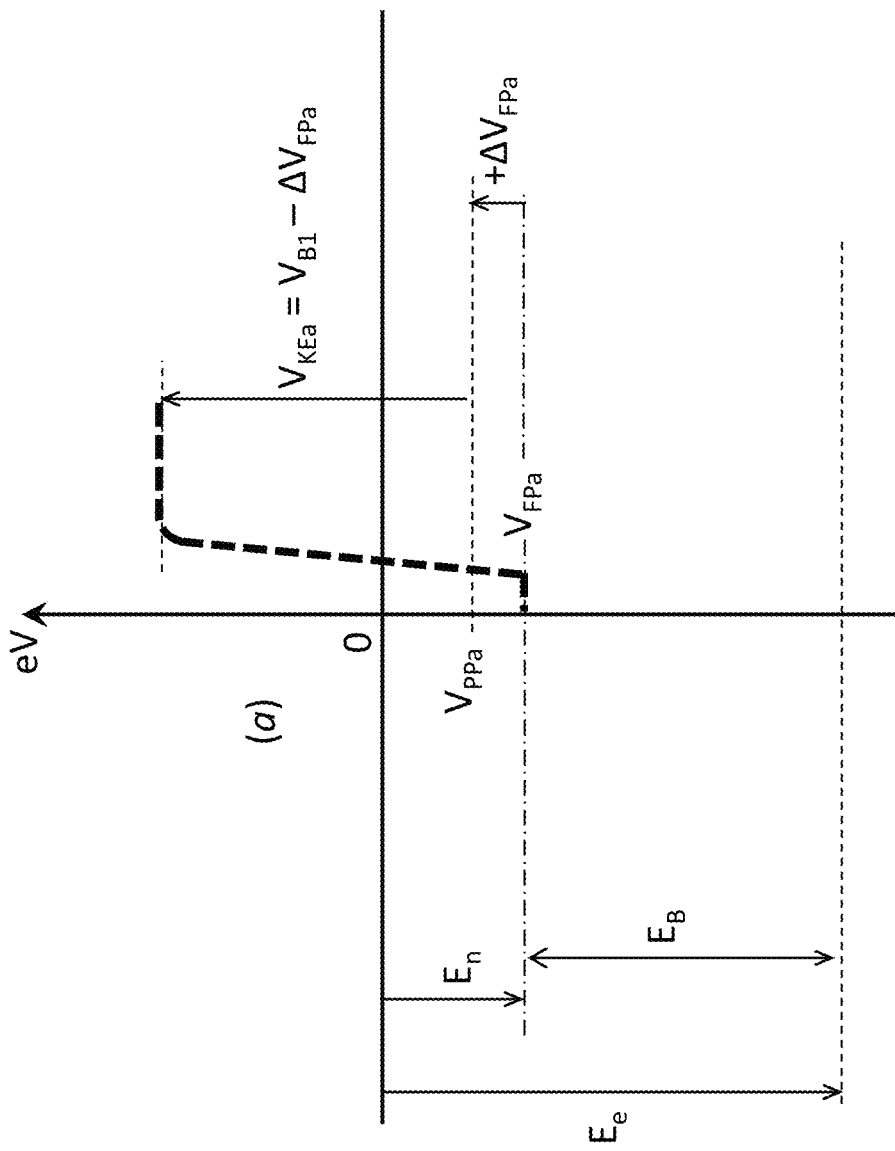
FIG. 1F shows exemplary energy levels of atoms at a surface of the stage.

As can be seen in FIG. 1F, the energy level, $E_n$, of the nucleus is at the (negative) potential, $V_{FPa}$, and the energy level, $E_e$, of the electron is at the (negative) potential $(E_n + E_B)$. In other words, in order to excite the atom to a level that breaks the bond between the electron and the nucleus, an energy equal to, or greater than, the energy level, $E_e$, of the electron must be imparted onto the atom. Accordingly, considering a plasma processing only via the free electrons, the kinetic energy of the free electrons provided through application of the bias signal, $V_B$, represented in FIG. 1F by the potential difference $V_{KEa} = (V_{B1} - \Delta V_{FPa})$ must be equal to, or greater than, the energy level, $E_e$. However, since $E_e = (E_n + E_B)$ and $E_n$ is based on the a priori unknown floating potential, $V_{FPa}$, precise control of the kinetic energy of the free electrons to precisely target the energy level, $E_e$, may not be possible.

Although the floating potential (e.g., $V_{FPa}$ of FIG. 1F) may be empirically and/or experimentally determined for a given process at stable operating conditions of the DC plasma chamber, any inconsistencies and/or lack of repeatability of such operating conditions may invalidate the determined floating potential. Furthermore, as different types of processes inherently yield to different floating potentials, the task of precisely controlling the kinetic energy of the free electrons to exactly target the energy level of an atom at the surface of the substrate may not be feasible. As a result, some prior art implementations impart kinetic energies onto the atoms at the surface of the substrate that may be substantially larger than a target atom energy level, and therefore may not allow for selectivity (as atoms of different materials/compositions having different energy levels may equally be subjected to energy levels sufficient to break their orbital bonds). Electron enhanced material processing (EEMP) according to the teachings of the present disclosure overcome such shortcoming and therefore allow precise control of the kinetic energy of the free electrons to exactly and selectively target the energy level of an atom at the surface of the substrate.

Figure 2A:
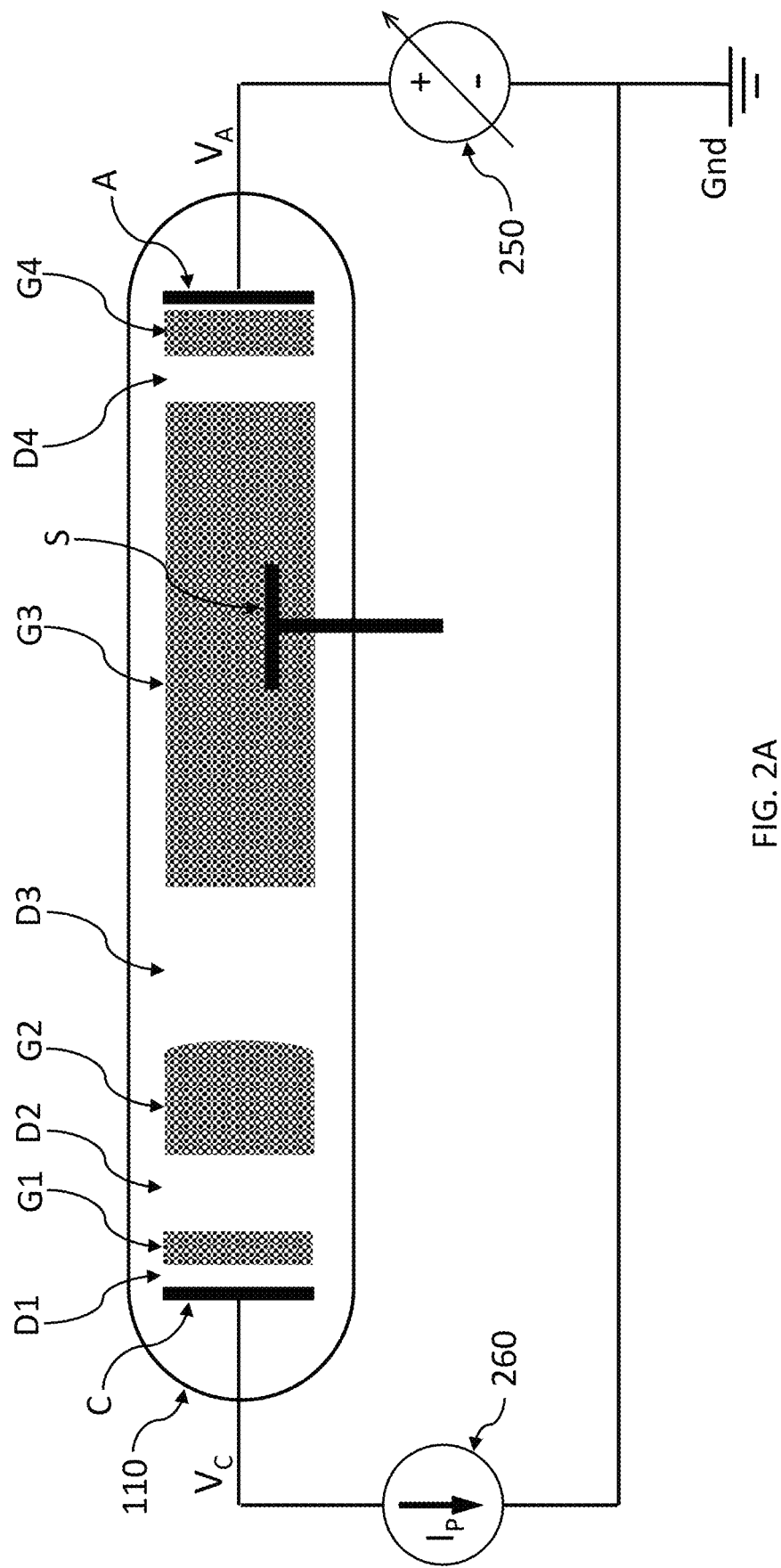
FIG. 2A shows a simplified schematic view of a DC plasma processing system according to an embodiment of the present disclosure comprising means to control a surface potential of the stage.

FIG. 2A shows a simplified schematic view of a DC plasma processing system (200A) according to an embodiment of the present disclosure comprising means (250, 260) to control the surface potential of the stage, S, when electrically isolated. In other words, these means (250, 260) allow for adjustment of the floating potential, $V_{FP}$. As shown in FIG. 2A, the means (250, 260) include an adjustable DC voltage source (250) that is coupled to the anode, A, of the DC plasma reaction chamber (110), and a DC current source (260) that is coupled to the cathode, C, of the DC plasma reaction chamber (110). Accordingly, the potential, $V_A$, of the anode, A, may be controlled to be in a range from zero volts and upward (positive) with respect to the reference ground (Gnd at zero volts), and a (drain) current, Ip, that flows between the anode, A, and the cathode, C, through the reaction chamber (110) can be set by the DC current source (260). Accordingly, the potential, $V_C$, of the cathode, C, is not forced by an external DC voltage source (e.g., 150 of FIG. 1D), rather (it is floating and) settles to a (negative) voltage that is based on the adjustable potential $V_A$ of the anode A, and the set current, Ip. Such a configuration allows independently control/adjust of the floating potential, $V_{FP}$, while maintaining the set current, Ip, through the reaction chamber (110) constant to establish and maintain a higher level of process stability and optimization.

Figure 2B:
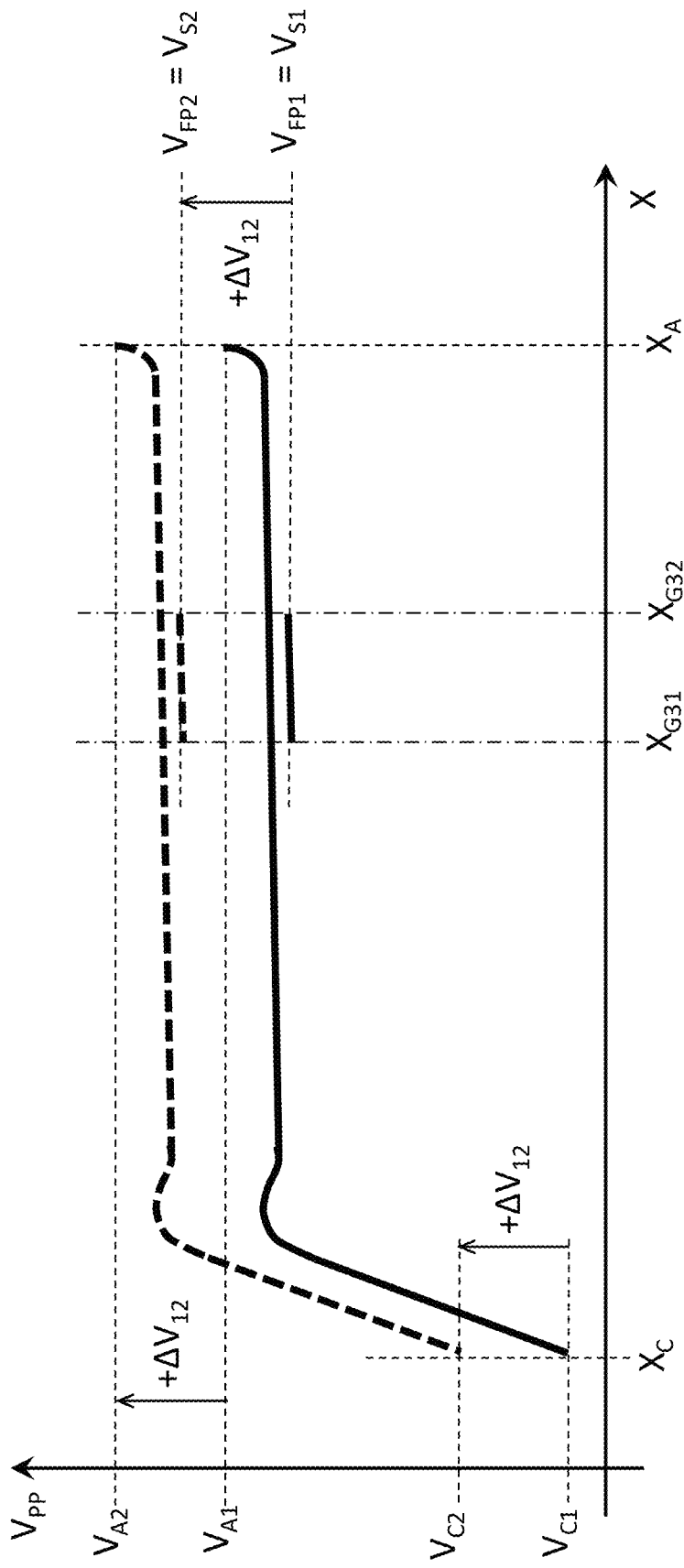
FIG. 2B shows graphs representative of control of the surface potential of the stage for the DC plasma processing system of FIG. 2A.

FIG. 2B shows two graphs representative of control of the surface potential, $V_{FP}$, of the stage, S, for the DC plasma processing system (200A) described above with reference to FIG. 2A. In particular, FIG. 2B shows two graphs distinguished by use of solid or dashed lines, each representing the variation of the plasma potential, $V_{PP}$, across the longitudinal extension, X, of the chamber (110) for two different voltages ($V_{A1}$, $V_{A2}$) applied to the anode, A, by the adjustable DC voltage source (250). As can be seen in FIG. 2B, for a positive step increase, $+\Delta V_{12}$, of the anode potential from the voltage $V_{A1}$ to the voltage $V_{A2}$, the floating potential ($V_{FP1}$, $V_{FP2}$) and the cathode potential ($V_{C1}$, $V_{C2}$) increase by the same positive step, $+\Delta V_{12}$. As a matter of fact, as shown in FIG. 2B, the entirety of plasma potential, $V_{PP}$, curve shifts positive by the step $+\Delta V_{12}$. In other words, for any longitudinal coordinate, X, in the range [$X_C$, $X_A$], a corresponding plasma potential, $V_{PP}(X)$, follows the step increase, $+\Delta V_{12}$. The same behavior applies to negative step variations applied to the anode, A, by the adjustable DC voltage source (250). In other words, control of the anode, A, potential by the adjustable DC voltage source linearly affects the plasma potential, $V_{PP}$, at any longitudinal coordinate, X, and therefore, linearly affects the floating potential, $V_{FP}$, and the voltage, $V_S$, atop the stage, S, As later described in the present disclosure, such linearity can be used in the EEMP system according to the present teachings to implement a closed loop control subsystem to automatically control the value of the floating potential, $V_{FP}$, to a preset value (e.g., zero volts) while operating the DC plasma chamber for different types of material processing.

Figure 2C:
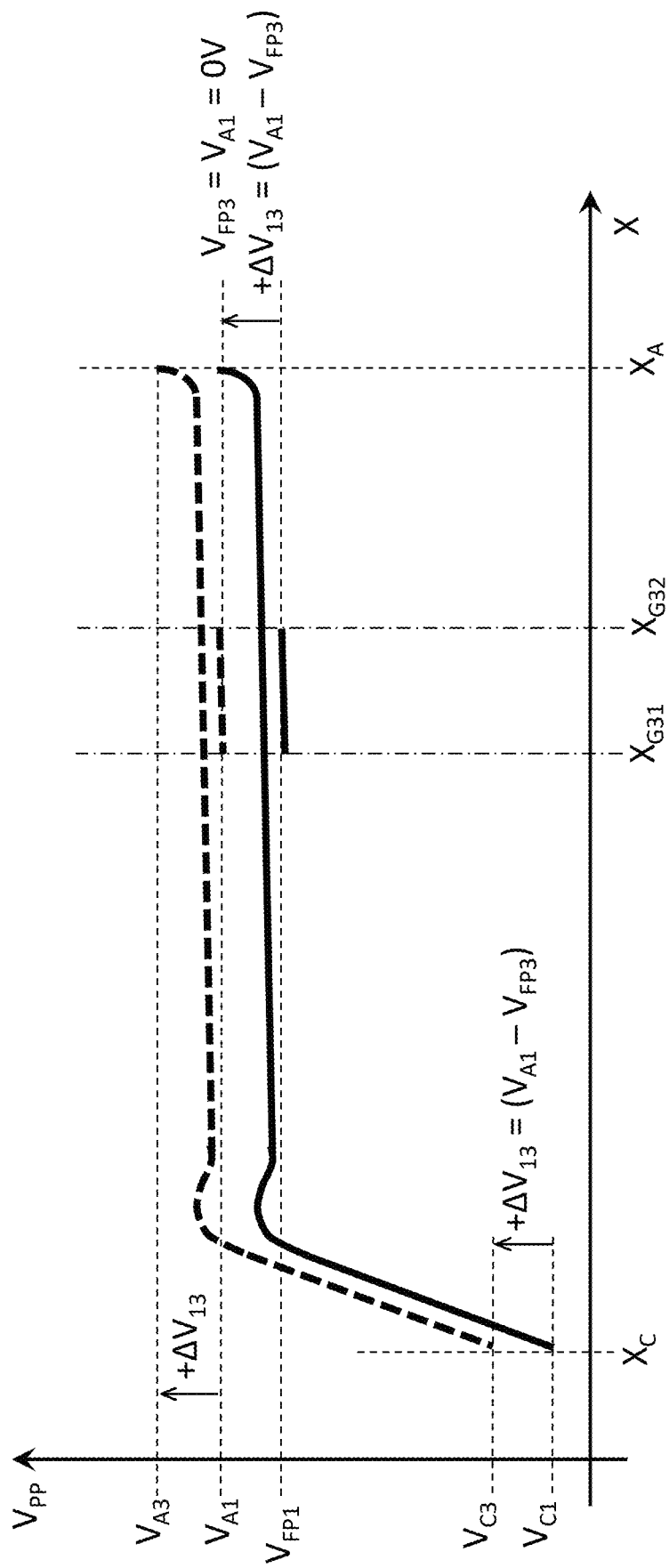
FIG. 2C shows graphs representative of adjusting the surface potential of the stage to a reference ground potential for the DC plasma processing system of FIG. 2A

FIG. 2C shows two graphs similar to the graphs described above with reference to FIG. 2B, including a specific case where the anode voltage, $V_{A1}$, is equal to zero volts (solid lines). As can be seen in FIG. 2B, the floating potential volage for such case is equal to a negative value, $V_{FP1}$, and therefore negative with respect to (below) the plasma potential, $V_{PP}$. Furthermore, as can be seen in FIG. 2C, for a positive step increase, $+\Delta V_{13}=(V_{A1}-V_{FP1})$, of the anode potential, the floating potential can be adjusted to a value, $V_{FP3}$, that is equal to zero volts. According to an embodiment of the present disclosure, such zeroing of the floating potential, $V_{FP}$, may allow precise control of the kinetic energy of free electrons in the DC plasma to exactly (and selectively) target energy levels of atoms at the surface of a substrate (whether conductive or insulating) being processed. In other words, and with reference back to FIG. 1F, the a priori unknown floating potential that determines the energy level, $E_n$, of a nucleus of an atom targeted/selected for processing is removed by zeroing of the floating potential, $V_{FP}$. In turn, as shown in FIG. 4B later described, this allows to reference the energy level, $E_e$, of target electrons, the kinetic energy level of the free electrons in the DC plasma (e.g., $V_{KEa}$ of FIG. 1F), and the biasing voltage, $V_B$, applied to the stage, S, to the same known and fixed reference of zero volts potential, Gnd. It should be noted that although provision of a known level of the floating potential, $V_{FP}$, may be provided by zeroing such potential as described above, such zeroing should not be considered as limiting the scope of the present disclosure as other preset/adjusted non-zero values of the floating potential may equally serve as a reference potential for precise control of the kinetic energy of free electrons in the DC plasma to exactly (and selectively) target energy levels of atoms at the surface of a substrate (whether conductive or insulating) being processed.

Figure 3A:
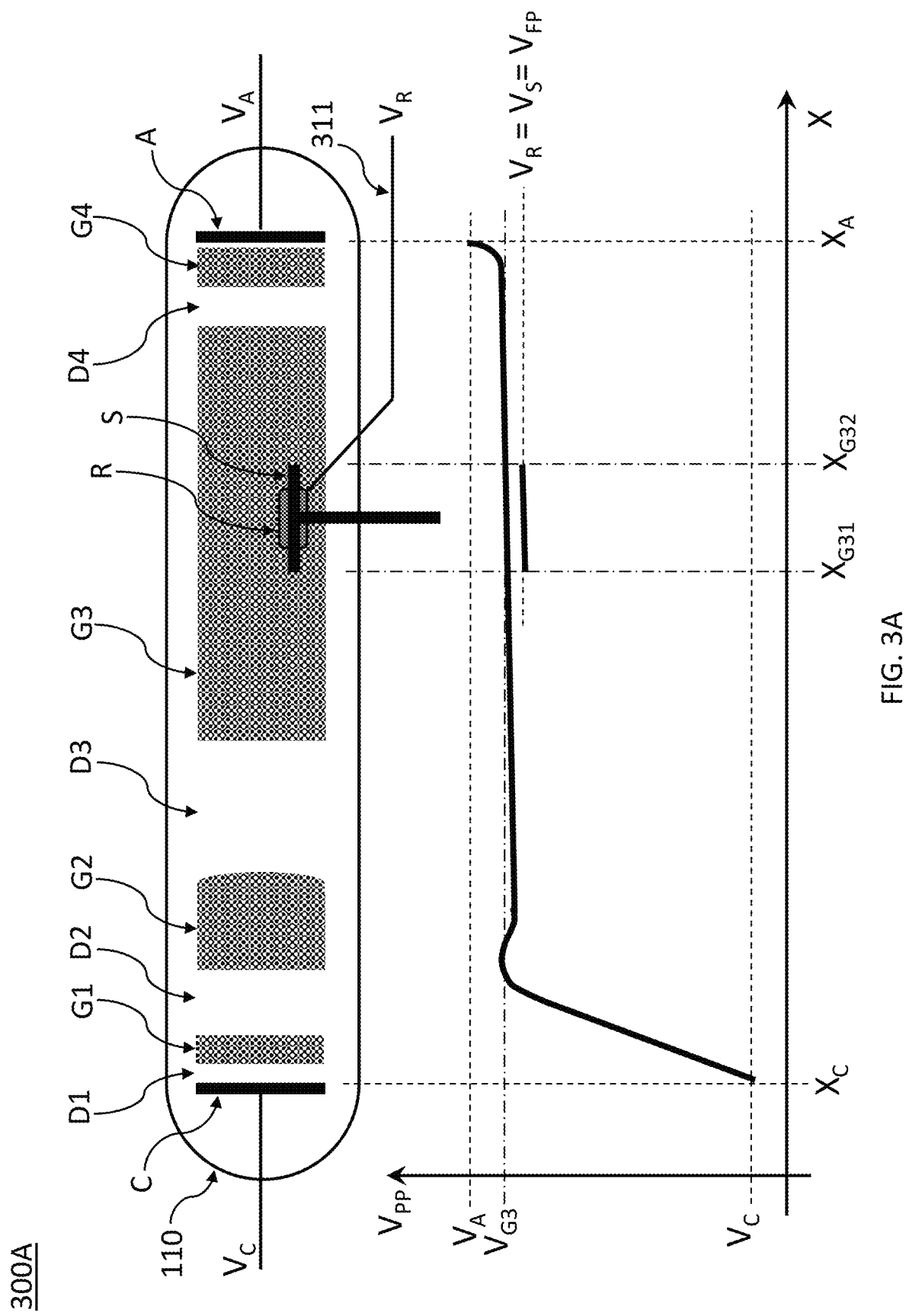
FIG. 3A shows a simplified schematic view of a DC plasma processing system according to an embodiment of the present disclosure comprising means to control a surface potential of the stage and means to measure the surface potential.

FIG. 3A shows a simplified schematic view of a DC plasma processing system (300A) according to an embodiment of the present disclosure comprising means (250, 260 of FIG. 2A) to control a surface potential of the stage, S, and means (R, 311, $V_R$ of FIG. 3A) to measure the surface potential, $V_S$ (e.g., floating potential, $V_{FP}$) atop the stage. As understood by a person skilled in the art, the system (300A) represents an improvement over the system (200A) described above with reference to FIG. 2A by adding the means (R, 311, $V_R$) to measure the surface potential, $V_S$, or in other words, to measure the (surface) floating potential, $V_{FP}$ atop the stage. By enabling such measurement of the floating potential, $V_{FP}$, adjustment of the DC voltage source (250) as described above with reference to FIGS. 2A-2C may be performed while monitoring/measuring the surface potential, $V_{FP}$. This in turn allows precise control of the floating potential, $V_{FP}$, including, for example, to zero such potential ($V_{FP}=0$ volts).

With continued reference to FIG. 3A, the means (R, 311, $V_R$) includes a reference plate, R, that is placed within DC plasma chamber (110) at a same (longitudinal coordinate) segment [$X_{G31}$, $X_{G32}$] as the stage, S. The reference plate, R, may be fabricated from any conductive material capable of withstanding (internal) operating conditions of the chamber (110), and may have any planar shape, including planar shapes according to, for example, a square, rectangle, circle, pentagon, trapezoid or other. Because the reference plate, R, is arranged in the same region of the stage, S, and therefore in a region of a same substantially constant plasma potential, $V_{PP}$, the reference plate, R, sees the same floating potential, $V_{FP}$, as the stage, S. In other words, by measuring the (surface) potential, $V_R$, at the reference plate, R, the floating potential at the stage, S, can be determined. An insulated conductive wire (311) attached to the reference plate, R, may be used to route/couple the potential, $V_R$, to measurement electronics (e.g., transducer) placed outside the chamber (110). It should be noted that such measurement electronics should not provide a DC current path to the plasma through plate R.

With continued reference to FIG. 3A, placement of the reference plate, R, may be at any longitudinal extension of the chamber (110) within the segment [$X_{G31}$, $X_{G32}$] that is technically feasible and practical. As the chamber (110) may include an access door adjacent the stage, S, on one side of the chamber (110), in some exemplary embodiments the reference plate, R, may be arranged against, or in the vicinity, of a wall of the chamber (110) that is on an opposite side of the access door and stage, S. Furthermore, according to an exemplary embodiment, a center of the reference plate, R, and a center of the stage, S, (e.g., intersection of the two segments that make the T shape of the stage as shown in the figures) may be contained within a line that is perpendicular to the axial direction (e.g., centerline, direction of longitudinal extension) of the chamber (110). Applicants of the present disclosure have verified high accuracy of the means (R, 311, $V_R$) in tracking of the floating potential of the stage, S.

Figure 3B:
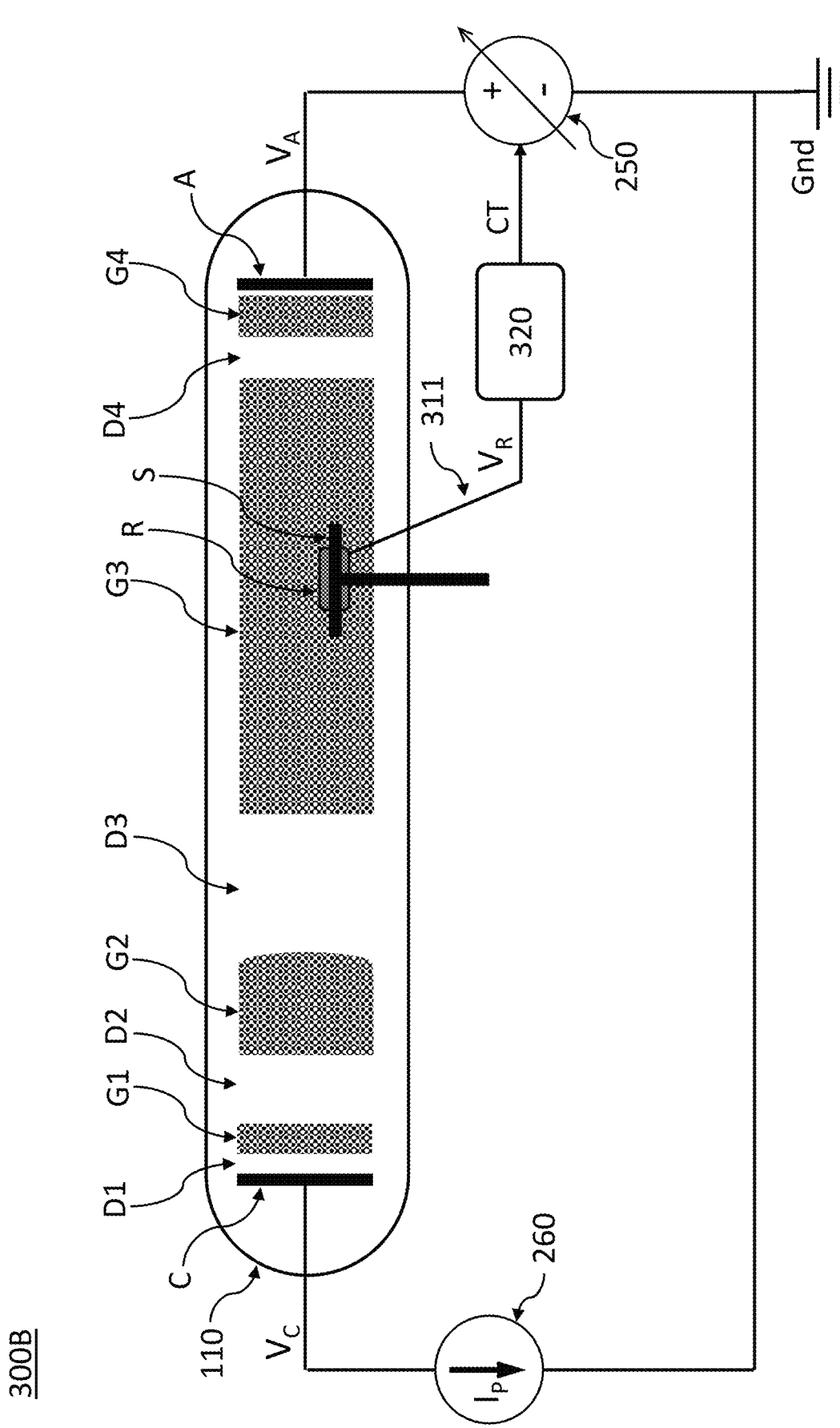
FIG. 3B shows a simplified schematic view of a DC plasma processing system according to an embodiment of the present disclosure that is based on the system of FIG. 3A with added means for automatic control of the surface potential.

FIG. 3B shows a simplified schematic view of a DC plasma processing system (300B) according to an embodiment of the present disclosure that is based on the system (300A) of FIG. 3A with added means (320, CT) for automatic control of the surface potential, $V_{FP}$, at the stage, S. The means (320, CT) includes control electronics (320) configured to implement a closed loop control system to automatically control the value of the floating potential, $V_{FP}$, at the stage, S, to a preset value (e.g., zero volts) while operating the DC plasma chamber for different types of processing. In particular, as shown in FIG. 3B, the control electronics (320) takes the (surface) potential, $V_R$, of the reference plate, R, as input via a coupling provided by the insulated conductive wire (311), and generates therefrom a control (error) signal, CT, to the adjustable DC voltage source (250) to adjust the voltage, $V_A$, provided to the anode, A, and therefore, as described above with reference to FIGS. 2A-2C, adjust the floating potential, $V_{FP}$, at the stage, S. The control (error) signal, CT, may be generated with respect to a desired target/preset value of the floating potential, $V_{FP}$, such as, for example, zero volts. A person skilled in the art is well aware of design techniques for implementing the control electronics (320) which are outside the scope of the present disclosure. In particular, a person skilled in the art is well aware of using operational amplifiers or error amplifiers in such control electronics (320), wherein inputs of such amplifiers may be coupled to the potential, $V_R$, and to the desired target/preset value (e.g., zero volts) of the floating potential, $V_{FP}$, to generate an error signal (e.g., CT) based on a difference of the inputs.

Figure 4A:
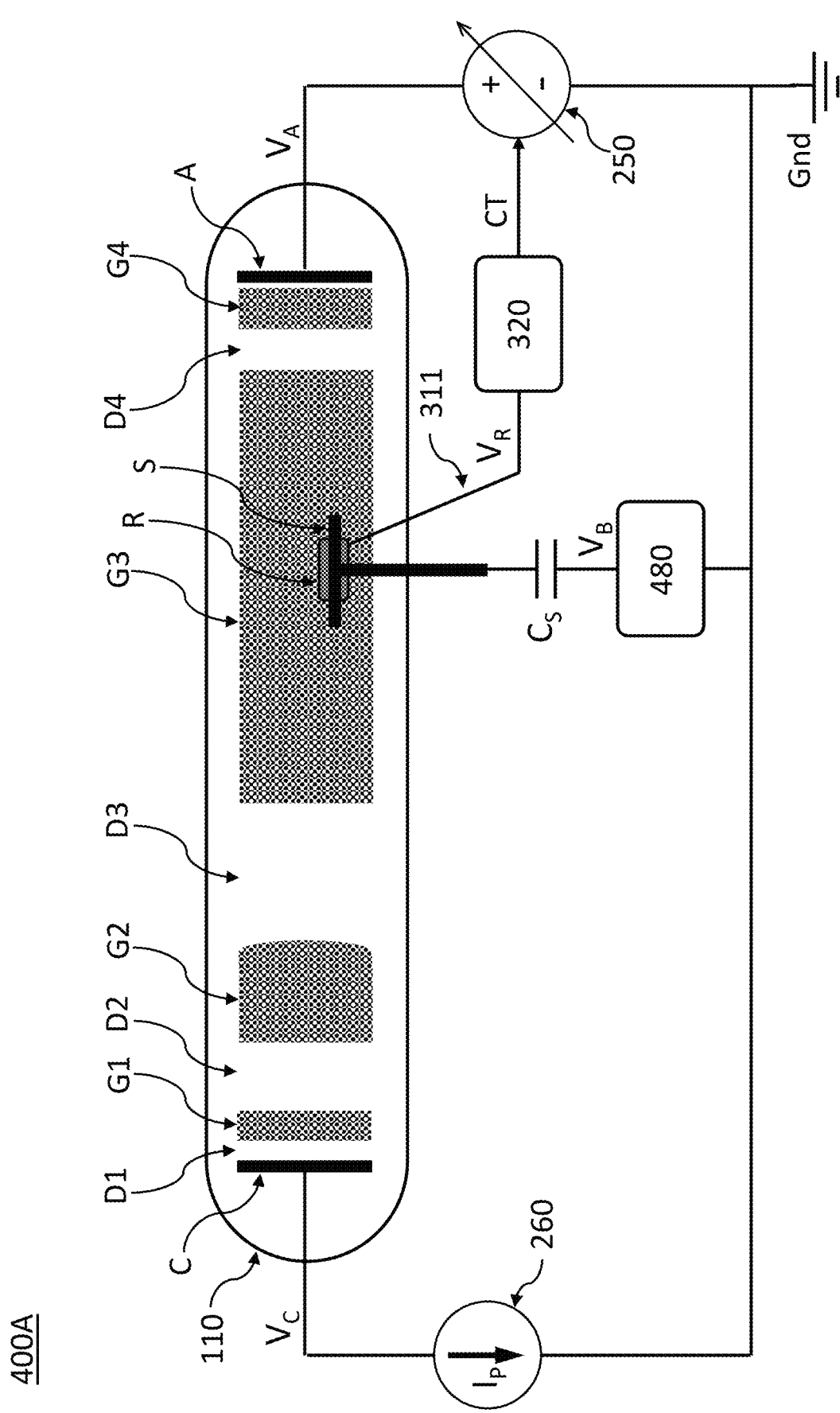
FIG. 4A shows a simplified schematic view of a DC plasma processing system according to an embodiment of the present disclosure that is based on the system of FIG. 3B with added means for biasing of the stage.
Figure 4B:
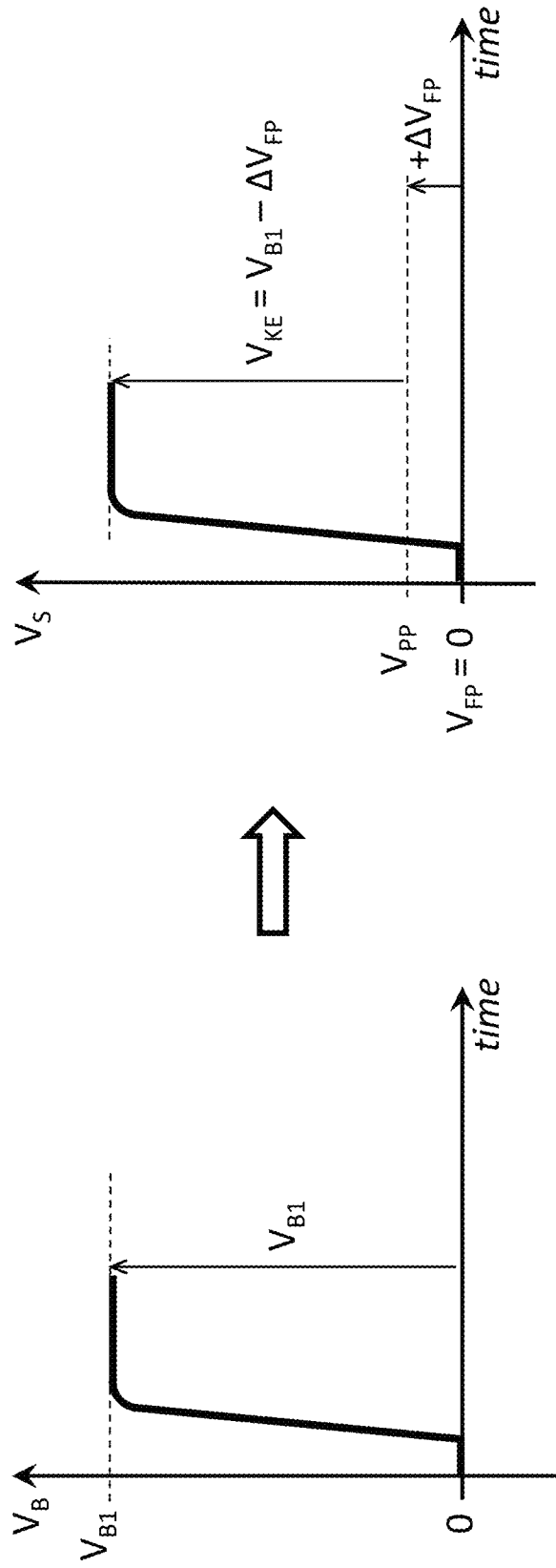
FIG. 4B shows an exemplary biasing signal provided to the stage of the DC plasma processing system of FIG. 4A and a corresponding potential generated at the surface of the stage.

FIG. 4A shows a simplified schematic view of a DC plasma processing system (400A) according to an embodiment of the present disclosure that is based on the system of FIG. 3B with added biasing means ($C_S$, 480) for biasing of the stage, S. In particular, the biasing means ($C_S$, 480) includes a biasing signal generator (480) that is coupled to the stage, S, through a capacitor, $C_S$, of the biasing means. In other words, a biasing signal, $V_B$, generated at an output of the biasing signal generator (480) is capacitively coupled to the stage, S, through the capacitor, $C_S$. As previously described in the present disclosure, such capacitive coupling may allow removal of any DC current path from or into the DC plasma chamber (110), thereby preventing any undesired perturbation of operating conditions of the chamber (110). It should be noted that the biasing signal generator (480) may include, for example, a programmable waveform generator configured to output a waveform of the biasing signal, $V_B$, according to desired characteristics, including for example, amplitude, frequency, duty cycle and/or rising/falling edges/slopes. It is further noted that the stage, S, may include a first conductive portion (e.g., vertical lead connected to the capacitor $C_S$) for electrical coupling of the biasing signal, $V_B$, to the stage, S, and a second portion of the stage (e.g., horizontal support plate) that may include conductive and/or insulating material.

FIG. 4B shows an exemplary biasing signal, $V_{B1}$, provided to the stage, S, of the DC plasma processing system (400A) of FIG. 4A and a corresponding surface potential, $V_S$, generated at the surface of the stage, S. As can be clearly understood by a person skilled in the art, the graphs shown in FIG. 4B correspond to a configuration of the system (400) wherein the floating potential, $V_{FP}$, is adjusted or controlled to be at zero volts. Accordingly, and in view of (or in contrast to) the above description with reference to FIG. 1E, the (kinetic) energy of the free electrons and/or ions attracted to the surface of the stage, S, or a substrate thereupon, is based on the potential difference $V_{KE} = (V_{B1} - \Delta V_{FP})$, with $\Delta V_{FP} = (V_{PP} - V_{FP})$. Accordingly, since in practical substrate processing applications using a DC plasma chamber, a value of $\Delta V_{FP}$ may be substantially smaller (e.g., ratio of 1/50 or smaller) than the value of $V_{KE}$ (e.g., based on the energy level $E_e$ of a target electron per FIG. 4C); an approximation $V_{KE} = V_{B1}$ may be considered reasonable. In turn, this allows a simple and straightforward generation of the biasing signal, $V_{B1}$, provided to the stage, S, for implementation of the electron enhanced material processing (EEMP) according to the teachings of the present disclosure that exactly and selectively targets the energy level of an atom (e.g., bound electron) at the surface of the substrate.

With further reference to FIG. 4A and FIG. 4B, it is noted that excitation of the energy levels of the atoms at the surface of the stage, S, or at the surface of a substrate arranged atop the stage, S, may be primarily based on an instantaneous change in the surface potential, $V_S$. Accordingly, excitation of the energy levels may be accomplished immediately at the end of the transition of the biasing voltage to the target value, $V_{B1}$, or in other words, at the end of the slope shown in FIG. 4B.

Figure 4C:
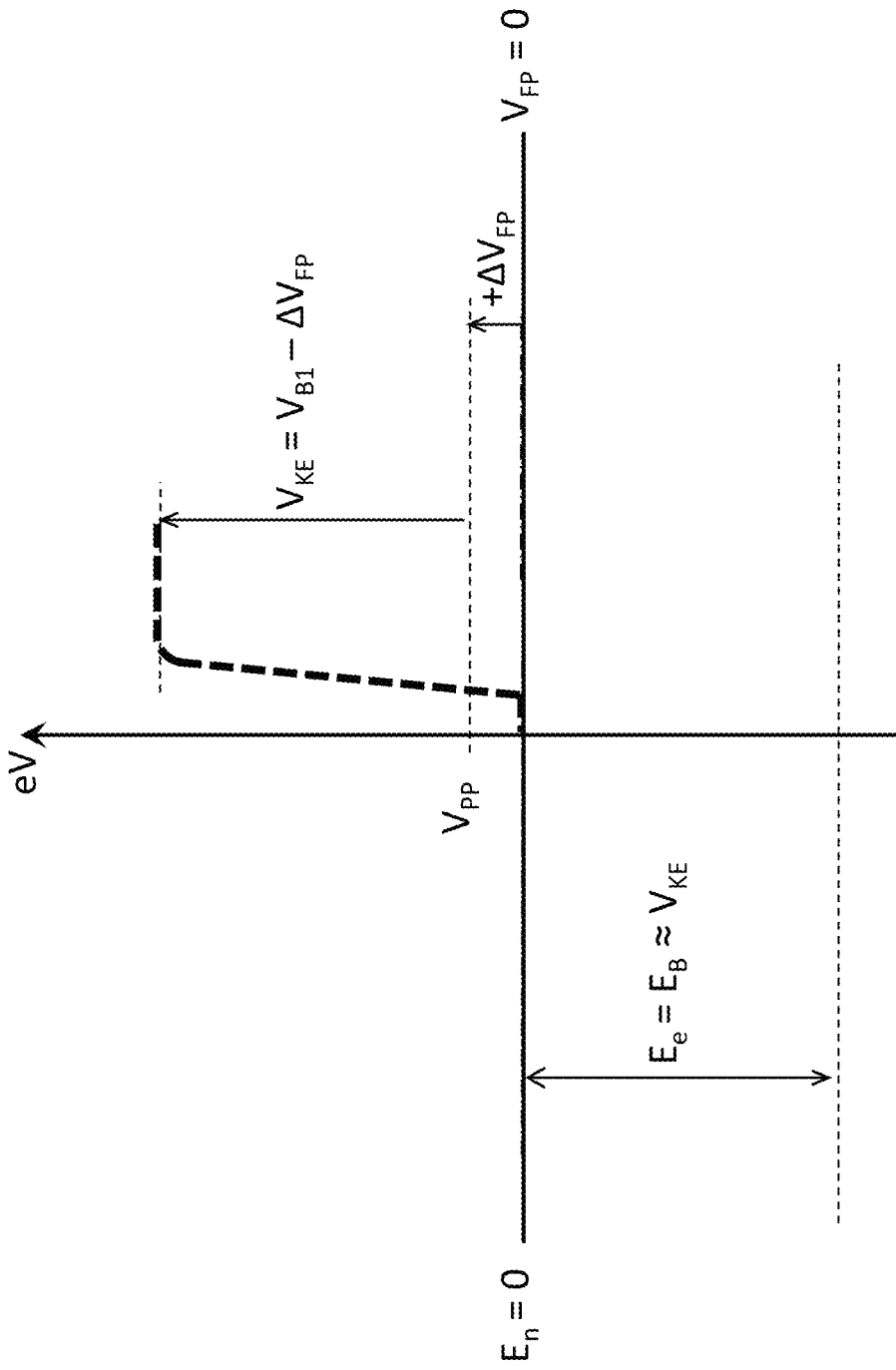
FIG. 4C shows exemplary energy levels of atoms at a surface of the stage.

FIG. 4C shows exemplary energy levels of atoms at a surface of the stage, S, of the DC plasma processing system (400A) of FIG. 4A. FIG. 4C highlights benefits of the electron enhanced material processing (EEMP) according to the teachings of the present disclosure that allows adjustments to exactly and selectively target the energy level of an atom (e.g., Ee≈$V_{KE}$ per FIG. 4C) at the surface of the substrate based on the zeroing of the floating potential, $V_{FP}$, according the above description with reference to FIGS. 2A-2C, further based on the reference plate, R, according to above description with reference to FIG. 3A, further based on the (optional) closed loop control system provided by the control electronics (320) according to the above description with reference to FIG. 3B, and further based on the capacitive coupling of the biasing signal, $V_B$, provided by the biasing signal generator (480) according to the above description with reference to FIG. 4A.

Figure 5:
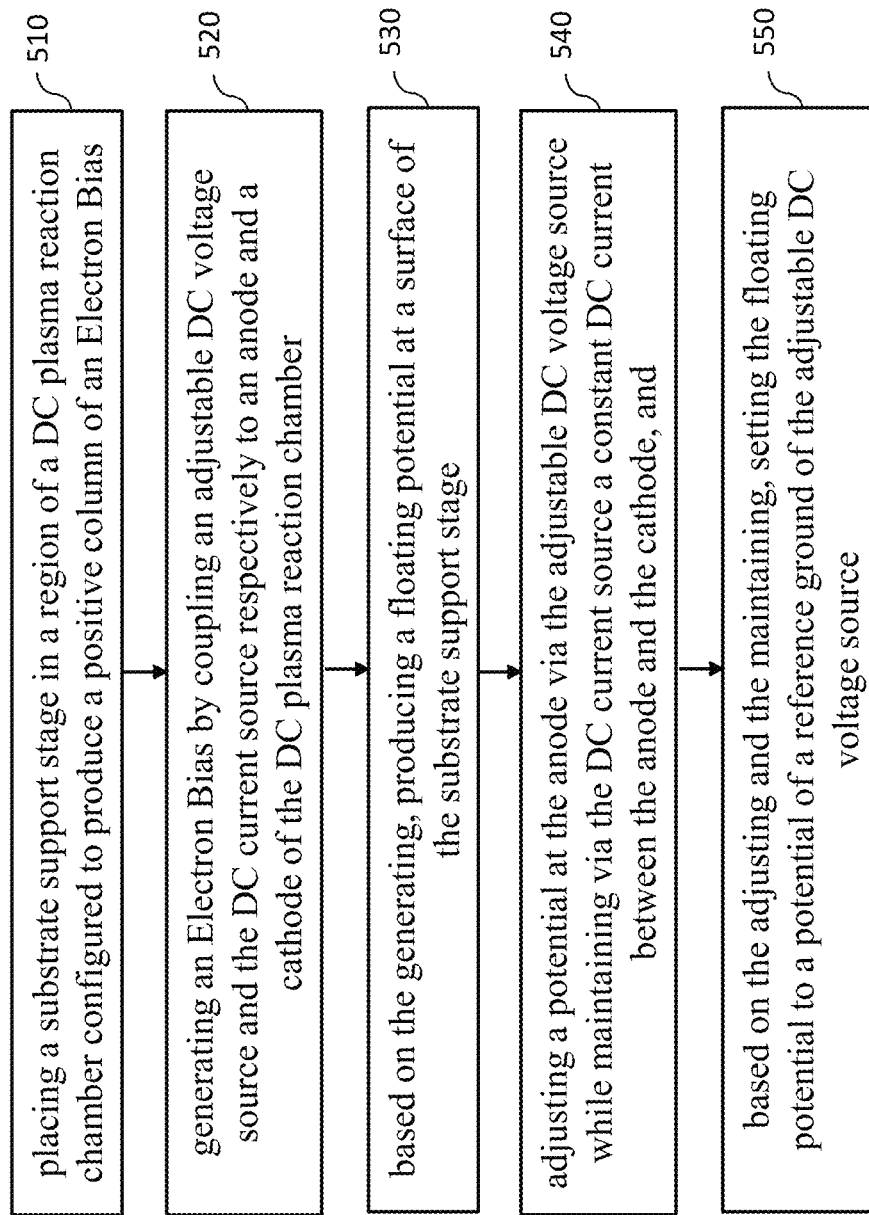
FIG. 5 is a process chart showing various steps of a method according to an embodiment of the present disclosure for processing a surface of a substrate.

FIG. 5 is a process chart (500) showing various steps of a method according to an embodiment of the present disclosure for processing a surface of a substrate. As shown in FIG. 5, such steps comprise: placing a substrate support stage in a region of a DC plasma reaction chamber configured to produce a positive column of the DC plasma, according to step (510); generating a DC plasma by coupling an adjustable DC voltage source and a DC current source respectively to an anode and a cathode of the DC plasma reaction chamber, according to step (520); based on the generating, producing a floating potential at a surface of the substrate support stage, according to step (530); adjusting a potential at the anode via the adjustable DC voltage source while maintaining via the DC current source a constant DC current between the anode and the cathode, according to step (540); and based on the adjusting and the maintaining, setting the floating potential to a potential of a reference ground of the adjustable DC voltage source, according to step (550).

Figure 6A:
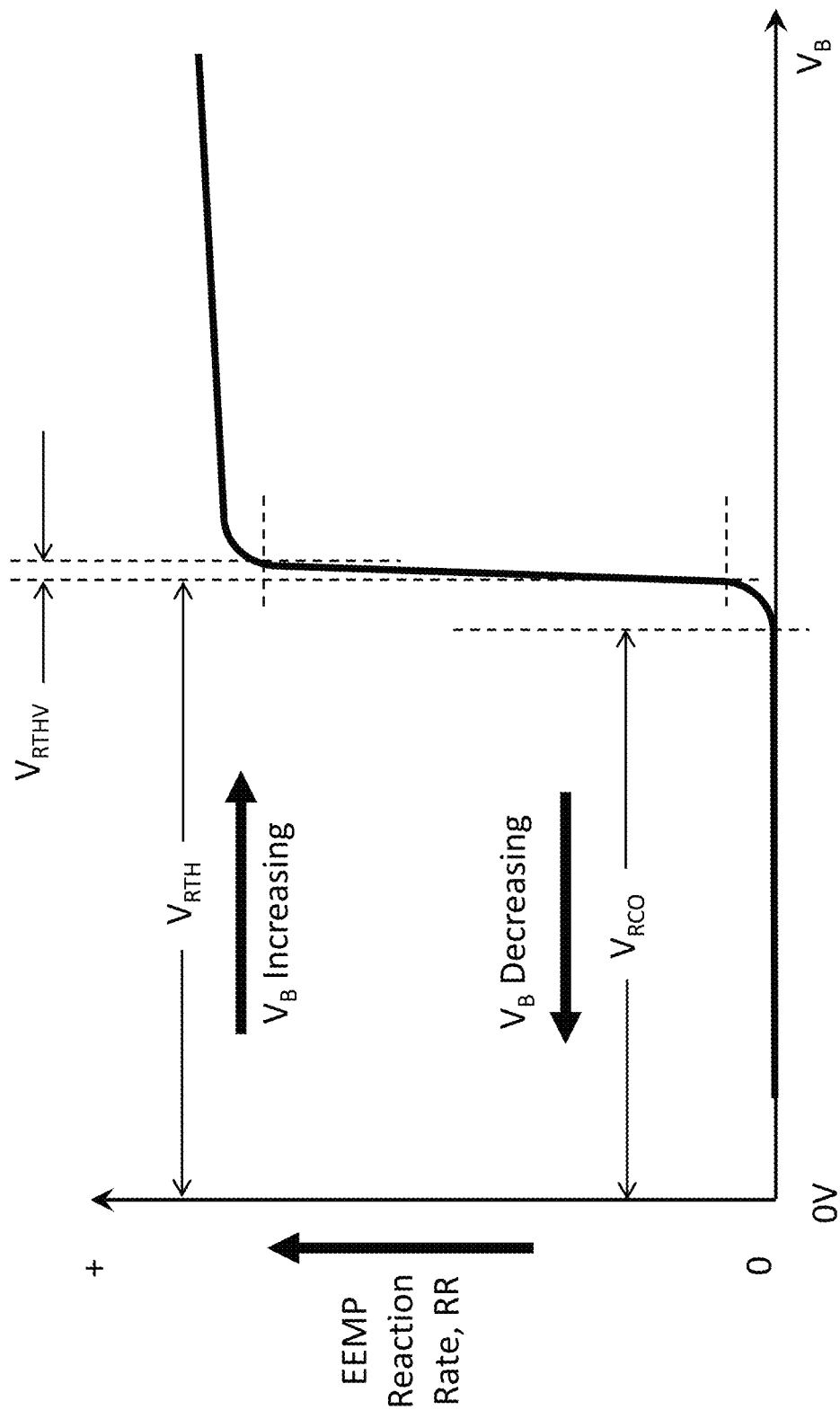
FIGS. 6A-6C show graphs representative of reaction rates of electron enhanced material processing (EEMP) according to the present disclosure for different materials.
Figure 6B:
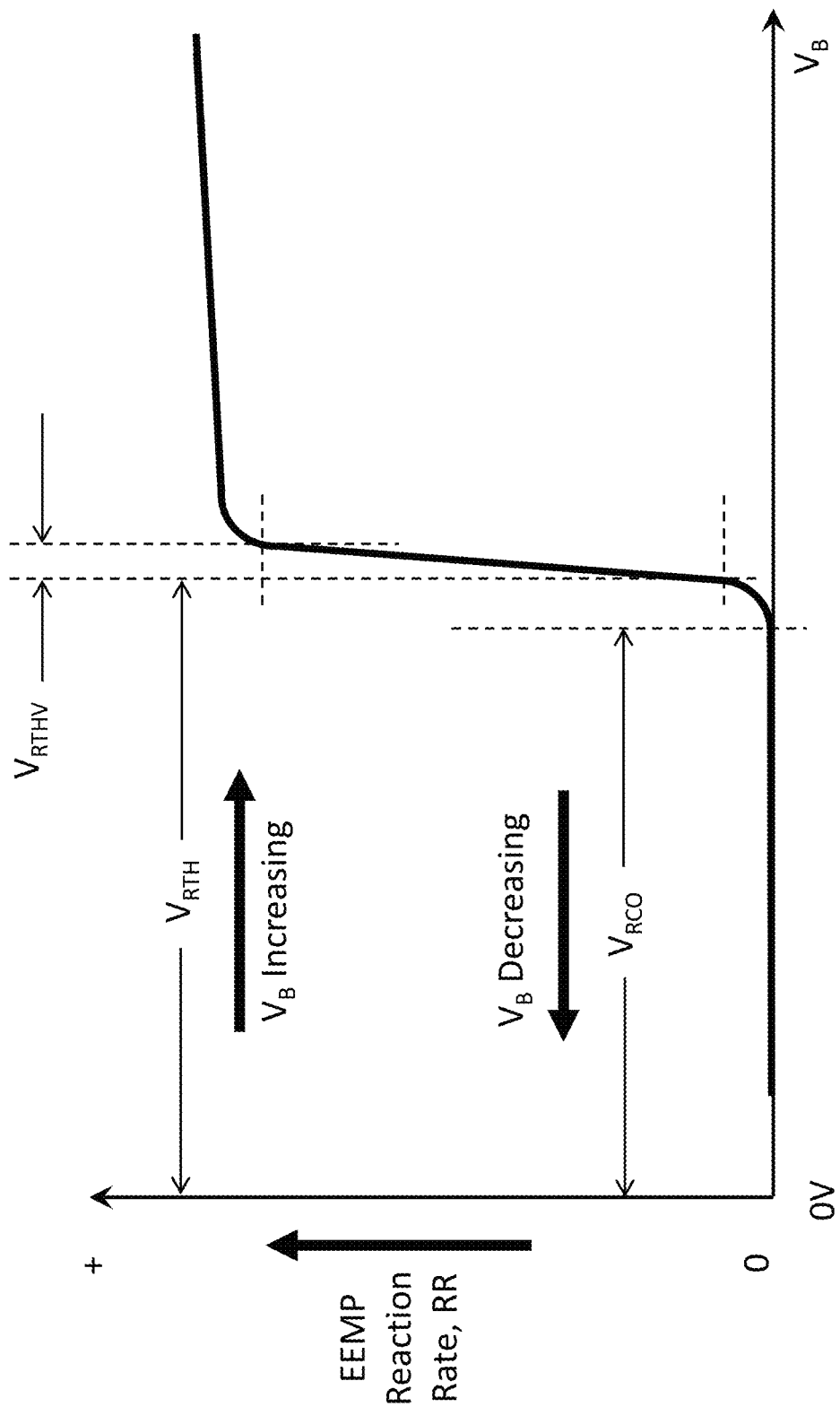
Figure 6C:
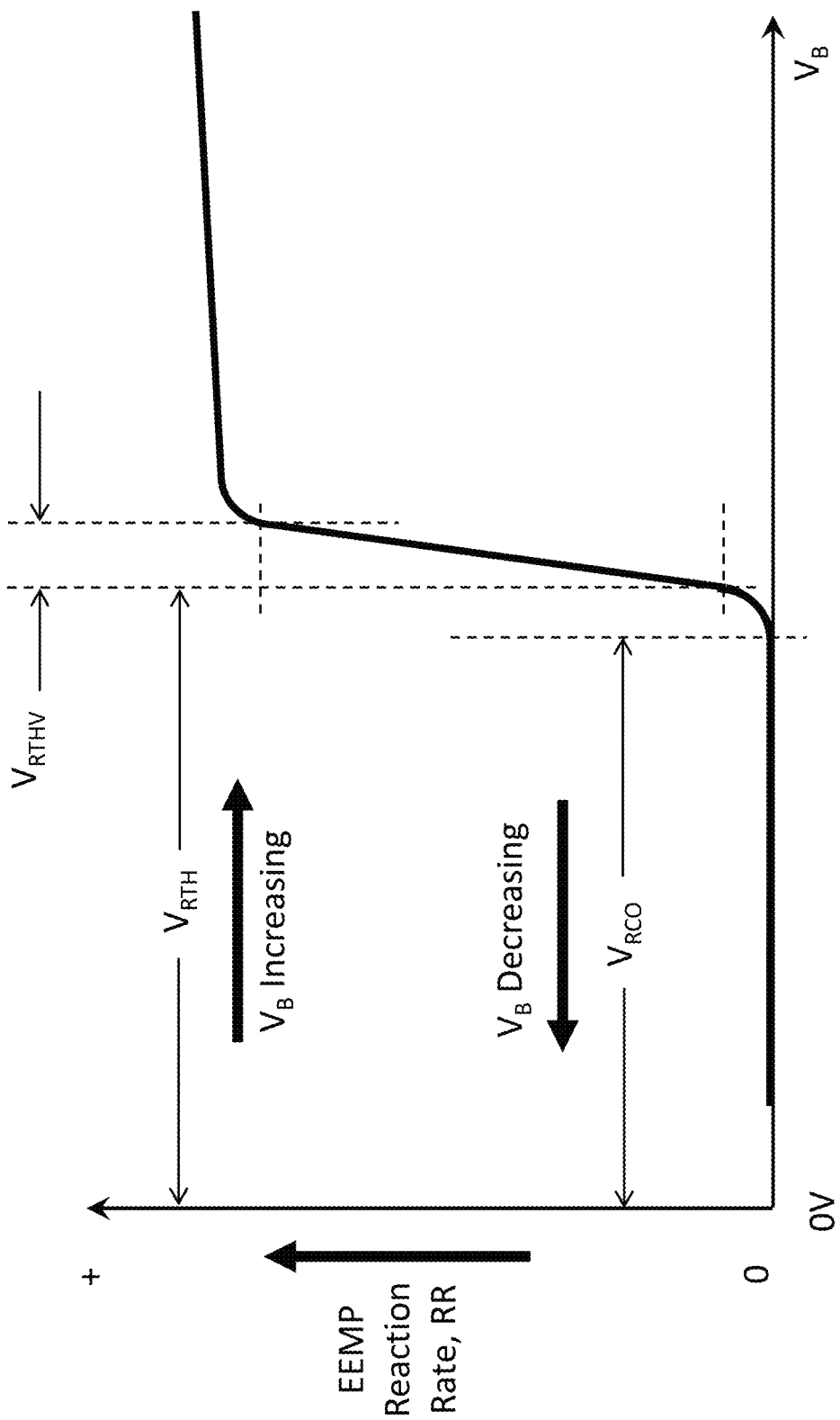

FIGS. 6A-6C show graphs representative of reaction rates of electron enhanced material processing (EEMP) according to the present disclosure for different (categories/types/classes of) materials, including, single crystal or 2-dimentional (2D) materials (FIG. 6A) such as for example a semiconductor or insulator material, metals and metal alloys (FIG. 6B), and complex materials (FIG. 6C) such as polymers, composites, nano-materials or 3-dimensional (3D) materials. In this case, a reaction, or a targeted reaction, may be referred to as the breaking of chemical bonds (e.g., bonds between electrons and nucleus) of atoms of a material at the surface of a substrate that is placed atop the stage (e.g., S of FIG. 4A) responsive to a level of the biasing signal, $V_B$, applied to the stage (e.g., S of FIG. 4A). As can be clearly taken from such graphs, the reaction rate, RR, may be characterized by a reaction threshold voltage, $V_{RTH}$, a reaction cutoff voltage, $V_{RCO}$, and a reaction threshold variation voltage, $V_{RTHV}$. It should be noted that for each material, or type of material, such characteristic voltages may be different and typically part of a priori acquired knowledge base. For example, the $V_{RTH}$, of a crystal material (e.g., FIG. 6A) may be different from the $V_{RTH}$, of a metal material (e.g., FIG. 6B) or the $V_{RTH}$ of a complex material (e.g., FIG. 6C), and the $V_{RTHV}$, of a crystal material (e.g., FIG. 6A) may be different from the $V_{RTHV}$, of a metal (e.g., FIG. 6B) or a complex material (e.g., FIG. 6C).

It should be noted that 2D materials compatible with the electron enhanced material processing (EEMP) according to the present disclosure may include, for example, graphene, boron nitride, molybdenum disulfide, tungsten diselenide, or platinum diselenide; Nano materials compatible with the EEMP according to the present disclosure may include, for example, carbon nanotubes, nano-silver particles, titanium oxide particles, or quantum dots; 3D materials compatible with the EEMP according to the present disclosure may include any 3D structure formed in a material, including for example, a polymer, collagen fiber or a metal such as, for example, titanium, or 3D printed polymer/polymer, polymer/carbon, or polymer/metal microstructures. Single crystals compatible with the EEMP according to the present disclosure may include, semi conducting single crystals, such as, for example, IV silicon, germanium, III-V gallium arsenide, gallium nitride, silicon carbide, indium gallium arsenide, etc., II-VI zinc selenide, and quantum well stacks that contain alternating layers of III-V compound semiconductors, and/or II-VI compound semiconductors. Single crystals compatible with the EEMP according to the present disclosure may further include semi conducting single crystals, such as, for example, quartz, sapphire or diamond. Polymers compatible with the EEMP according to the present disclosure may include, for example, polypropylene, polyethylene, polyether ether ketone, polycarbonate. Composites compatible with the EEMP according to the present disclosure may include, for example, polymers containing metal particles, carbon particles, carbon fibers or carbon nanotubes. Materials and structures enumerated herewith should be considered as nonlimiting with regard to a material compatibility list of the EEMP according to the present teachings, which list can grow as new materials/structures and corresponding binding and reaction energies (that can be targeted with the present EEMP) are obtained, via, for example, advanced methods for computer simulation of chemical bonds.

With continued reference to FIGS. 6A-6C, when a substrate is placed atop the stage (e.g., S of FIG. 4A), as described above with reference to, for example, FIG. 4B, the floating potential (e.g., $V_{FP}$ of FIG. 4B) may be adjusted (and controlled) to a known potential (e.g., zero volts or other). Accordingly, the energy levels of the atoms at the surface of the substrate may take the same potential (e.g., as their ground state) and no reaction at the surface of the substrate may be observed, or in other words and as shown in FIGS. 6A-6C, the reaction rate, RR, of the targeted bonds (which are at the ground state) is at zero. As the biasing voltage, $V_B$, increases, the reaction rate, RR, of the targeted bonds remains at zero, up to the reaction cutoff voltage, $V_{RCO}$, after which a small amount (e.g., minority) of the targeted bonds slowly begin to react, or in other words, a minority of the targeted bonds reach their respective excited states. As the biasing voltage, $V_B$, increases beyond the reaction cutoff voltage, $V_{RCO}$, the reaction rate, RR, slowly increases with gradually more of the targeted bonds reaching their respective excited states. When the biasing voltage, $V_B$, reaches the reaction threshold voltage, $V_{RTH}$, a majority of the targeted bonds begin to react (e.g., reach their respective excited states) and with further increase of the biasing voltage, $V_B$, the reaction rate, RR, increases according to a (substantially) fixed slope, which continues until the biasing voltage, $V_B$, reaches the reaction threshold variation voltage, $V_{RTHV}$. Between the reaction threshold voltage, $V_{RTH}$, and the reaction threshold variation voltage, $V_{RTHV}$, the reaction rate, RR, increases until (almost) all of the targeted bonds react. As shown in FIGS. 6A-6C, further increase of the biasing voltage, $V_B$, beyond the reaction threshold variation voltage, $V_{RTHV}$, marginally increases the reaction rate, RR, or in other words, to a point of "diminishing returns". On the other hand, as the biasing voltage, $V_B$, decreases, the reaction rate, RR, follows the same graphs shown in FIGS. 6A-6C. In particular, when the biasing voltage, $V_B$, decreases to a level that is below the reaction cutoff voltage, $V_{RCO}$, the reaction rate, RR, falls to zero as all of the targeted bonds at the surface of the substrate return to their respective ground states.

As can be clearly taken from the graphs shown in FIGS. 6A-6C, the (substantially) fixed slope of the reaction rate, RR, between the voltages, $V_{RTH}$ and $V_{RTHV}$, or in other words, the difference between such two voltages, may be a function of a material used in (the surface of) the substrate being processed. In particular, the difference between the voltages, $V_{RTH}$ and $V_{RTHV}$, may be due: to atomic level imperfections on surface of a single crystal material such as a, semiconductor or insulator (e.g., FIG. 6A); to atomic level imperfections on surface of a metal, metal alloy or nano-material and related grain boundaries (e.g., FIG. 6B); or to presence of 3-dimensional (3D) structures of a polymer, a composite or other 3D material (e.g., FIG. 6C). As described later in the present disclosure, teachings according to the present disclosure describe a waveform to produce a biasing signal having a voltage level, $V_B$, that is specifically targeted to the material used in the substrate such as to control activation (or deactivation) of the reaction governed by the reaction rate, RR, graphs shown in, for example, FIGS. 6A-6C. In particular, specific waveforms for each of the materials represented by the reaction rate, RR, graphs of FIG. 6A, FIG. 6B and FIG. 6C are respectively shown in FIG. 7A, FIG. 7B and FIG. 7C.

Figure 7A:
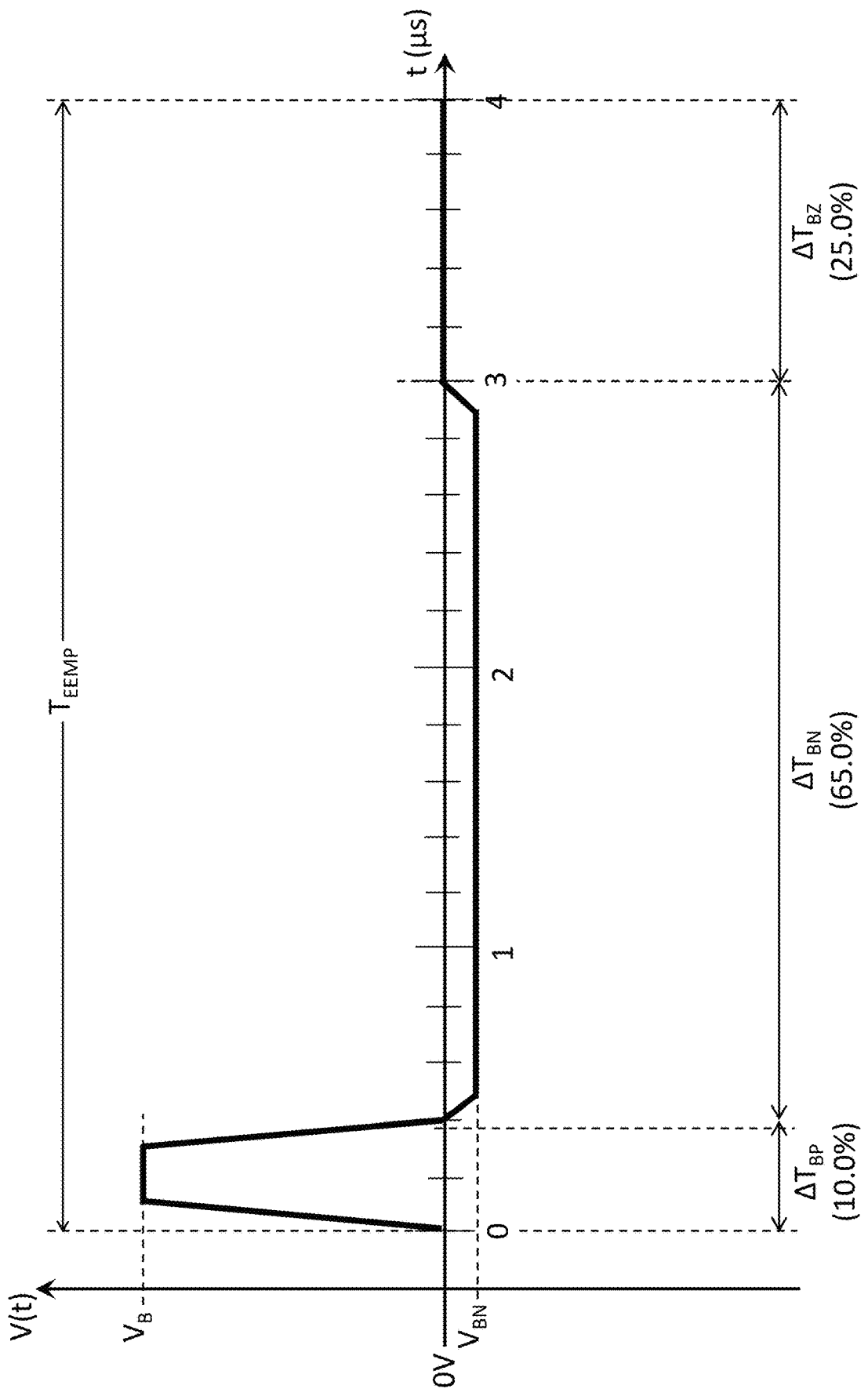
FIGS. 7A-7C show graphs representative of waveforms for EEMP biasing signals according to some exemplary embodiments of the present disclosure for processing of different materials.
Figure 7B:
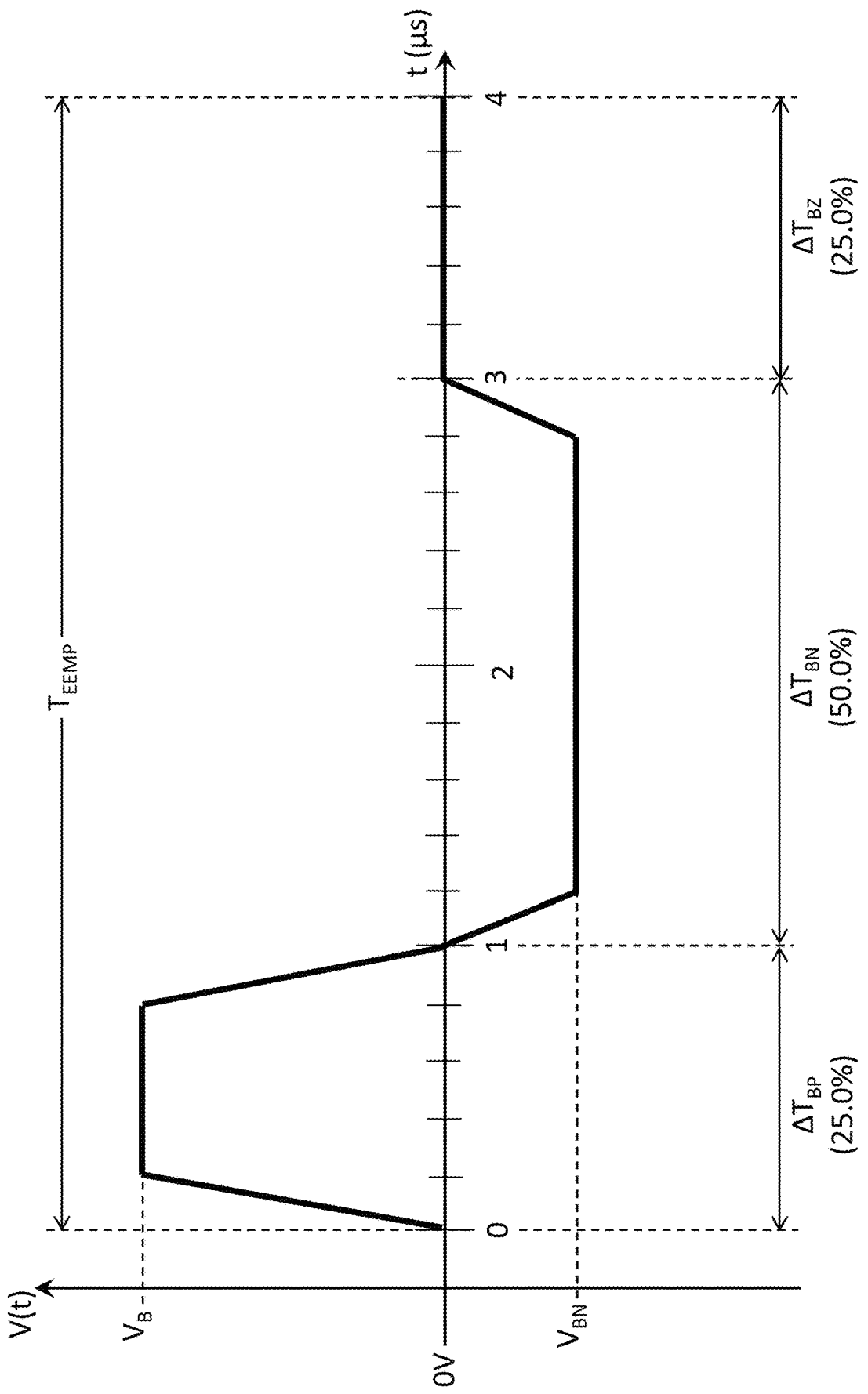
Figure 7C:
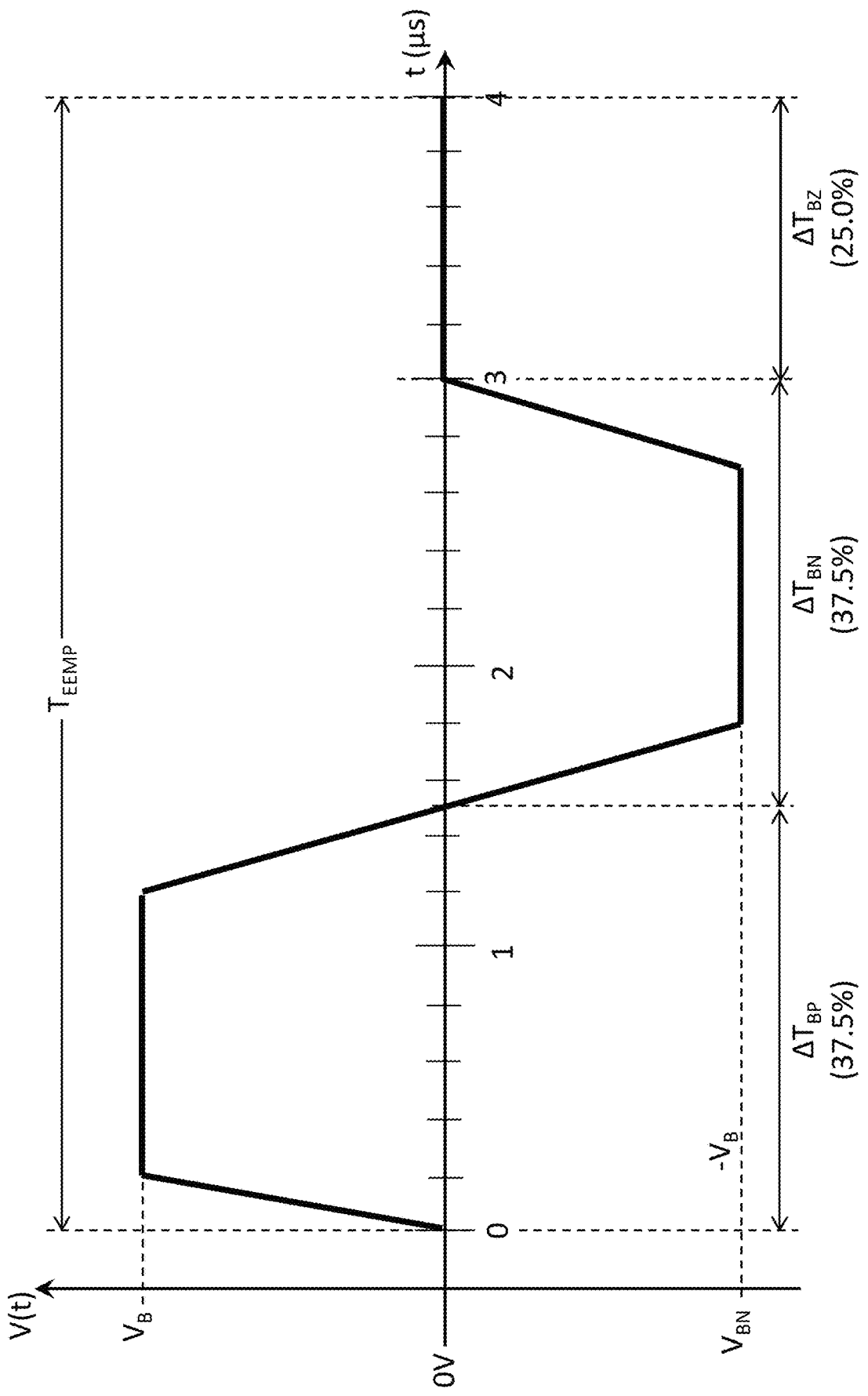

FIGS. 7A-7C show graphs representative of waveforms for EEMP biasing signals, V(t), according to some exemplary embodiments of the present disclosure for processing of different materials. In particular, FIG. 7A shows a waveform for processing of a single crystal material such as a semiconductor or insulator; FIG. 7B shows a waveform for processing of a metal, metal alloy or nano-material; and FIG. 7C shows a waveform for processing of a polymer, a composite, or a 3D material. It should be noted that such graphs represent ideal voltage levels (e.g., $V_B$, $V_{BN}$) of the biasing signal, V(t), for use in the EEMP process according to the present disclosure described above, which may include control of the potential, $V_{FP}$, to a known level, such as zero volts or other fixed known level, and energizing of free electrons in the DC plasma with voltage/potential levels (e.g., $V_B$) that are referenced to the potential, $V_{FP}$.

Each of the graphs of FIGS. 7A-7C represents one cycle, denoted as, $T_{EEMP}$, of the waveform for the (periodic) biasing signal, V(t). The EEMP processing of a material on a surface of a substrate may be performed by the biasing signal, V(t), generated via a repetition of a predetermined number of cycles, $T_{EEMP}$, according to a priori acquired process knowledge. Different EEMP processing (e.g., having respective RR characteristics) may be sequentially performed on a same substrate in view of layers of different material in the substrate and/or different operating conditions of the DC plasma reaction chamber and/or (controlled/preset) level of the potential, $V_{FP}$.

With continued reference to FIGS. 7A-7C, according to an embodiment of the present disclosure, the cycle, $T_{EEMP}$, of the waveform of the biasing signal, V(t), may include three distinct phases (e.g., time intervals, time segments, time durations), $\Delta T_{BP}$, $\Delta T_{BN}$, and $\Delta T_{BZ}$, respectively including a voltage level that is above zero volts (or the reference voltage level), below zero volts, and equal to zero volts. In other words, during the time interval, $\Delta T_{BP}$, a level, $V_B$, of the biasing signal, V(t), is strictly greater than zero volts (or the reference voltage level); during the time interval, $\Delta T_{BN}$, the level, $V_{BN}$, of the biasing signal, V(t), is strictly less than zero volts; and during the time interval, $\Delta T_{BZ}$, the level of the biasing signal, V(t), is equal to the zero volts.

According to an embodiment of the present disclosure, the duration of the cycle, $T_{EEMP}$, of the waveform shown in FIGS. 7A-7C may be in a range from 1 µs to 10 µs, or in other words, a frequency of the biasing signal, V(t), may be in a range from 100 KHz to 1 MHz. According to a further embodiment of the present disclosure, the waveform of the biasing signal, V(t), may be free of a DC component, or in other words, an integral over a cycle of the waveform shown in FIGS. 7A-7C may have a value of zero. Such DC-free characteristic of the waveform according to the present teachings may allow for maintaining an average local surface potential of the substrate during application of the biasing signal, V(t), that is (substantially) equal to the preset/controlled local surface potential (e.g., $V_{FP}$) of the substrate as described above with reference to, for example, FIGS. 2A-4C. In other words, the DC-free characteristic of the waveform may allow application of (substantially) same voltage levels (e.g., $V_B$, $V_{BN}$) shown in FIGS. 7A-7C (to free electrons) on the surface of the substrate. It should be noted that for a case where the potential $V_{FP}$ is adjusted (e.g., preset, controlled) to a (fixed and known) level that is different from zero volts, the waveform may be adjusted to include a DC component that is equal to the level of the potential $V_{FP}$, or in other words, by replacing the 0V reference in FIGS. 7A-7C with the adjusted value of the potential $V_{FP}$.

According to an embodiment of the present disclosure, length of each of the time intervals $\Delta T_{BP}$, $\Delta T_{BN}$, and $\Delta T_{BZ}$ shown in FIGS. 7A-7C may be based on the type of material (at the surface) of the substrate, including the corresponding reaction rate, RR, described above with reference to FIGS. 6A-6C. In particular, a ratio of a length of the time interval $\Delta T_{BP}$ to a length of the time interval $\Delta T_{BN}$ may be in a range from (about) 1/10 to (about) 1/1. For example, for a case of a crystal material (e.g., FIG. 7A) the ratio may be about 10/65 (+/−10%); for a case of a metal material (e.g., FIG. 7B) the ratio may be about 1/2 (+/−10%); and for a case of a complex material (e.g., FIG. 7C) the ratio may be about 1/1 (+/−10%). Furthermore, as shown in FIGS. 7A-7C, a ratio of a length of the time interval $\Delta T_{BZ}$ to a length of the entire cycle, $T_{EEMP}$, may be about 1/4 (+/−10%). According to a nonlimiting embodiment of the present disclosure, the length of the time interval $\Delta T_{BZ}$ may be solely based on the length of the entire cycle, $T_{EEMP}$, and independent from respective lengths of the time intervals $\Delta T_{BP}$ and $\Delta T_{BN}$.

For an exemplary nonlimiting case shown in FIGS. 7A-7C, a ratio of the time intervals ($\Delta T_{BP}$, $\Delta T_{BN}$, $\Delta T_{BZ}$) to the length of the entire cycle, $T_{EEMP}$, may be about (e.g., +/−10%): (10/100, 65/100, 25/100) for a case of a crystal material (e.g., FIG. 7A); (25/100, 50/100, 25/100) for a case of a metal material (e.g., FIG. 7B); and (37.5/100, 37.5/100, 25/100) for a case of a complex material (e.g., FIG. 7C). It should be noted that FIGS. 7A-7C show a cycle, $T_{EEMP}$, having a length of 4 µs (frequency of 250 KHz) which should not be considered as limiting the scope of the present disclosure, since as described above in the present disclosure, such length may be in a range from 1 µs to 10 µs (e.g., frequency of 100 KHz to 1 MHz).

With continued reference to the waveform of FIGS. 7A-7C, during the phase, $\Delta T_{BP}$, the waveform may set the biasing voltage, V(t), to a (positive) level (e.g., $V_B$) for activation of the (targeted) EEMP reaction on the surface of the substrate that is based on collision of energized (free) electrons with the targeted bonds at the surface of the substrate (e.g., with a surface material comprising a single crystal for FIG. 7A, a metal for FIG. 7B, and a complex material for FIG. 7C). According to an embodiment of the present disclosure, a length during which the (high) level, $V_B$, of the biasing voltage, V(t), is maintained must be long enough to hold the energized (free) electrons at the surface of the substrate to react with the targeted bonds. It should be noted that such length may not include (portion of) the rising or falling slopes contained in the phase, $\Delta T_{BP}$, shown in FIGS. 7A-7C (e.g., during which the biasing voltage (V(t) is not at the target high level, $V_B$).

Furthermore, during the phase, $\Delta T_{BN}$, the waveform of FIGS. 7A-7C may set the biasing signal, V(t), to a (negative) level, $V_{BN}$, for deactivation of the EEMP reaction on the surface of the substrate and to further discharge (e.g., repel) any free electrons from the surface of the substrate, thereby neutralizing a charge on the substrate. It should be noted that during the phase, $\Delta T_{BN}$, a kinetic energy may be imparted by the (negative) level, $V_{BN}$, of the biasing signal, V(t), to free ions in the DC plasma which may therefore cause the energized free ions to slowly move toward the surface of the substrate, thereby further participating in the neutralization of the substrate. It should further be noted that due to their low energy levels, the energized free ions may (must) not cause any reaction with bonds at the surface of the substrate. A magnitude of the voltage level, $V_{BN}$, of the biasing signal, V(t), may therefore be sufficiently high (e.g., more negative) to cause the free ions to move slowly toward the substrate, and a duration of the phase, $\Delta T_{BN}$, may be sufficiently long to cause, in combination with the magnitude of the voltage level, $V_{BN}$, and duration of the phase, $\Delta T_{BP}$, suppression (or control) of a DC component of the biasing signal V(t) The length of $\Delta T_{BN}$ and depth/magnitude of $V_{BN}$ may be controlled so that the free ions do not have sufficient energy to damage the corrosive layer nor too little energy to reach and neutralize the substrate to zero net charge and net current.

During the phase, $\Delta T_{BZ}$, the waveform of FIGS. 7A-7C may set a voltage level of the biasing signal, V(t), to zero (or at a same preset level of the floating potential, $V_{FP}$). Accordingly, the phase, $\Delta T_{BZ}$, may be used to restore a same initial biasing condition of the substrate for the start of each cycle, $T_{EEMP}$, of the biasing signal, V(t), such initial biasing condition based on the preset level of the floating potential, $V_{FP}$. This in turn may allow for a more stable and accurate process (EEMP) when compared to other prior art processes. Accordingly, based on the provided description, each of the phases $\Delta T_{BP}$, $\Delta T_{BN}$, and $\Delta T_{BZ}$ of the cycle, $T_{EEMP}$, that describe the waveform of the biasing signal, V(t), may respectively be referred to as: an active (EEMP) reaction phase; a (EEMP) neutralization phase; and an (EEMP) initialization phase, where the latter two phases are inactive phases with respect to the targeted (EEMP) reaction.

Figure 8A:
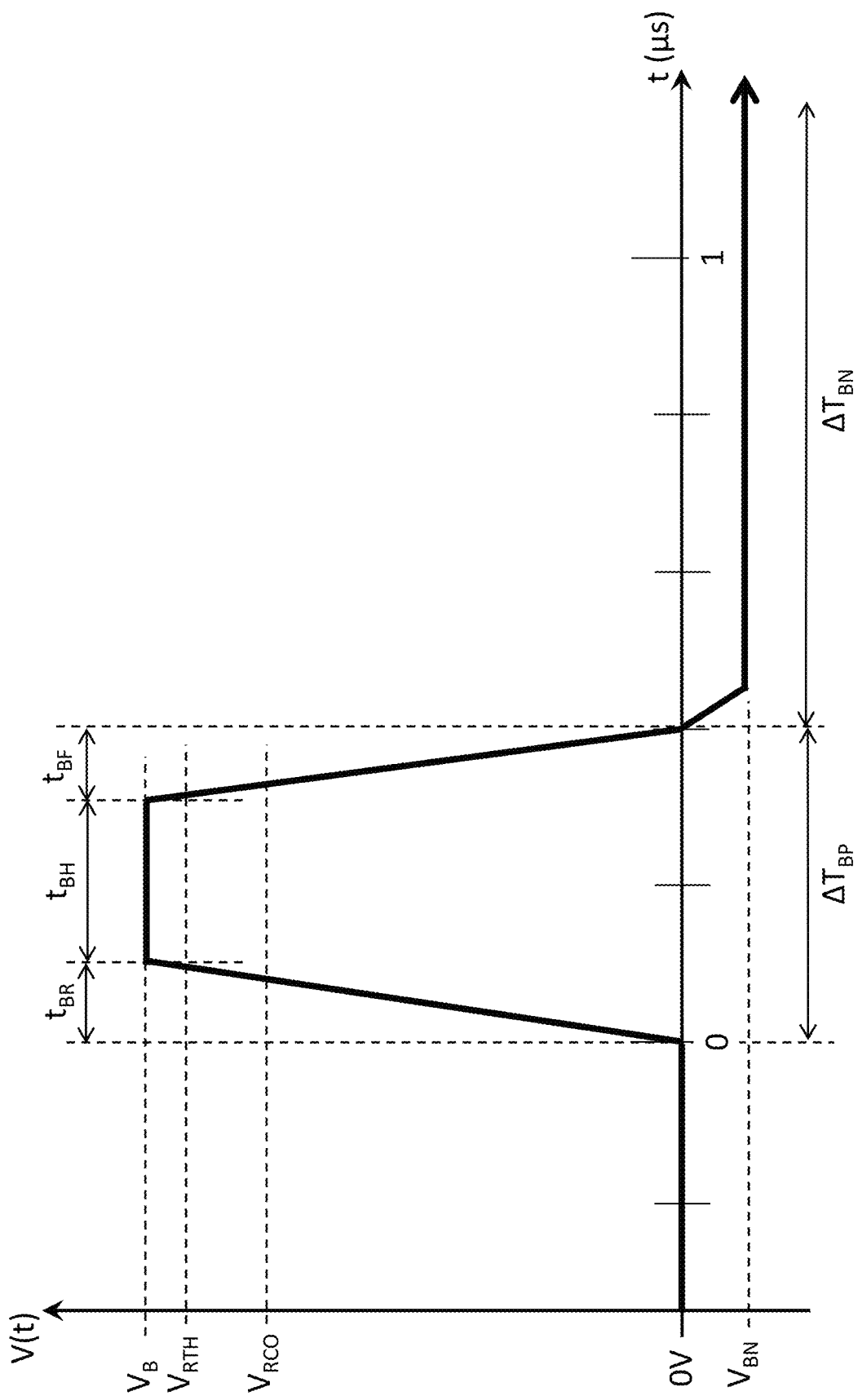
FIG. 8A shows a graph representative of an idealized waveform for the EEMP biasing signals.

FIG. 8A shows a graph representative of an idealized waveform for the EEMP biasing signals, V(t), described above with reference to FIGS. 7A-7C, including further timing details (e.g., time intervals $t_{BR}$, $t_{BH}$, and $t_{BR}$) that describe respective portions of the waveform during the active phase, $\Delta T_{BP}$. In particular, the time interval, $t_{BR}$, may define a transition duration of time that takes the biasing signal, V(t), to reach the target high level, $V_B$, from a start value (e.g., V(t)=0) at start of the phase; the time interval, $t_{BH}$, may define an effective duration of time during which the biasing signal, V(t), is at the target high level, $V_B$; and the time interval, $t_{BF}$, may define a transition duration of time that takes the biasing signal, V(t), to go back to the start value (e.g., V(t)=0) at the end of the active phase, $\Delta T_{BP}$. In other words, the time interval, $t_{BR}$, may define the rising (e.g., leading) edge slope of the biasing signal, V(t), to reach the high level, $V_B$, from the start value, and the time interval, $t_{BF}$, may define the falling (e.g., trailing) edge slope of the biasing signal, V(t), to go back to the start value.

With continued reference to FIG. 8A, during the time interval, $t_{BH}$, the biasing signal, V(t) is at the high level, $V_B$, which is above (greater than) the reaction threshold voltage, $V_{RTH}$, and therefore, as described above with reference to, for example, FIGS. 6A-6C, the targeted bonds may reach their respective excited states so long that, as described above with reference to, for example, FIGS. 7A-7C, the duration of the time interval, $t_{BH}$, is sufficiently long to hold the energized (free) electrons on the surface of the substrate to react with the targeted bonds. According to an exemplary embodiment of the present disclosure, a ratio of a length of the time interval, $t_{BH}$, to a length of the active phase, $\Delta T_{BP}$, may be in a range from about 1/4 (e.g., +/−10%) to about 3/4 (e.g., +/−10%). Accordingly, considering a case for EEMP processing of a single crystal material (e.g., FIG. 6A and FIG. 7A described above), with a periodic biasing signal, V(t), having a frequency of 250 KHz, and therefore a length of the cycle, $T_{EEMP}$, equal to 4 µs, then the length of the time interval, $t_{BH}$, may be in a range from about 0.1 µs to about 0.3 µs.

With further reference to FIG. 8A, as the biasing signal, V(t), rises at the start of the active phase, $\Delta T_{BP}$, a level of the biasing signal, V(t), that is above the reaction threshold voltage, $V_{RTH}$, may be reached during a portion of the time interval, $t_{BR}$. Likewise, as the biasing signal, V(t), decreases at the end of the time interval, $t_{BH}$, a level of the biasing signal, V(t), that is above the reaction threshold voltage, $V_{RTH}$, may be maintained during a portion of the time interval, $t_{BF}$. Accordingly, in an ideal case where the voltage levels shown in FIG. 8A are effectively seen by the free electrons in the DC plasma, then the portions of the time intervals, $t_{BR}$ and $t_{BF}$, where the level of the biasing signal, V(t), is above the reaction threshold voltage, $V_{RTH}$, may be included in the determination (or interpretation) of the reaction rate, RR, graphs described above with reference to FIGS. 6A-6C. However, as the rising and falling edge slopes defined by the time intervals, $t_{BR}$ and $t_{BF}$, may be very steep (high level $V_B$ can be in a range from 10 volts to about 200 volts), said portions of time may be regarded as irrelevant/ insignificant when compared to a minimum amount of time required to hold the energized (free) electrons on the surface of the substrate to react with the targeted bonds.

Figure 8B:
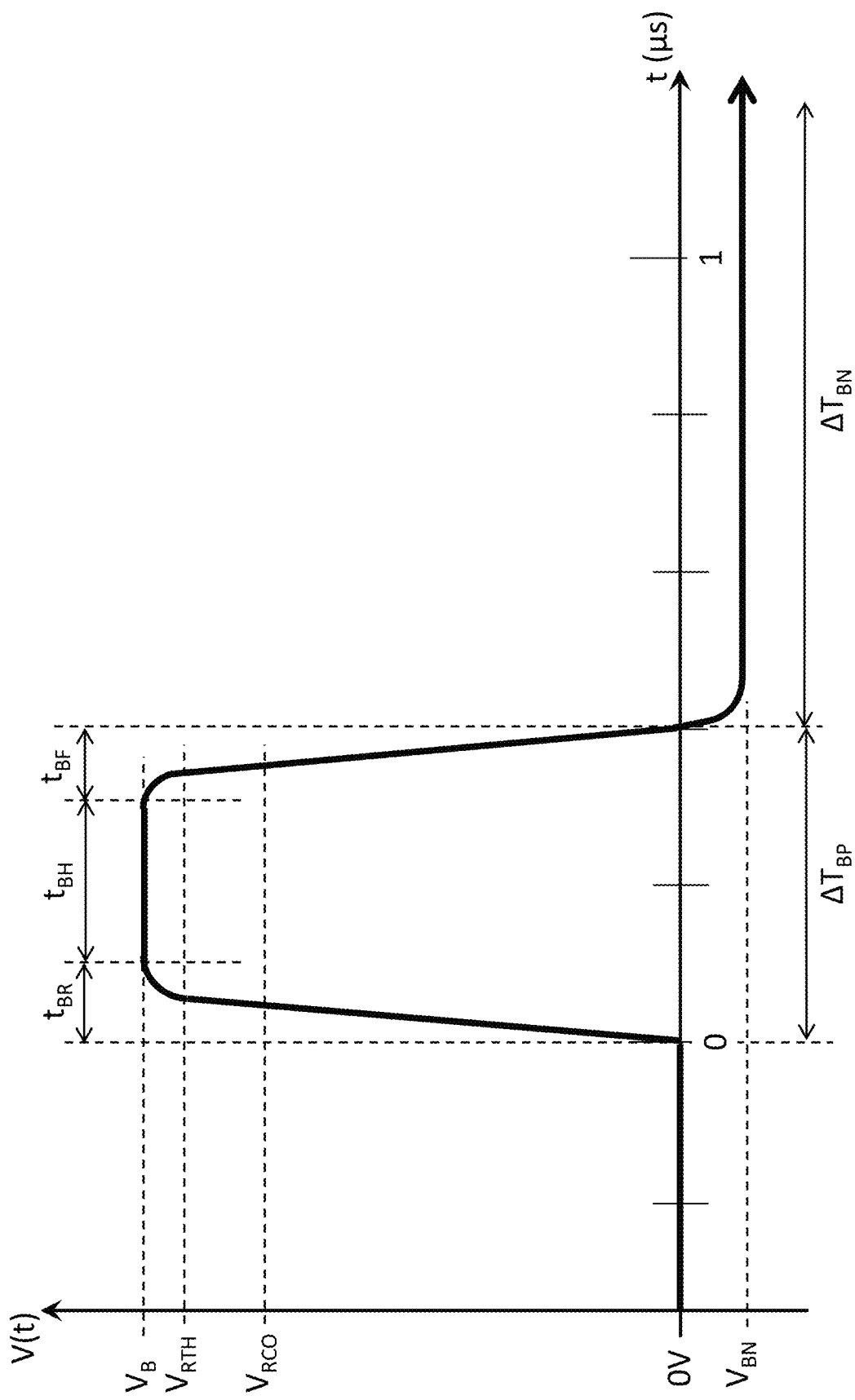
FIG. 8B shows a graph representative of a practical waveform for the EEMP biasing signals.

FIG. 8B shows a graph representative of a practical waveform for the EEMP biasing signals. Such waveform represents a practically achievable waveform that may be modelled from the ideal waveform described above with reference to FIG. 8A. In particular, the practical waveform of FIG. 8B includes gradual and curved transitions to/from corresponding steady state levels (e.g., $V_B$, $V_{BN}$, zero volts) as shown in the figure. Such practical waveform may be generated by an electronic instrument, that may include a power amplifier (e.g., such as for example, coupled to or part of, the biasing signal generator of FIG. 4A), whose output is coupled to a load under perfect matching conditions. However, such perfect matching conditions may not be provided by the capacitive load (e.g., stage S of FIG. 4A) in the DC plasma processing according to the present disclosure, and therefore, as shown in FIG. 8C, signal reflections and related distortions may be expected, including ringing, prior to settling to the steady state levels (e.g., $V_B$, $V_{BN}$, zero volts).

Figure 8C:
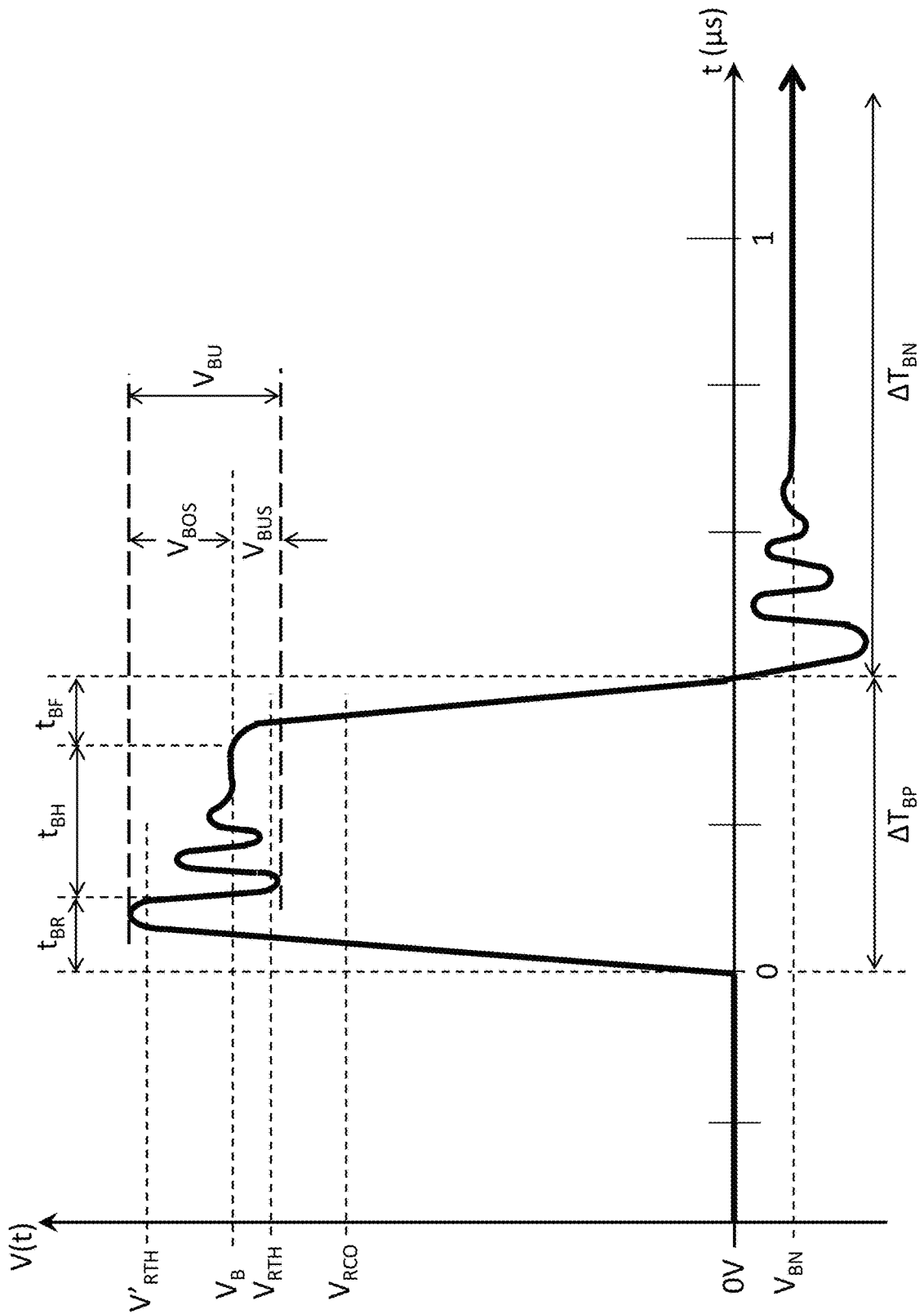
FIG. 8C shows a graph representative of an analog waveform under capacitive loading conditions.

The ringing shown in FIG. 8C may include ringing (e.g., $V_{BU}$) of the biasing signal, V(t), during the active phase, $\Delta T_{BP}$, prior to settling to the target high level, $V_B$, as well as during the neutralization phase, $\Delta T_{BN}$, prior to settling to the target low level, $V_{BN}$. As shown in FIG. 8C, the ringing during the active phase, $\Delta T_{BP}$, may be represented by an uncertainty voltage spread, $V_{BU}$, that extends above the target high level, $V_B$, by an overshoot voltage, $V_{BOS}$, and extends below the target high level, $V_B$, by an undershoot voltage, $V_{BUS}$. A person skilled in the art will clearly realize that the uncertainty voltage spread, $V_{BU}$, may perturb activation of the EEMP targeted reaction during the active phase, $\Delta T_{BP}$, as the undershoot voltage, $V_{BUS}$, may cause a level of the biasing signal, V(t), to fall below the reaction threshold voltage, $V_{RTH}$, and the overshoot voltage, $V_{BOS}$, may cause a level of the biasing signal, V(t), to reach a reaction threshold voltage, $V'_{RTH}$, of non-targeted bonds that may be present at the surface of the substrate. On the other hand, the ringing during the neutralization phase, $\Delta T_{BN}$, may not noticeably affect the EEMP process as the free ions are held well below the reaction energy for any ion driven reactions (e.g., thermal chemistry reactions). According to an embodiment of the present disclosure, a reduction of the ringing shown in FIG. 8C, including the ringing during the active phase, $\Delta T_{BP}$, may be provided by predistortion (e.g., distortion compensation) of the biasing signal, V(t).

Figure 9A:
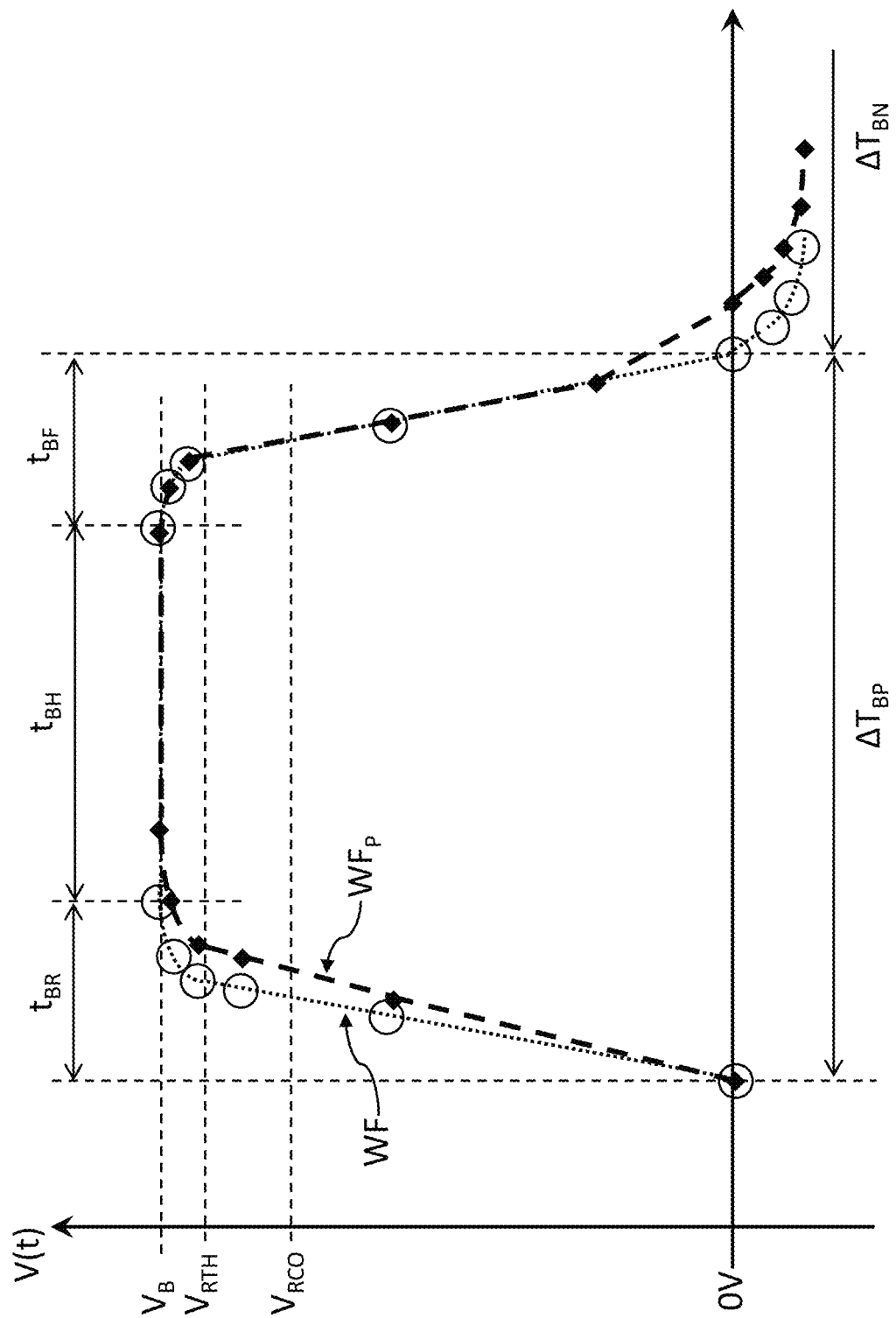
FIG. 9A shows graphs representative of a digitized waveform for generation of the practical waveform of FIG. 8B, and a corresponding digitized waveform with predistortion.

FIG. 9A shows graphs representative of a digitized waveform (WF, digital samples marked by circles) for generation of the practical waveform of FIG. 8B, and a corresponding digitized waveform with predistortion (WF$_P$, digital samples marked by squares). In particular, generation of the practical waveform of FIG. 8B may be provided by uploading corresponding digital samples of the digitized waveform, WF, to a digital signal generator whose output may be provided to a power amplifier (e.g., such as for example, coupled to or part of, the biasing signal generator of FIG. 4A). Likewise, generation of a corresponding practical waveform with predistortion may be provided by uploading the digital samples of the digitized waveform with predistortion, WF$_P$, to the digital signal generator.

Figure 9B:
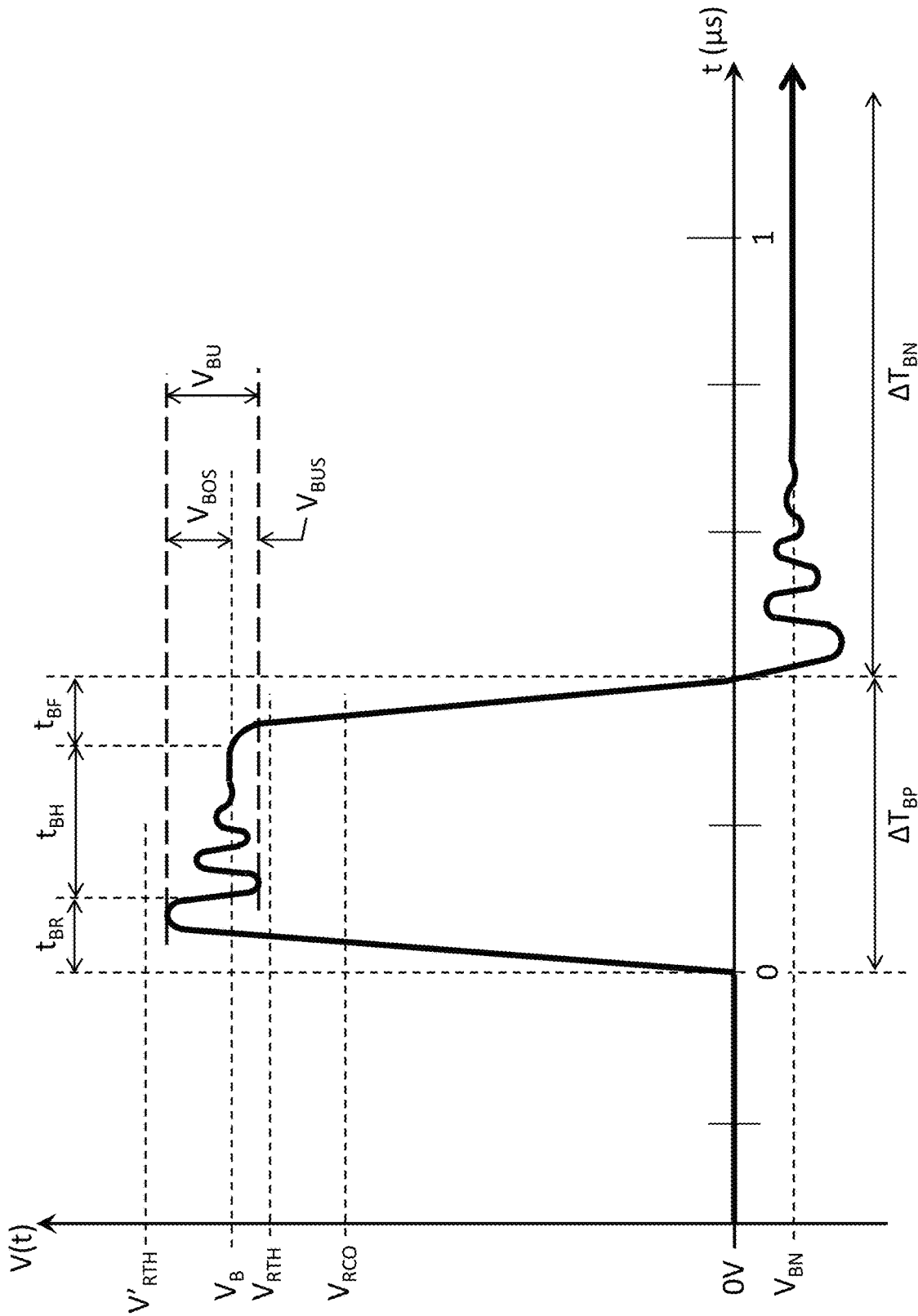
FIG. 9B shows a graph representative of an analog waveform generated from the digitized waveform with predistortion of FIG. 9A under capacitive loading conditions.

With continued reference to FIG. 9A, predistortion may be used to alter/equalize the slopes/transitions of the digitized waveform with predistortion, WF$_P$, such as to generate a practical pre-distorted waveform (e.g., WF$_P$) that when subjected to the capacitive loading conditions of the stage (e.g., S of FIG. 4A), as shown in FIG. 9B, a reduction in the amount of ringing may be provided. As shown in FIG. 9B, use of the predistortion may cause a reduction of the uncertainty voltage spread, $V_{BU}$, such as during the entire active phase, $\Delta T_{BP}$, a level of the biasing signal, V(t), may remain above the targeted reaction threshold voltage, $V_{RTH}$, and below any non-targeted reaction threshold voltage, $V'_{RTH}$. It should be noted that such predistortion may result in a waveform that includes a desired length of the time interval, $t_{BH}$, during which the biasing signal, V(t), is at the target high level, $V_B$. In other words, the predistortion may preserve the length of the time interval, $t_{BH}$, described above with reference to, for example, FIG. 8A.

Figure 10A:
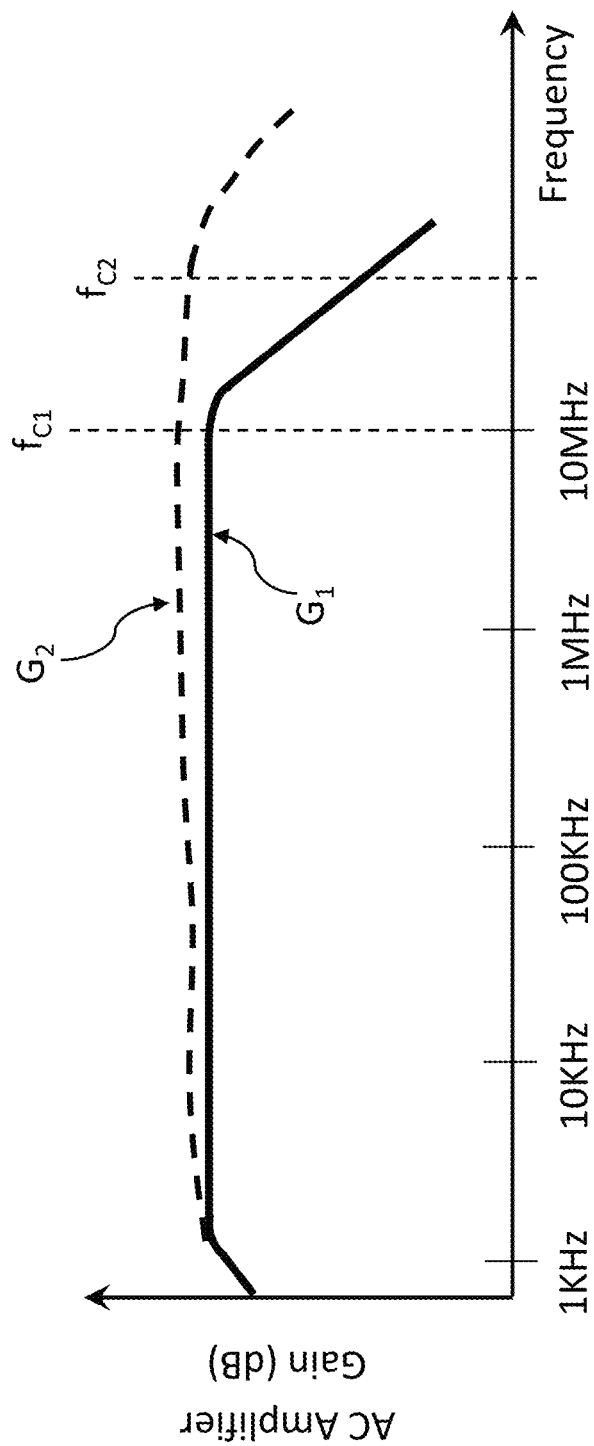
FIG. 10A shows graphs representative of gain versus frequency of a band-limited linear power amplifier according to an embodiment of the present disclosure and a gain versus frequency of a conventional power amplifier.

FIG. 10A shows graphs representative of gain versus frequency (e.g., graph $G_1$) of a band-limited linear power amplifier according to an embodiment of the present disclosure and a gain versus frequency (e.g., graph $G_2$) of a conventional power amplifier. According to an embodiment of the present disclosure, the bandlimited linear power amplifier used for the EEMP processing, may include a gain, $G_1$, that is flat within 0.75 dB in a frequency range from 10 KHz to 10 MHz as shown in FIG. 10A. Such operating (passband) range of the bandlimited linear power amplifier is selected in view of the 100 KHz to 1 MHz frequency range of operation of the biasing signal, V(t), such as to reduce any corresponding (higher frequency) harmonics that may be reflected from the capacitive load and generate distortion of the signal, including portion of the ringing (e.g., the uncertainty voltage spread, $V_{BU}$) shown in FIG. 8C and FIG. 9B.

Figure 10B:
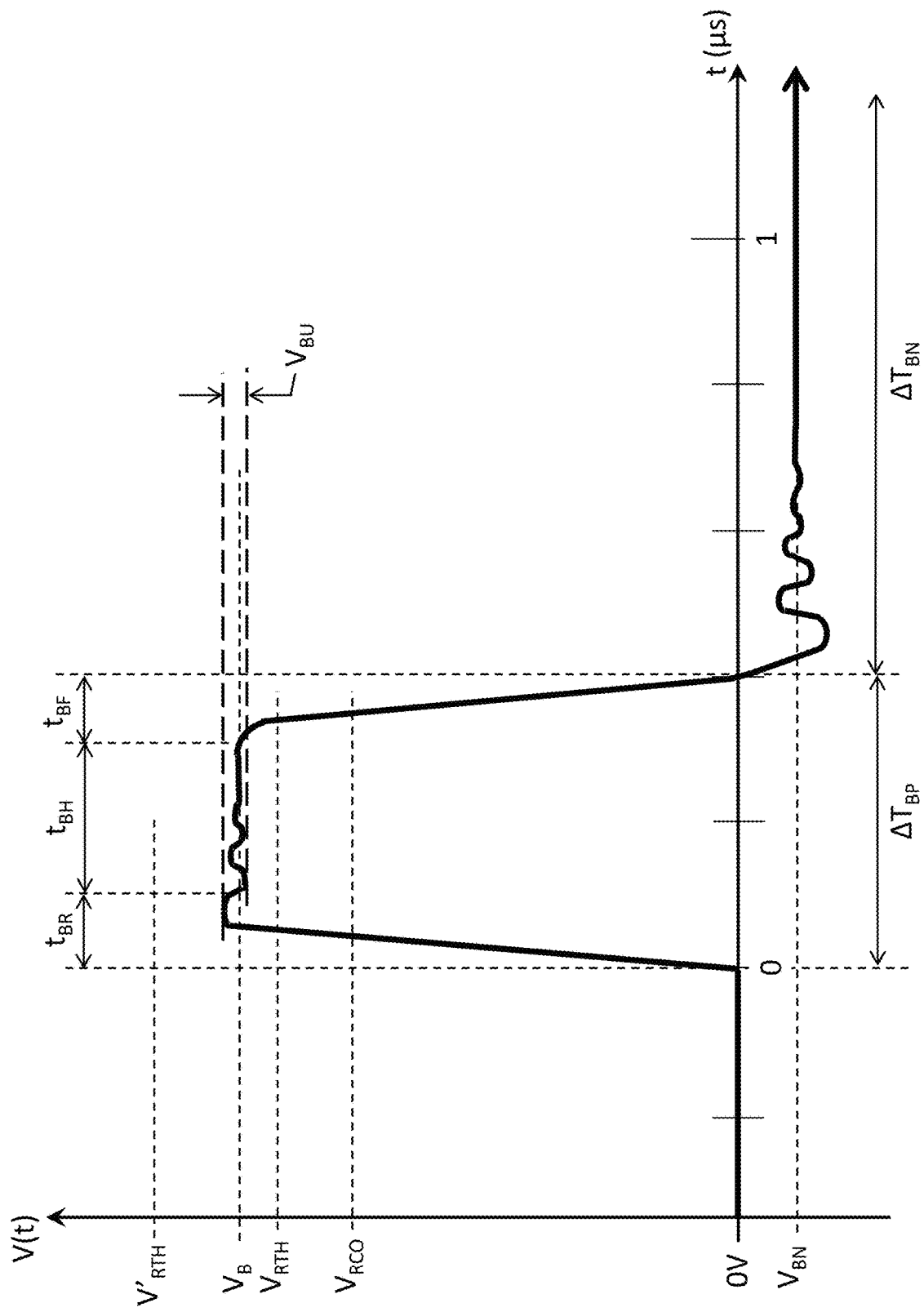
FIG. 10B shows a graph representative of an analog waveform generated from the digitized waveform with predistortion of FIG. 9A through the band-limited linear power amplifier of FIG. 10A under capacitive loading conditions.

FIG. 10B shows a graph representative of an analog waveform generated from the digitized waveform with predistortion, WF$_P$, of FIG. 9A through the band-limited linear power amplifier of FIG. 10A under capacitive loading conditions. In particular, when compared to the waveform described above with reference to FIG. 9B, a reduction in the uncertainty voltage spread, $V_{BU}$, may be observed, indicative of an even larger process window for control/operation of the targeted EEMP reaction. It should be noted that the waveform of FIG. 9B may be reproduced by the conventional power amplifier whose gain versus frequency, $G_2$, is shown in FIG. 10A. In particular, as shown in FIG. 10A, a cut off frequency, $f_{C2}$, of the conventional power amplifier being substantially greater than a cut off frequency, $f_{C1}$, of the band-limited linear power amplifier according to the present teachings, may pass the higher frequency harmonics of the biasing signal, V(t), and therefore reproduce such harmonics as distortion.

Figure 11:
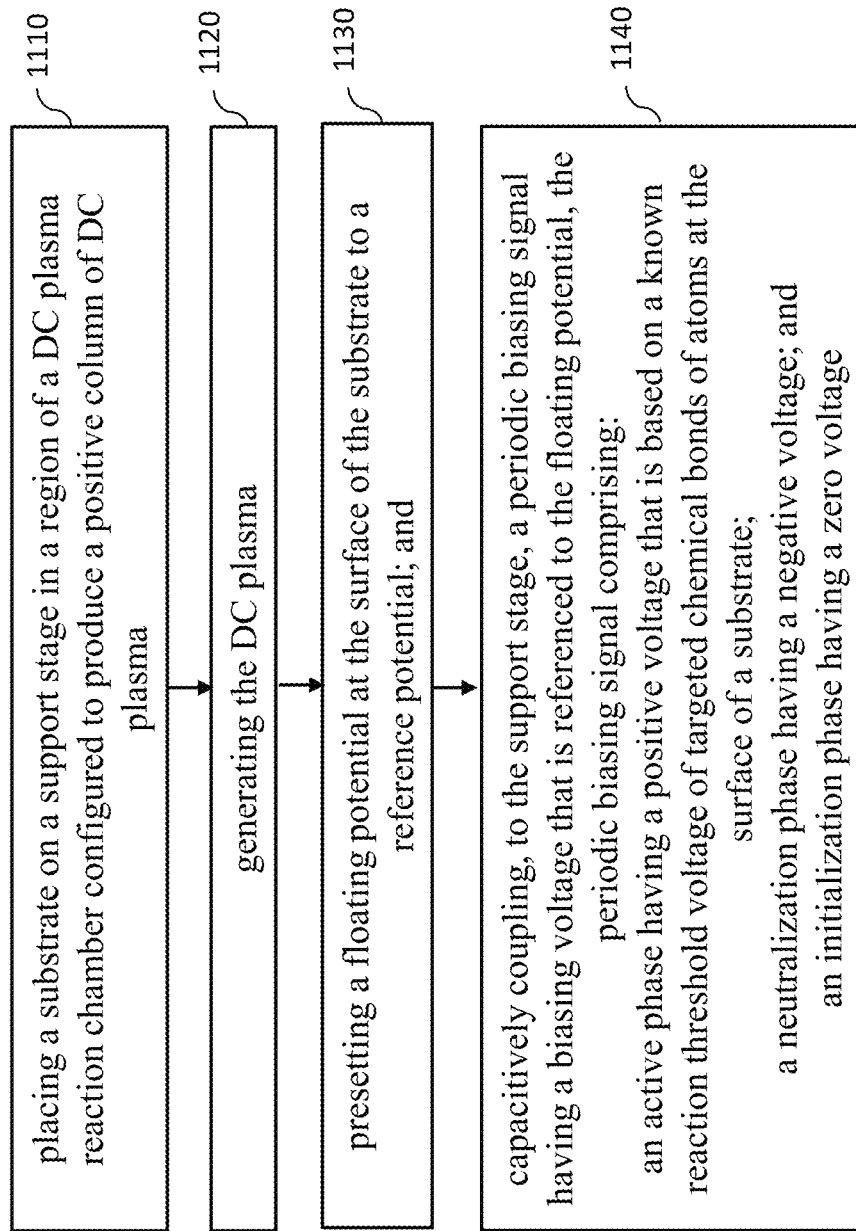
FIG. 11 is a process chart showing various steps of a method according to another embodiment of the present disclosure for processing a surface of a substrate.

FIG. 11 is a process chart (1100) showing various steps of a method according to an embodiment of the present disclosure for processing a surface of a substrate. As shown in FIG. 11, such steps comprise: placing a substrate on a support stage in a region of a DC plasma reaction chamber configured to produce a positive column of DC plasma, according to step (1110); generating the DC plasma, according to step (1120); presetting a floating potential at the surface of the substrate to a reference potential, according to step (1130), and; capacitively coupling, to the support stage, a periodic biasing signal having a biasing voltage that is referenced to the floating potential, the periodic biasing signal comprising: an active phase having a positive voltage that is based on a known reaction threshold voltage of targeted chemical bonds of atoms at the surface of a substrate; a neutralization phase having a negative voltage; and an initialization phase having a zero voltage, according to step (1140).

The various steps of the process chart (1100) of FIG. 11 may be used for atomic layer etching (ALE) of a surface of a substrate. Because such steps may target chemical bonds of atoms at the surface of the substrate via low energy electrons (e.g., energy less than 500 eV), surface damage of the substrate beyond those associated with the target chemical bonds may be avoided. The atomic layer etching according to the present disclosure may be based on electron stimulated desorption (ESD), wherein desorption processes are stimulated by electron excitation of quantum transitions (e.g., jump of energy levels) at the surface of the substrate (e.g., wafer), and controlled by material-specific energy thresholds. ESD proceeds by a fundamentally different mechanism than the (traditional) sub-surface collision cascades initiated by momentum transfer from ion bombardment. These material-specific energy thresholds provide the opportunity to tailor/target the electron energy to particular materials, thereby allowing the atomic layer etching according to the present disclosure to achieve high specificity and selectivity between different materials.

Low energy electrons (e.g., less than 500 eV), including those part of the wafer scale waves of precisely controlled electrons produced according to the present teachings, can interact with the surface of the substrate placed in, for example, the DC plasma reaction chamber (110) of the DC plasma processing system described above with reference to, for example, FIG. 4A. These electrons can induce physical and chemical changes to the surface of the substrate.

The atomic layer etching according to the present disclosure includes use of an adsorbed layer on the surface of the substrate to be etched. The adsorbed layer is composed of the reactive species present in the plasma. The creation of the adsorbed layer is purely chemical in nature and may include weak and strong bonding interactions with reactive species and the substrate. Reactive species may include H atoms (radicals), H+, H−, $H_2$, $H_{2+}$ and $H_{2-}$ (which are defined as the reactive species in this example, H-species). Presence of the adsorbed layer may promote more pronounced physical and chemical changes to the surface of the substrate. The reactive (adsorbed) layer attached to the surface layer below it is defined as the corrosion layer. Conditions created inside the DC plasma reaction chamber (e.g., 110 of FIG. 4A) in combination with the low energy electrons arriving at a surface of the substrate can promote the desorption of the corrosion layer that is attached to the substrate as ionic, neutral atomic and/or molecular species (e.g., desorption or removal of a corrosion layer).

The above-described process for removal of the corrosion layer (the adsorbed layer along with the surface atom layer below it) using low energy electrons, which may be used in the atomic layer etching (ALE) according to the present disclosure, is referred herein as Electron Stimulated Desorption (ESD). This effect arises from electron excitations, and not from thermal excitations that may arise from bombardment (momentum transfer) by the low energy electrons. It should be noted that momentum transfer from low energy electrons may not provide enough energy to desorb the corrosion layer (the surface species that includes the reactive species bound to the surface atom layer of the substrate, the corrosion layer). Since the mass of the electron is very small compared to the corrosion layer species (surface bound atoms and surface reactive species) it collides with, there is very little energy transfer to the surface bound atom by collision (typically less than 0.1 eV), which is not sufficient to cause removal of the reactive species which may include bonds in a range of about 1 eV to 8 eV. However, electron excitations may have sufficient energy to cause desorption of the (targeted) corrosion layer via ESD.

It should be noted that the EEMP process according to the present teachings is distinctly different than known in the art electron-beam-based processes and ion-bombardment processes (e.g., RIE). The EEMP process according to the present disclosure and electron-beam-based processes differ, though both can utilize ESD for the removal of corrosion layer species, the difference lies on the scale on which the two operate. Such beam techniques are highly localized to the millimeter scale at best. In stark contrast, and advantageously, the EEMP process according to the present disclosure can operate on any scale the positive column of a DC plasma can occupy, or made to occupy, including in a range (of width) from millimeters to meters. The EEMP process according to the present teachings and ion-bombardment processes differ in their fundamental mechanism of operation. The EEMP process according to the present teachings operates via ESD. In ESD, arriving electron raise the bond energies of only the corrosion layer species through resonant excitation and destabilizing the corrosion layer species only (no momentum transfer is involved). The corrosion layer species develop a repulsion relative to the underlying substrate (excited state). This results in only the corrosion layer species being repelled (removed) from the substrate with kinetic energy to subsequently enter the positive column (and be swept away). Known in the art Ion bombardment processes, due to the large mass of the ion, impart a momentum transfer to the corrosion layer species via collisions causing a sub-surface collision cascade. At sufficient momentum, this sub-surface collision cascade can eject the corrosion layer species. Basically, these sub-surface momentum cascades invariably leave traces/effects of the removal of the surface layer exist in the newly exposed layer (sub-surface). Interaction from ion-enhanced processes with the sub-surface are undesirable for a smooth finish, maintenance of stoichiometry, ions embedding in the substrate, and collision damage, among others, are negative outcomes that do not exist with EEMP.

Electron excitations may result when the electrons arriving at the surface transfer their energy to the bonding electrons of the corrosion layer species, raising their bond energies (resonant excitation of the bonding electron by the arriving electrons), and destabilizing the corrosion layer species on the surface. In this case, the excited corrosion layer species, may move from their stable ground state electron configuration to an excited state configuration that may have a repulsive potential. In turn, an imparted kinetic energy by such repulsive potential upon corrosion layer species may promote their ejection away from the surface of the substrate, thereby completing removal/etching of a top layer of the substrate. As mentioned previously, these ejection thresholds are material dependent so by tuning the energy of the incoming electrons and providing a variety of reactive species, ESD can be affected to a wide range of materials with high specificity and selectivity.

Atomic layer etching (ALE) by the electron enhanced material processing (EEMP) according to the present disclosure includes: provision of a substance to be adsorbed by atoms of a top surface atom layer of a substrate to be etched to generate corrosion layer species at the surface of the substrate; generate electrons with energy that targets chemical bonds of the corrosion layer species; and use electron stimulated desorption (ESD) processes to excite the corrosion layer species, thereby ejecting/releasing the corrosion layer species, thereby etching away the top surface atom layer of the substrate.

Figure 12A:
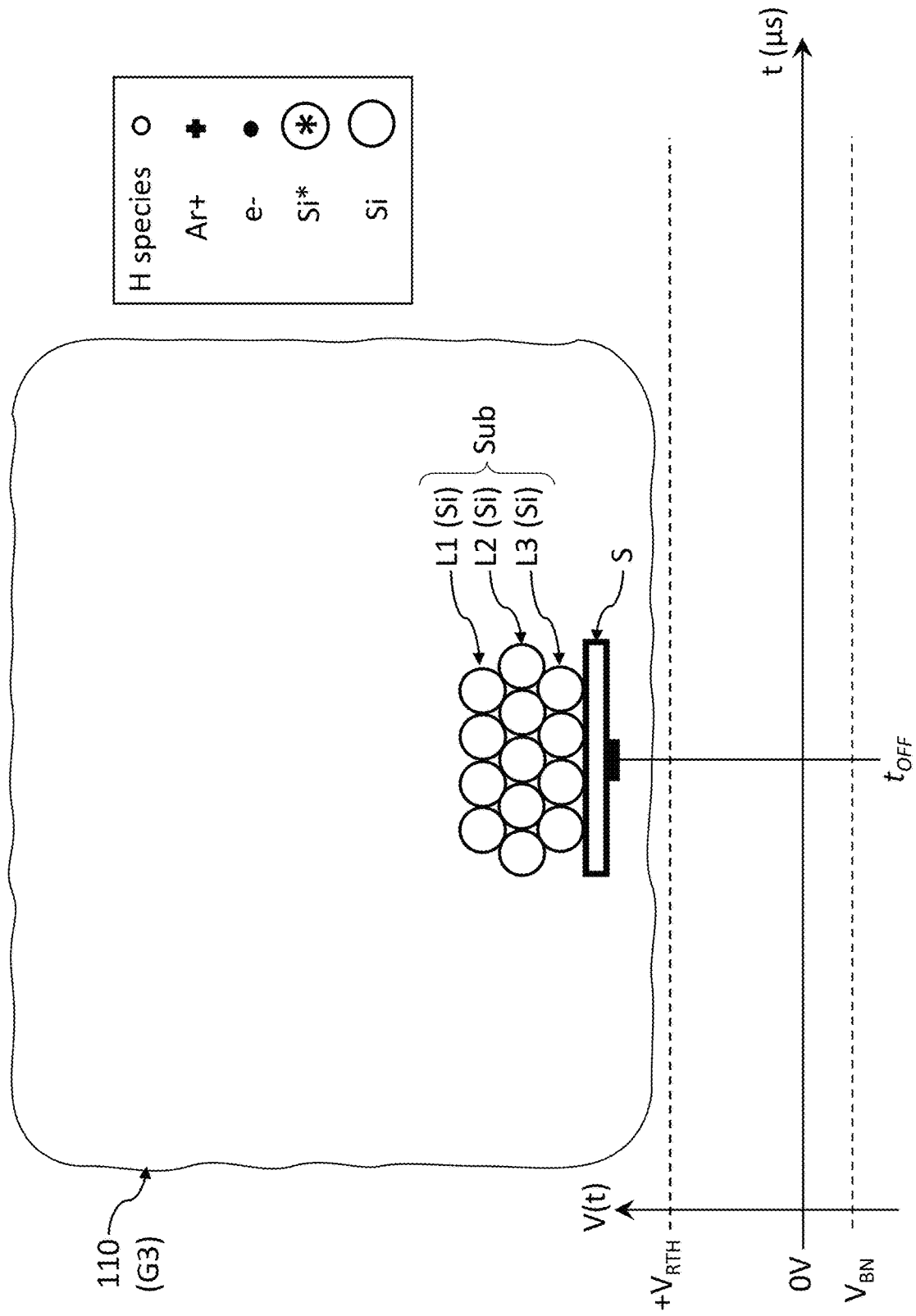
FIG. 12A, FIG. 12B and FIG. 12C show various schematics representative of initialization tasks and corresponding states of a DC plasma reaction chamber in preparation for an atomic layer etching (ALE) of a surface of a substrate via the electron enhanced material processing (EEMP) according to the present disclosure.
Figure 12B:
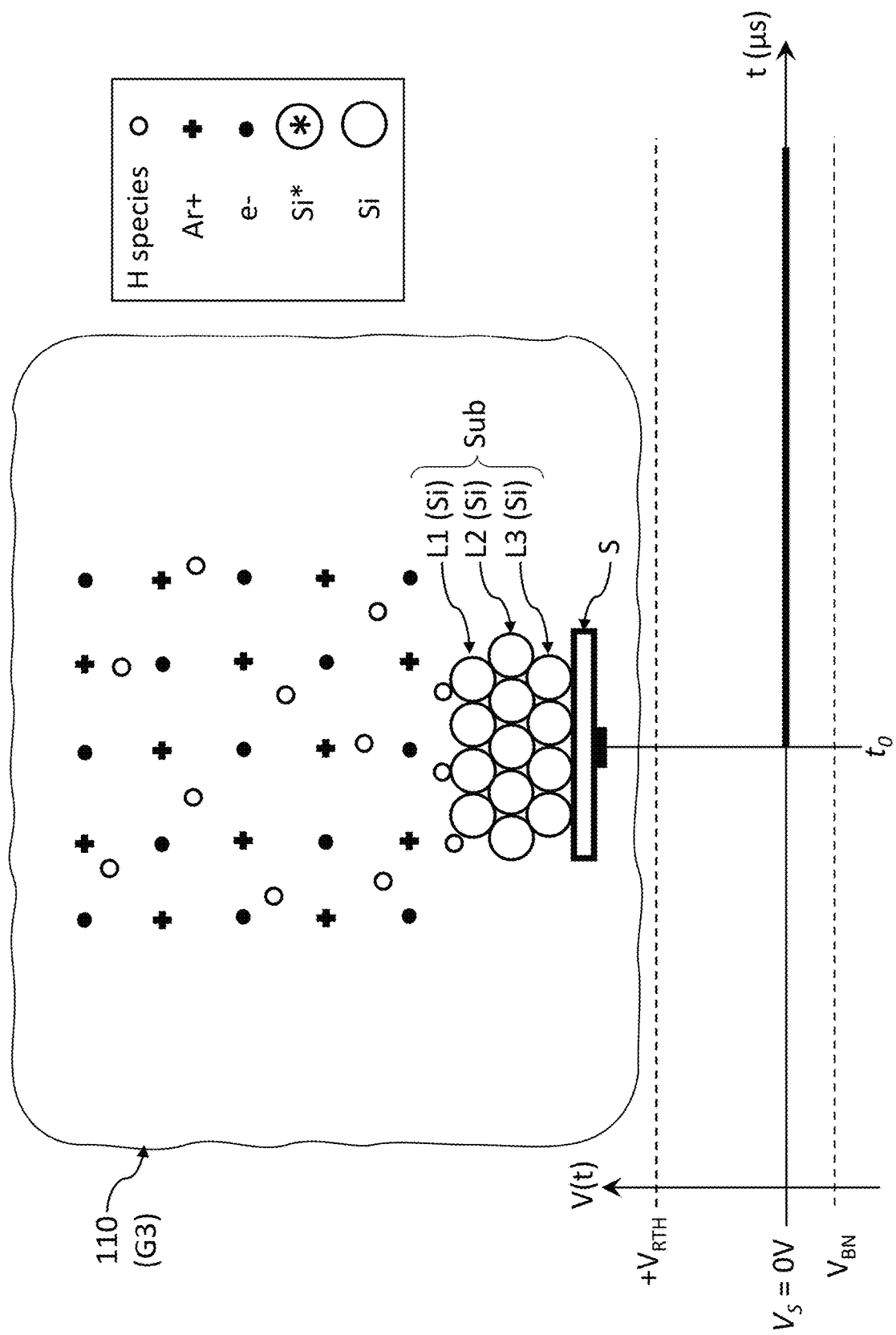
Figure 12C:
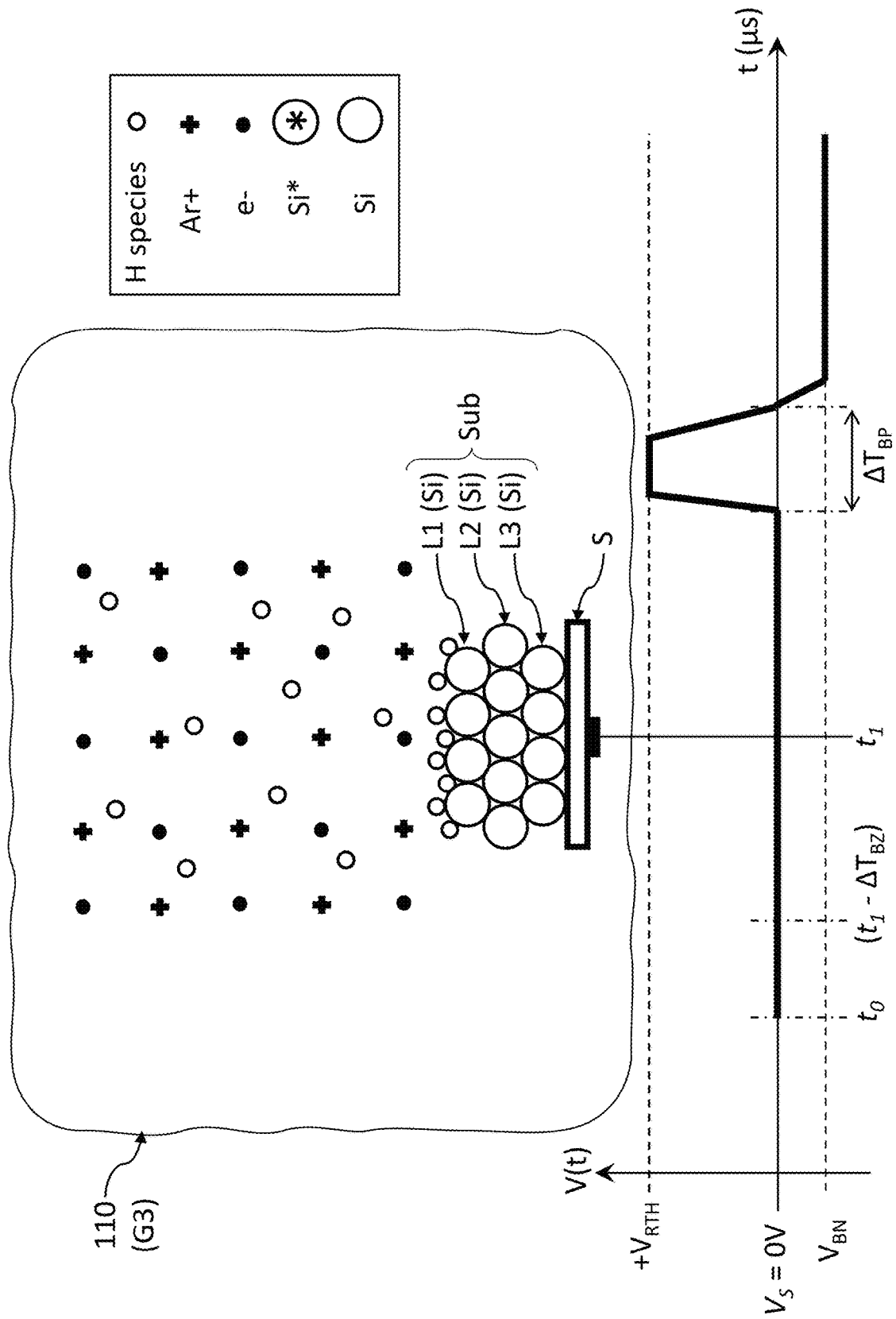

FIG. 12A, FIG. 12B and FIG. 12C show various schematics representative of initialization tasks and corresponding states of a DC plasma reaction chamber (e.g., 110 of FIG. 4A) in preparation for an atomic layer etching (ALE) of a surface of a substrate, Sub, via the electron enhanced material processing (EEMP) according to the present disclosure.

As shown in FIG. 12A, and with further reference to FIG. 4A, the substrate, Sub, is placed on the stage, S, that as previously described is arranged in a region of the DC plasma reaction chamber (110) that is configured to contain the positive column region, G3. In FIG. 12A (and following figures), the substrate, Sub, is represented by atomic layers (L1, L2, L3), each such layer including atoms of a material that makes up the substrate, Sub. In the exemplary nonlimiting case of the substrate, Sub, shown in FIG. 12A, three layers (L1, L2, L3) are shown, each layer including atoms, represented by (large) circles. In the exemplary nonlimiting case of the substrate, Sub, shown in FIG. 12A, each of the layers (L1, L2, L3) includes silicon atoms, Si, or in other words, the exemplary nonlimiting substrate, Sub, may be considered a silicon substrate. As previously described in the present disclosure, the electron enhanced material processing (EEMP) according to the present disclosure, including its application to atomic layer etching (ALE), may be applicable to different categories/types/classes of materials, and therefore to different substrates including such materials. In other words, the substrate, Sub, may include any of such materials in any one of the layers (e.g., L1, L2, L3, . . . , and beyond). Furthermore, any two such layers may include a same material (i.e., atoms) or different materials (e.g., in adjacent atomic layers).

Legends in the top right side of FIG. 12A (and following figures) are associated with symbols used in the figure, the symbols representative of material particles, such as atoms, ions or molecules, that may be present in the plasma reaction chamber (110) during various states/phases of the processing of the substrate, Sub. Such material particles correspond to: a reactant (e.g., soluble) gas, represented by a small circle; a diluent (e.g., solvent) gas represented by a cross; an electron (with legend e−) represented by a dot; an excited state substrate atom of the substrate, Sub, represented by a large circle containing an asterisk; and a ground state atom of the substrate, Sub, represented by a large (empty) circle. Legends associated with such symbols refer to exemplary nonlimiting material particles corresponding to: an exemplary reactant gas that may include hydrogen (H atom, e.g., molecular hydrogen $H_2$); exemplary diluent gas that may include argon (Ar+); and an exemplary substrate, Sub, that may include excited state (Si*) and ground state (Si) silicon atoms (e.g., atom bonds).

As shown in FIG. 12A, the silicon substrate, Sub, is placed onto the stage, S, in preparation for the atomic layer etching (ALE) process. In this case, the plasma reaction chamber (110), and therefore the stage, S, and the substrate, Sub, may be under vacuum provided by means that are well known in the art. Other parameters within the plasma reaction chamber that may affect the substrate, Sub, such as for example, temperature (e.g., including of the stage/substrate), may also be set/controlled. Furthermore, absence of any of the material particles (H-species, Ar+, e−, Si*) in FIG. 12A is indicative that DC plasma, and therefore excited state silicon atoms, are not present in the plasma reaction chamber (110).

FIG. 12A may represent a state of the atomic layer etching process (ALE) at a time, $t_{OFF}$, wherein the stage, S, and therefore the substrate, Sub, is not actively biased by the biasing signal generator (e.g., 480 of FIG. 4A). Accordingly, as shown in FIG. 12A, at the time, $t_{OFF}$, there is no biasing signal, V(t), coupled to the stage, S, and therefore to the substrate, Sub. As described above in the present disclosure, the biasing signal, V(t), may represent a time varying biasing voltage (e.g., $V_B$ of FIG. 4A), that is capacitively coupled to the stage, S. Exemplary waveforms of the biasing signal, V(t), including corresponding voltage levels (e.g., $V_{RTH}$ and $V_{BN}$) and phases (e.g., $\Delta T_{BP}$, $\Delta T_{BN}$, and $\Delta T_{BZ}$), are described above with reference to, for example, FIGS. 7-10.

FIG. 12B may represent a state of the atomic layer etching process (ALE) at a time, $t_0$, wherein diluent gas (e.g., argon) and reactant gas (e.g., hydrogen) is present in the plasma reaction chamber (110) to generate the (positive column, e.g., at glow region G3) DC plasma. When the DC plasma is generated (e.g., ignited), a portion of the diluent gas and a portion (and not all of the) reactant gas is ionized to generate some the free electrons, e−, shown in FIG. 12B. As a result, a distribution of ionic species in the positive column of the DC plasma may include ions of the diluent gas represented in FIG. 12B by Ar+, as well as particles of the reactant gas that may include H-species as represented in FIG. 12B and subsequent figures.

It should be noted that diluent and reactant gases may be introduced in the plasma reaction chamber (110) either concurrently as a mixture or separately in sequence, and therefore such gases may ionize/ignite within the plasma reaction chamber either concurrently or separately. Furthermore, according to some exemplary embodiments, reactive species (e.g., H-species) may be generated in a separate chamber and subsequently introduced in the plasma reaction chamber (110) to provide the distribution of ionic species shown in FIG. 12B. Furthermore, it should be noted that majority of the free electrons, e−, shown in FIG. 12B may correspond to the current (e.g., Ip of FIG. 4A) that flows between the anode, A, and the cathode, C, of the plasma reaction chamber (110).

As described above in the present disclosure, the atomic layer etching (ALE) process according to the present disclosure may not be limited to argon as the diluent gas and hydrogen as the reactant gas. Some nonlimiting exemplary diluent gases may include any one of argon, Ar; neon, Ne; or xenon, Xe. Some nonlimiting exemplary reactant gases may include hydrogen, $H_2$; chlorine, $Cl_2$; methane, $CH_4$; carbon monoxide, CO; oxygen, $O_2$, or other, either individually or in combination. Furthermore, according to an embodiment of the present disclosure, a ratio of the reactant gas to the diluent gas used (prior to plasma ignition) in the atomic layer etching (ALE) process according to the present disclosure may be in a range from about 2/100 to about 50/100 or greater.

As described above in the present disclosure, during the atomic layer etching (ALE) process according to the present teachings, a portion (e.g., from about a few percent to about a hundred percent, e.g., full ionization) of the reactant gas introduced into the chamber (110) may be ionized to generate reactive species (e.g., H-species). Such ionized portion of the reactant gas, as well as a distribution of corresponding reactive species, or in other words relative number of H-species, for the exemplary case of hydrogen, may be controlled via process parameters, including, for example, (magnitude of) the current, Ip, described above with reference to, for example, FIG. 4A. it should be noted that although in the present description of the atomic layer etching (ALE) process, the H-species of the ionized reactant gas are being considered (e.g., in the formation of an adsorbed layer), other constituents of the ionized reactant gas (e.g., reactive species), including for example, H+ and/or H− for the exemplary case of hydrogen, may be used instead to provide different etching performances, including, for example, selectivity with respect to a target material/atom and/or substrate surface finish/smoothness.

As described above with reference to, for example, FIG. 1C, in view of the distribution of the ionic species shown in FIG. 12B that are indicative of presence of the DC plasma, and therefore of a corresponding plasma potential, $V_{PP}$, in the positive column of the DC plasma, a (surface) floating potential, $V_{FP}$, may develop at the stage, S, and therefore at the surface of the substrate, Sub, of FIG. 12B. As described above with reference to, for example, FIG. 5, the floating potential, $V_{FP}$, may be adjusted to a known reference potential, such as the reference ground potential of the DC plasma processing system (e.g., FIG. 4A) used in the present atomic layer process. It should be noted that adjustment of the floating potential, $V_{FP}$, may be provided after the distribution of the ionic species in the DC plasma reaction chamber (110) has stabilized (e.g., reached a steady state or equilibrium) and before application of a biasing voltage to the state, S.

As shown in FIG. 12B at the time, $t_0$, the stage, S, and therefore the substrate, Sub, may be actively biased (e.g., the stage voltage, $V_S$, is shown in FIG. 12B as the intersection of the stage S with the biasing signal V(t) represented by a thick voltage line, such as $V_S$=0V) by the biasing signal generator (e.g., 480 of FIG. 4A). In other words, at the time, $t_0$, the biasing signal generator (e.g., 480 of FIG. 4A) may bias the stage, S, and therefore the substrate, Sub, with a voltage provided by the biasing signal, V(t), coupled to the stage, S, and therefore to the substrate, Sub. Because the biasing signal, V(t), may be referenced to the same reference ground potential to which the floating potential, $V_{FP}$, is adjusted, coupling of the biasing signal, V(t), having as shown in FIG. 12B an amplitude of zero volts (0V) at the time, $t_0$, to the stage, S, and therefore the substrate, Sub, may not substantially alter or influence the distribution of ionic species provided in the positive column of the DC plasma.

With continued reference to FIG. 12B, some of the reactive species (e.g., H-species) can be seen bound (i.e., adsorbed) to atoms (e.g., Si) of the (top) surface layer, L1, of the substrate, Sub. In other words, FIG. 12B shows (start of the) forming of an adsorbed layer (e.g., shown in FIG. 12B as three individual H-species bound to the layer L1) of the reactive species being on the surface layer, L1. The combination of the adsorbed reactive species to the surface layer, L1, may be referred to as a corrosion layer that will be removed by electron stimulated desorption (ESD) to effectively complete etching away of an atomic layer (e.g., L1) of the substrate, Sub.

Forming of the corrosion layer may be gradual (yet quick) and based on parameters seen at the location of the stage, S. These may include temperature of the stage, S; pressure in the DC plasma reaction chamber (110); current (e.g., Ip of FIG. 4A) that flows between the anode, A, and the cathode, C, of the plasma reaction chamber (110); and/or flow rate of the DC plasma that may determine resident time of the reactive species (e.g., H-species) in contact with the surface (e.g., layer L1) of the substrate, Sub. In order to etch away the entirety of the surface layer, L1, of the substrate, Sub, each of the atoms (e.g., Si) of the surface layer, L1, may include at least one adsorbed reactive species. This is shown in FIG. 12C.

FIG. 12C may represent a state of the atomic layer etching (ALE) process at a time, wherein the corrosion layer is formed. In other words, as shown in FIG. 12C, each of the atoms (e.g., Si) of the surface layer, L1, includes (e.g., is adhered to) by at least one adsorbed reactive species (e.g., H-species, forming corrosion layer species comprising any one or more of $SiH_1$, $SiH_2$ or $SiH_3$ species). It should be noted that a time for the formation of the corrosion layer for the atomic layer etching (ALE) process according to the present teachings is relatively quick and on the order of few microseconds (μs) to about ten microseconds. Such quick formation of the corrosion layer may be mainly attributed to the turning on and continuous presence (e.g., not switched on and off) of the reactive species (e.g., H-species) in the whole of the plasma for the (entirety of the) duration of the atomic layer etching process. This is shown in FIG. 12C with reference to the (initialization) phase, $\Delta T_{BZ}$, previously described with reference to, for example, FIGS. 7A/7B/7C.

Assuming that the time, $t_0$, shown in FIG. 12C, corresponds to a start time for the formation of the corrosion layer, then a time period between the time, $t_0$, and the time, $t_1$, at which the corrosion layer is formed, is equal to at least the duration of the (initialization) phase, $\Delta T_{BZ}$. Once the corrosion layer is formed (e.g., at time $t_1$), the substrate, Sub, is ready for an active phase of the atomic layer etching (ALE) process according to the present disclosure, including electron stimulated desorption (ESD) of the corrosion layer by ESD mechanism. This is represented in FIG. 12C by an upcoming phase, $\Delta T_{BP}$, of the biasing signal, V(t) (e.g., part of the cycle $T_{EEMP}$ described above with reference to, for example, FIGS. 7A/7B/7C).

FIG. 13A, FIG. 13B, FIG. 13C, FIG. 13D and FIG. 13E show various schematics representative of states of the DC plasma reaction chamber (110) during an active phase of the atomic layer etching (ALE) according to the present disclosure. In other words, during such active phase, the stage, S, may be biased at a voltage, $V_S$, that corresponds to a positive pulse of the active phase, $\Delta T_{BP}$, of the cycle, $T_{EEMP}$, of the (waveform of the) biasing signal, V(t), described above with reference to, for example, FIGS. 7A/7B/7C. Such states may include states of the active phase, $\Delta T_{BP}$, during the rise and fall times/edges (e.g., $t_{BR}$ and $t_{BF}$ of FIGS. 8A/B/C and FIGS. 9A/B) of the positive pulse, as well as during the high level (e.g., $t_{BH}$ of FIGS. 8A/B/C and FIGS. 9A/B) of the positive pulse provided by a (high) positive volage that corresponds to a target reaction threshold voltage, $V_{RTH}$.

Figure 13A:
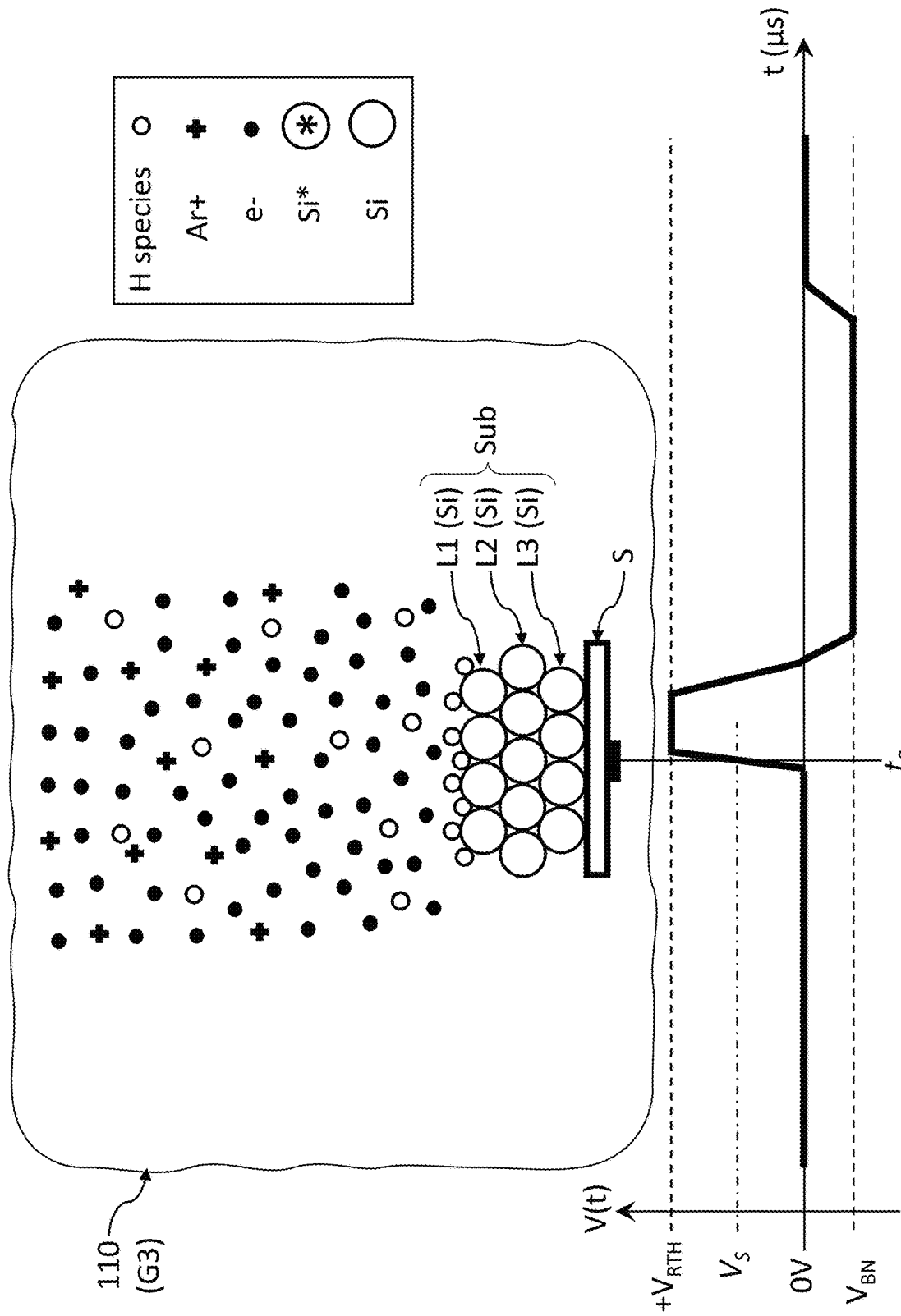
FIG. 13A, FIG. 13B, FIG. 13C, FIG. 13D and FIG. 13E show various schematics representative of states of the DC plasma reaction chamber during an active phase of the atomic layer etching (ALE) according to the present disclosure.

FIG. 13A may represent a state of the atomic layer etching (ALE) process at a time, $t_2$, wherein the corrosion layer is formed (e.g., per FIG. 12C) and the stage voltage, $V_S$, follows (or starts to follow) the rising edge of the positive pulse. In this case, the stage voltage, $V_S$, may be substantially smaller (e.g., half or less than half) the target reaction threshold voltage, $V_{RTH}$. However, because the stage voltage, $V_S$, and therefore the surface of the substrate, Sub, is now at a potential that is positive with respect to the floating potential, $V_{FP}$, as shown in FIG. 13A some of the (negatively charged) free electrons, e−, are attracted to the stage, S, and therefore travel towards the surface of the substrate, Sub. On the other hand, because the ions (Ar+) of the diluent gas have a mass that may be substantially greater than the mass of the free electrons, e−, then on a timescale of the entire positive pulse (e.g., $\Delta T_{BP}$ that is in the order of few microseconds, e.g., less than $_4$ μs), their spatial location may be considered as substantially constant as provided, for example, by the ionic distribution represented in FIG. 12C.

Figure 13B:
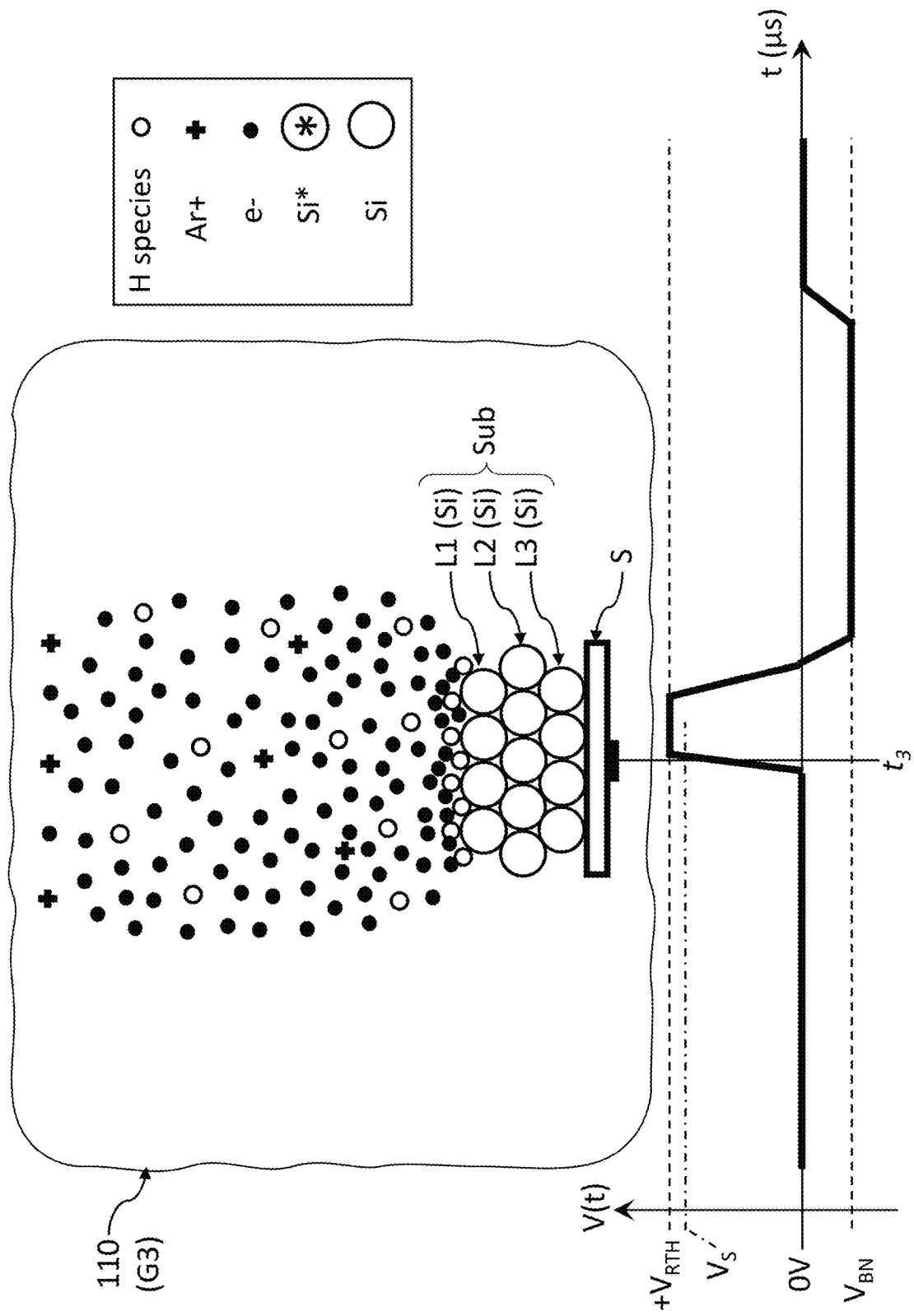

As the positive pulse, and therefore the stage voltage, $V_S$, increases, more of the free electrons, e−, are attracted to the surface of the substrate, Sub. This is shown in FIG. 13B, wherein at a time, $t_3$, the stage voltage, $V_S$, is closer to, but not equal to, the target reaction threshold voltage, $V_{RTH}$. In this case, the corrosion layer (i.e., adsorbed H-species to Si atoms of L1) formed at the surface of the substrate, Sub, may be in contact with electrons, e−, having an energy level that is close to, but not equal to, a target reaction energy level required for stimulation of electron transitions in the corrosion layer.

Figure 13C:
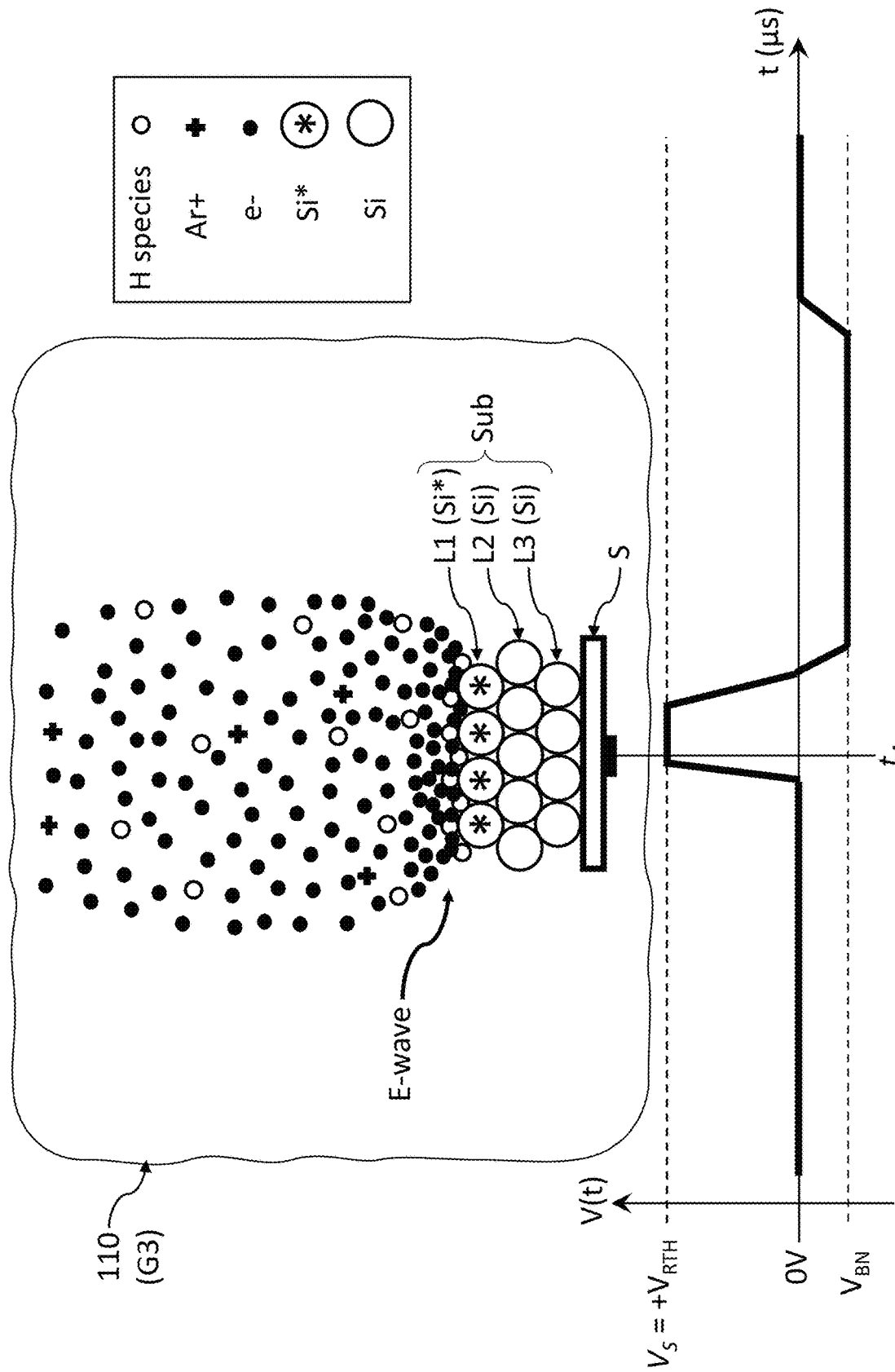

Once the positive pulse, and therefore the stage voltage, $V_S$, reaches the target reaction threshold voltage, $V_{RTH}$, electrons, e−, at the surface of the substrate, Sub, may have sufficient energy to stimulate electron transitions in the corrosion layer. This is shown in FIG. 13C, wherein at a time, $t_4$, the stage voltage, $V_S$, is equal to the target reaction threshold voltage, $V_{RTH}$, causing atoms (i.e., corrosion layer species) at the surface layer, L1, of the substrate, Sub, to reach their respective excited states (e.g., Si*, representing excited states of corrosion layer species $SiH_1$, $SiH_2$ or $SiH_3$). In other words, FIG. 13C shows the start of the electron stimulated desorption (ESD) process used in the atomic layer etching (ALE) of the present teachings (e.g., via arrival of a wafer-scale wavefront of electrons, E-wave, of uniform density and energy at the surface of the substrate). This E-wave can be smaller than the diameter of the substrate stage and scalable to the dimensions of the positive column. The targeted reaction threshold voltage, $V_{RTH}$, for the corrosion layer is distinctly different from the reaction threshold voltage for an un-corroded layer (e.g., L1 of FIG. 12A). The $V_{RTH}$ for corrosion layer species in the corrosion layer are similar. The $V_{RTH}$ for the ESD as used in the present ALE may be set to the highest $V_{RTH}$ value present in the corrosion layer therefore removing all species found in the corrosion layer. It should be noted that electron stimulation of a transition may be considered as quasi-instantaneous (e.g., a fraction of a microsecond) once a surface species becomes in contact with an electron, e−, at the target reaction energy level.

Figure 13D:
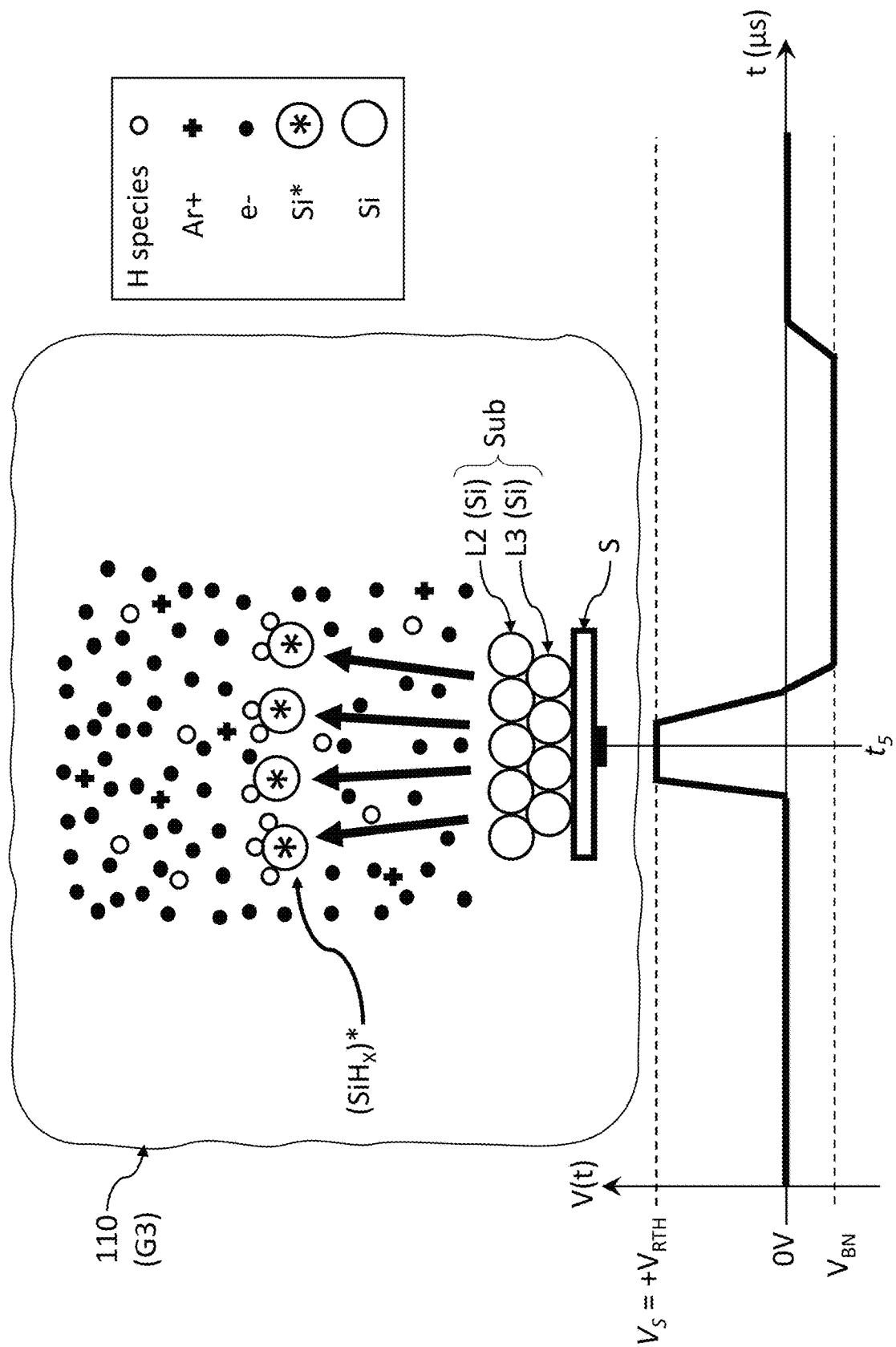

As shown in FIG. 13D, at a time, $t_5$, the stage voltage, $V_S$, is still equal to the target reaction threshold voltage, $V_{RTH}$, and as a result of the ESD process, the repulsive potential of the corrosion layer species in their respective excited states (e.g., Si* of FIG. 13C) may impart sufficient kinetic energy to the corrosion layer species to eject them from the surface of the substrate, Sub. This is represented in FIG. 13D by ejected corrosion layer species $(SiH_X)$* that is shown away/separate from the surface of the substrate, Sub, and therefore resulting in the disappearance of the surface layer L1 from the substrate, Sub. Accordingly, as shown in FIG. 13D, a top surface of the substrate, Sub, is now layer, L2, with former top surface, L1, being etched away. It should be noted that a timing for executing the sequence of the states of the atomic layer etching (ALE) process represented in FIG. 13C and 13D may be in the order of a fraction of a microsecond (μs) and not more than a few microseconds. For example, as described above with reference to FIG. 7A, considering a periodic biasing signal, V(t), having a frequency of 250 KHz, and therefore a length of the cycle, $T_{EEMP}$, equal to 4 μs, then the length of the time interval, $t_{BH}$, that corresponds to the amount of time the stage voltage, $V_S$, is equal to the target reaction threshold voltage, $V_{RTH}$, may be in a range from about 0.1 μs to about 0.3 μs.

Figure 13E:
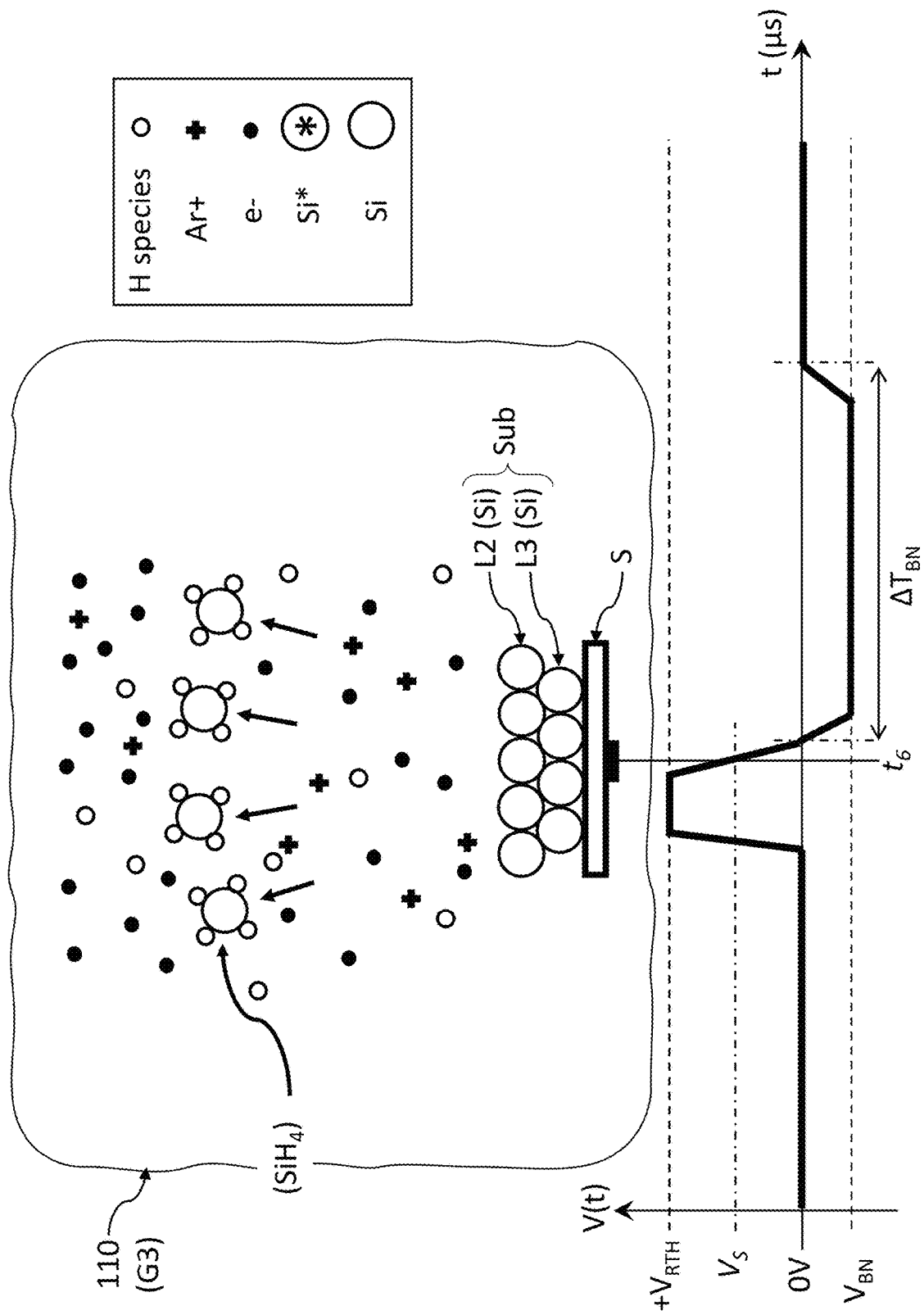

FIG. 13E may represent a state of the atomic layer etching (ALE) process at a time, $t_6$, wherein the corrosion layer is ejected (e.g., per FIG. 13D) and the stage voltage, $V_S$, follows (or starts to follow) the falling edge of the positive pulse. In this case, the stage voltage, $V_S$, may be smaller than the target reaction threshold voltage, $V_{RTH}$, but greater than zero volts. As shown in FIG. 13E, once the corrosion layer species are ejected, they may convert to neutral (e.g., gas) molecules (e.g., $SiH_4$) due to the presence of atoms and/or related species of the reactant gas (e.g., H-species) in a region of the DC plasma reaction chamber (110) surrounding the substrate, Sub. This in tun may allow removal of all residues/species of the etched away corrosion layer (e.g., $SiH_4$) by way of, for example, the preestablished flow rate of the dilution gas (e.g., Argon) inside of the DC plasma reaction chamber (110).

FIG. 13E may represent the final state of the DC plasma reaction chamber (110) during the active phase of the atomic layer etching (ALE) according to the present disclosure. As described above in the present disclosure, such active phase may be defined buy a positive pulse of the biasing signal V(t) having a duration in length that is equal to the active phase, $\Delta T_{BP}$, of the cycle, $T_{EEMP}$, of the (waveform of the) biasing signal, V(t), described above with reference to, for example, FIGS. 7A/7B/7C. Application of such positive pulse may allow removal of the corrosion layer with no ion bombardment (e.g., as does occur with traditional ALE processes), but rather via ESD mechanism initiated by transfer of energy from low energy electrons to excite species of the corrosion layer, resulting in substantially no heat being generated and no (unwanted) damage to the substrate structure (e.g., lattice).

As can be seen in FIGS. 13A/13B/13C/13D/13E, a distribution of the ionic species that surround the substrate, Sub, in the DC plasma reaction chamber (110) is perturbed by actively biasing the stage, S, with a stage voltage, $V_S$, that is greater than zero volts. In particular, electrons, e−, have traveled towards the surface of the substate, Sub, thereby resulting in a distribution of the ionic species that may be characterized as non-homogenous, or at least different from the steady state (e.g., equilibrium) distribution described above with reference to FIG. 12B. As shown in FIG. 13E, in order to restore the steady state distribution in the DC plasma reaction chamber (110), an upcoming negative biasing signal (e.g., $V(t)=V_{BN}$) may be applied to the stage, S, for a sufficiently long duration of time, $\Delta T_{BN}$.

Figure 14:
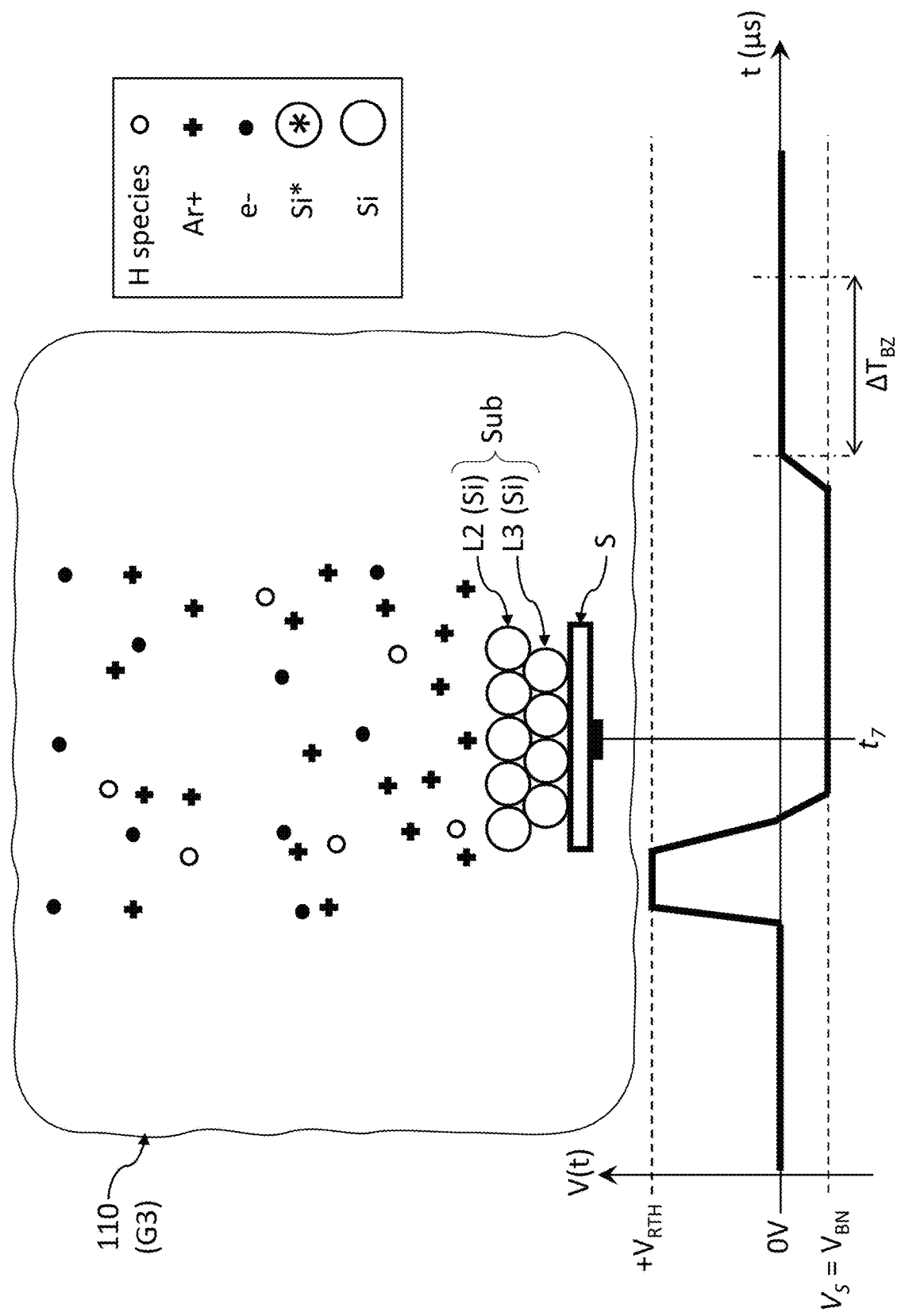
FIG. 14 shows a schematic representative of a state of the DC plasma reaction chamber during a neutralization phase of the atomic layer etching (ALE) according to the present disclosure.

FIG. 14 shows a schematic representative of a state of the DC plasma reaction chamber 110) at a time, $t_7$, of a neutralization phase of the atomic layer etching (ALE) according to the present disclosure. During such neutralization phase, the stage, S, may be biased at a negative voltage, $V_S=V_{BN}$, that corresponds to a negative pulse of the neutralization phase, $\Delta T_{BN}$, of the cycle, $T_{EEMP}$, of the (waveform of the) biasing signal, V(t), described above with reference to, for example, FIGS. 7A/7B/7C. Such negative bias voltage, $V_{BN}$, may be used to repel electrons, e−, away from the surface of the substrate, Sub, to (gradually but quickly) restore the steady state (ionic) distribution in the DC plasma reaction chamber (110) in preparation for a next layer (e.g., L2) atomic etching. It should be noted that throughout the neutralization phase defined by application of the negative bias voltage, $V_{BN}$, for the duration of time, $\Delta T_{BN}$, all other process parameters governing presence of the species/plasma within the DC plasma reaction chamber may remain unchanged, including, for example, inflow of diluent and reactant gas, anode/cathode voltage/current, as well as temperature, pressure, and flow rate. In other words, at completion of the neutralization phase, conditions inside of the DC plasma reaction chamber (110) may be substantially the same as the conditions described above at time, $t_0$, with reference to FIG. 12B. As shown in FIG. 14, in order to restore the condition for formation of a corrosion layer on the exposed surface layer, L2, of the substrate, Sub, an upcoming zero biasing signal (e.g., V(t)=0V) may be applied to the stage, S, for a sufficiently long duration of time, $\Delta T_{BZ}$, to return the plasma floating potential $V_{FP}$ at the surface of the substrate, Sub, to precisely the same potential (e.g., 0V or other) for every ALE cycle. This in turn may allow precise control and repeatability of the voltage/energy of the electrons in every E-wave brought down to the substrate, Sub, for every ALE cycle according to the present teachings.

Figure 15:
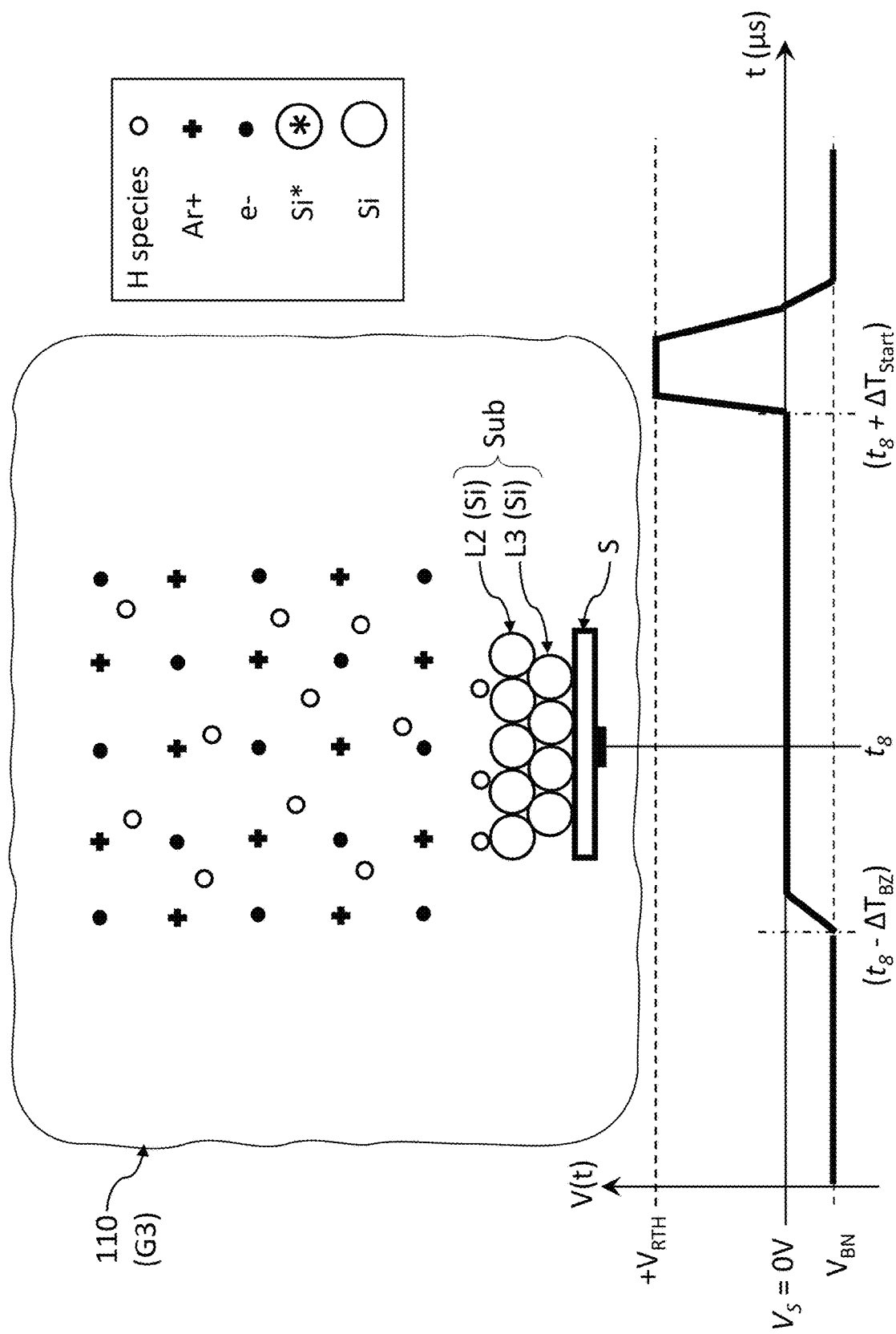
FIG. 15 shows a schematic representative of a state of the DC plasma reaction chamber during an initialization phase of the atomic layer etching (ALE) according to the present disclosure.

FIG. 15 shows a schematic representative of a state of the DC plasma reaction chamber 110) at a time, $t_8$, of an initialization phase of the atomic layer etching (ALE) according to the present disclosure. During such initialization phase, the stage, S, may be biased at zero volts, $V_S$=0V, that corresponds to the initialization phase, $\Delta T_{BZ}$, of the cycle, $T_{EEMP}$, of the (waveform of the) biasing signal, V(t), described above with reference to, for example, FIGS. 7A/7B/7C. Such zero volts bias voltage may be applied for a sufficient length to allow formation of the corrosion layer, as described above with reference to, for example, FIG. 12B and FIG. 12C. In other words, at completion of the initialization phase, conditions inside of the DC plasma reaction chamber (110) may be substantially the same as the conditions described above at time, $t_1$, with reference to FIG. 12C.

Upon completion of the initialization phase, a new atomic layer etching (ALE) cycle, including the above-described active phase, $\Delta T_{BP}$, neutralization phase, $\Delta T_{BN}$, and initialization phase, $\Delta T_{BZ}$, can be initiated for removal of the next atomic layer (e.g., L2). For example, assuming that the time, $t_8$, shown in FIG. 15 corresponds to the completion of the initialization phase (i.e., a time length equal to $\Delta T_{BZ}$ has elapsed since application of the negative bias voltage $V_{BN}$), then the positive pulse of the active phase of the next ALE cycle can be provided at any time, $t_8+\Delta T_{Start}$, wherein the time, $\Delta T_{Start}$, can be as small as zero. In other words, the atomic layer etching (ALE) process according to the present disclosure may remove atomic layers (e.g., L1, l2, etc.) of a substrate at a rate that is according to the cycle, $T_{EEMP}$, described above with reference to, for example, FIGS. 7A/7B/7C. It should be noted that in a case where, for example, a different etching performance or a different target reaction (e.g., different reactive species and/or different material atomic layers), may be desired for etching of a next layer of the substrate, conditions inside of the DC reaction chamber (110) and/or the waveform for the biasing signal, V(t), may be changed/selected prior to initiating the next ALE cycle. In addition, the reaction chamber may be purged before introducing different reactant gasses. A time for such change/selection may be varied by inserting a longer initialization bias signal equal to zero volts before the start of the next EEMP cycle and be as short as zero (e.g., $\Delta T_{Start}$=0).

As shown in the various figures (e.g., FIGS. 13-15) used to describe the various states of the DC plasma reaction chamber (e.g., 110) during the atomic layer etch (ALE) processing of a substrate (e.g., Sub) according to the present disclosure, in the positive column (e.g., G3) above the stage (e.g., S), a volume of gaseous plasma containing ions (e.g., Ar+ and H-species) and electrons (e.g., e−) of a uniform steady state composition (including fixed/controlled temperature) and with a narrow distribution of electron energies is formed (e.g., FIGS. 12B/12C).

When the positive bias is applied to the stage (e.g., S) during the active phase of the ALE cycle (e.g., FIGS. 13A/13B/13C/13D/13E), electrons (e.g., e−) uniformly across the stage are drawn/attracted to the surface of the stage from the volume in the DC plasma reaction chamber (e.g., 110) that is located above the stage. When the negative bias is applied to the stage (e.g., S) during the neutralization phase (e.g., FIG. 14) of the ALE cycle, electrons (e.g., e−) uniformly across the stage are repelled from the surface of the stage back into the volume above the stage. When the zero volts bias voltage is applied to the stage (e.g., S) during the initialization phase (e.g., FIG. 15) of the ALE cycle, initial conditions as described above with reference to FIG. 12C are recreated inside, and proximate the stage, of the DC plasma reaction chamber (110). This includes restoring of the floating potential, $V_{FP}$, to the initial potential, thereby returning the electrons in the plasma volume above the stage to their initial states, which in turn may allow (precise and) consistent control of the energy of the electrons in the E-wave used in each ALE cycle. If such ALE cycle is repeated at a regular pace, then electrons (e.g., e−) arrive with a uniform density and energy across the surface area of the stage (e.g., S) at well-defined intervals. Each arrival of the electrons at the surface of the stage at these intervals (e.g., arrival times) is referred to herein as an "electron wavefront" or a wafer scale wave of precisely controlled electrons (e.g., represented in FIG. 13C by E-wave).

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The invention claimed is:

1. A method for atomic layer etching of a substrate, the method comprising:
generating a volume of gaseous plasma including diluent species, reactive species, and electrons of a uniform steady state composition in a positive column of a DC plasma proximate a substrate, thereby developing a floating potential at a surface of the substrate;
adjusting the floating potential to a known reference potential;
forming a corrosion layer on the substrate, the corrosion layer comprising corrosion layer species formed by adsorption of the reactive species to atoms of an atomic layer at the surface of the substrate;
applying a positive biasing potential to the substrate that is positive with respect to the floating potential;
based on the applying, drawing electrons from the volume of gaseous plasma to the surface of the substrate and imparting an energy level to drawn electrons for stimulating electron transitions in the corrosion layer species; and
based on the stimulating, desorbing the corrosion layer species, thereby etching away the atomic layer.

2. The method according to claim 1, wherein:
the applying of the positive biasing potential is based on a capacitive coupling to a substrate support stage of a positive pulse signal with respect to the known reference potential, and
the positive pulse signal includes a high volage level that is equal to a reaction threshold voltage for stimulating electron transitions in the corrosion layer species.

3. The method according to claim 2, wherein:
a time duration of the high voltage level is in a range from about 0.1 µs to about 0.3 µs.

4. The method according to claim 1, further comprising:
applying a negative biasing potential to the substrate that is negative with respect to the floating potential; and
based on the applying of the negative biasing potential, repelling electrons from the surface of the substrate back to the volume of gaseous plasma, thereby restoring the uniform steady state composition.

5. The method according to claim 4, wherein:
the applying of the negative biasing potential immediately follows the applying of the positive biasing potential.

6. The method according to claim 4, wherein:
a time duration of the applying of the positive biasing potential is in a range from about 1/10 to about 1/1 of a time duration of the applying of the negative biasing potential.

7. The method according to claim 4, further comprising:
an alternating sequence of the applying of the positive biasing potential followed by the applying of the negative biasing potential, thereby generating an electron wavefront with uniform energy and density across the surface of the substrate; and
repeating the alternating sequence at a regular pace, thereby causing arrival of the electron wavefront at the surface of the substrate at time intervals stablished by the regular pace for etching away, at each of the time intervals, a corresponding atomic layer at the surface of the substrate.

8. The method according to claim 7, wherein:
the substrate comprises a first atomic layer consisting of atoms of a first material and a second atomic layer consisting of atoms of a second material, the first atomic layer adjacent and in contact with the second atomic layer, and
the uniform energy of the electron wavefront at a first arrival time for etching away the first atomic layer is different from the uniform energy of the electron wavefront at a second arrival time for etching away the second atomic layer.

9. The method according to claim 7, further comprising:
following the applying of the negative biasing potential, applying an initialization biasing potential to the substrate that is equal to the floating potential for a time duration that is sufficient for forming another corrosion layer on the substrate.

10. The method according to claim 9, further comprising:
based on the applying of the initialization biasing potential, restoring the uniform steady state composition in the positive column.

11. The method according to claim 9, further comprising:
capacitive coupling to a substrate support stage of a periodic biasing signal referenced to the known reference potential,
wherein
the applying of the positive biasing potential to the substrate is provided by a positive voltage during an active phase of the periodic biasing signal, the positive voltage based on a known reaction threshold voltage for stimulating electron transitions in the corrosion layer species,
the applying of the negative biasing potential to the substrate is provided by a negative voltage during a neutralization phase of the periodic biasing signal, and
the applying of the initialization biasing potential to the substrate is provided by a zero voltage during an initialization phase of the periodic biasing signal.

12. The method according to claim 11, wherein:
the positive voltage is equal to, or greater than, the reaction threshold voltage.

13. The method according to claim 11, wherein:
the positive voltage is strictly greater than the reaction threshold voltage for a duration of time that is in a range from 1/4 to 3/4 of a total time length of the active phase.

14. The method according to claim 11, wherein:
the negative voltage has a magnitude that is sufficiently low to hold energy levels of the diluent species of the volume of gaseous plasma below reaction energy levels of the corrosion layer species.

15. The method according to claim 11, wherein:
a DC content of the periodic biasing signal is zero.

16. The method according to claim 11, wherein:
a frequency of the periodic biasing signal is in a range from 100 KHZ to 1 MHz.

17. The method according to claim 16, wherein:
a ratio of a time length of the active phase to a time length of the neutralization phase is in a range from 1/10 to 1/1.

18. The method according to claim 16, wherein:
a ratio of a time length of the initialization phase to a time length of a cycle of the periodic biasing signal is about 1/4, and the cycle of the periodic biasing signal consists of the activation phase, the neutralization phase, and the initialization phase.

19. The method according to claim 1, wherein:
the atoms of the atomic layer at the surface of the substrate comprises atoms of: a) a single crystal or 2D material; b) a metal; or c) a complex or 3D material.

20. The method according to claim 19, wherein:
the single crystal or 2D material includes a semiconductor or an insulator.

21. The method according to claim 20, wherein:
the semiconductor includes any one of: IV silicon, germanium, III-V gallium arsenide, gallium nitride, silicon carbide, or indium gallium arsenide.

22. The method according to claim 19, wherein:
the single crystal or 2D material includes any one of: graphene, boron, nitride. molybdenum disulfide, tungsten diselenide, or platinum diselenide.

23. The method according to claim 19, wherein:
the complex or 3D material includes a polymer, a composite, or a nano-material.

24. The method according to claim 23, wherein:
the nano-material includes any one of: carbon nanotubes, nano-silver particles, titanium oxide particles, or quantum dots.

25. The method according to claim 1, wherein:
the diluent gas comprises any one, or a combination, of: argon, neon, or xenon, and
the reactant gas comprises any one, or a combination, of: hydrogen, chlorine, methane, carbon monoxide, oxygen, or other.

26. The method according to claim 25, wherein:
a ratio of the reactant gas to the diluent gas is in a range from about 2/100 to about 50/100 or greater.

27. The method according to claim 25, wherein:
the diluent species are argon ions and the reactive species are hydrogen species.

28. A method for atomic layer etching of a substrate via an electron wavefront, the method comprising:
generating a volume of gaseous plasma including diluent species, reactive species, and electrons of a uniform steady state composition in a positive column of a DC plasma proximate a substrate, thereby developing a floating potential at a surface of the substrate;
adjusting the floating potential to a reference potential; and
applying to the substrate, via a periodic biasing signal referenced to the reference potential, a sequence of a positive biasing potential followed by a negative biasing potential and further followed by a zero biasing potential that is equal to the reference potential, thereby causing arrival of an electron wavefront with uniform energy and density across the surface of the substrate at arrival times predetermined by the periodic biasing signal;
wherein
at each of the arrival times, the electron wavefront stimulates electron transitions in a corrosion layer formed on the surface of the substrate, thereby etching away one atomic layer of the substrate.

29. The method according to claim 28, wherein:
the adjusting of the floating potential includes adjusting of a potential applied to an anode of a DC plasma chamber that contains the positive column, while allowing a cathode of the DC plasma chamber to float and settle to a potential based on a fixed current conducted between the anode and the cathode, the fixed current provided by a current source coupled to the cathode.

\* \* \* \* \*